US008072821B2

(12) United States Patent
Arai

(10) Patent No.: US 8,072,821 B2
(45) Date of Patent: Dec. 6, 2011

(54) SEMICONDUCTOR MEMORY DEVICE THAT CAN PERFORM SUCCESSIVE ACCESSES

(75) Inventor: Tetsuya Arai, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 201 days.

(21) Appl. No.: 12/614,129

(22) Filed: Nov. 6, 2009

(65) Prior Publication Data

US 2010/0110803 A1  May 6, 2010

(30) Foreign Application Priority Data

Nov. 6, 2008  (JP) .................................. 2008-285859

(51) Int. Cl.
*G11C 7/10* (2006.01)
(52) U.S. Cl. ....... 365/189.04; 365/189.17; 365/189.011; 365/189.19; 365/189.05
(58) Field of Classification Search ............. 365/189.04, 365/189.17, 189.011, 189.19, 189.05
See application file for complete search history.

(56) References Cited

U.S. PATENT DOCUMENTS

| 5,530,965 A * | 6/1996 | Kawasaki et al. ................ 712/38 |
| 6,377,512 B1 * | 4/2002 | Hamamoto et al. ..... 365/233.17 |
| 7,603,592 B2 | 10/2009 | Sekiguchi et al. |
| 2004/0037107 A1 | 2/2004 | Matsuoka |

FOREIGN PATENT DOCUMENTS

| JP | 2004-086970 A | 3/2004 |
| JP | 2007-042176 A | 2/2007 |

OTHER PUBLICATIONS

Y. Nakagome et al., "A 1.5V Circuit Technology for 64Mb DRAMs", Symposium on VLSI Circuits, Dig of Tech. Papers, 1990, pp. 17-18.
Kiyoo Itoh, "Super LSI Memory", ISBN4563036099, published by Baihukan, Nov. 1994, pp. 165-167.

* cited by examiner

*Primary Examiner* — Vu Le
*Assistant Examiner* — Han Yang
(74) *Attorney, Agent, or Firm* — Sughrue Mion, PLLC

(57) ABSTRACT

To provide an input/output circuit that includes a write path to which write data is supplied and a read path to which read data is supplied and first and second data lines that connect the input/output circuit to a memory cell array. The input/output circuit includes a write buffer that supplies the write data on the write path to the first data line, a read amplifier that supplies the read data supplied to the read path through the second data line, and a bypass circuit that supplies the write data on the write path to the read path in response to detection of matching between a write address and a read address. Thus, data collisions can be avoided.

8 Claims, 46 Drawing Sheets

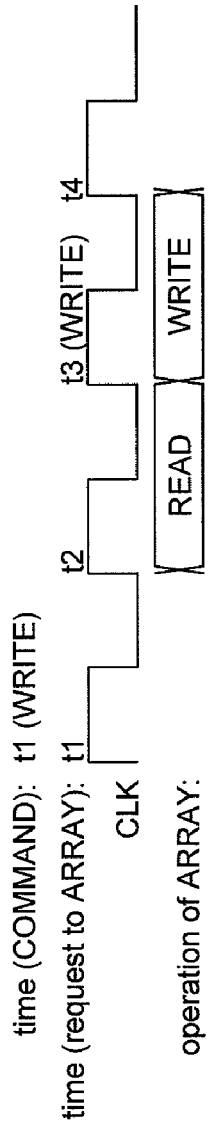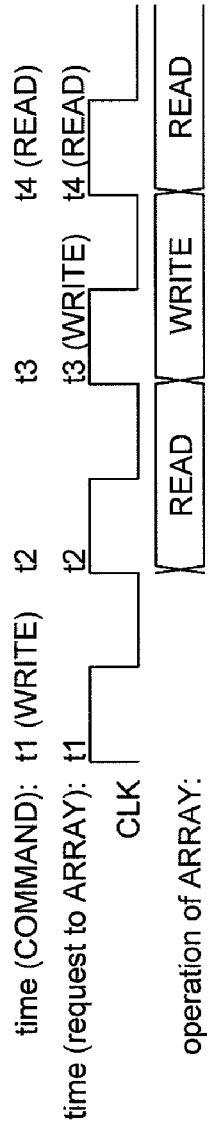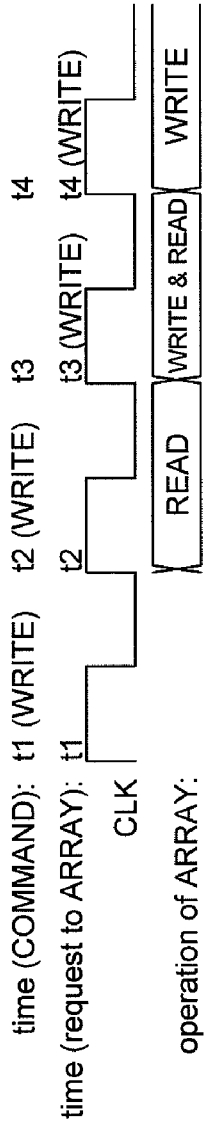

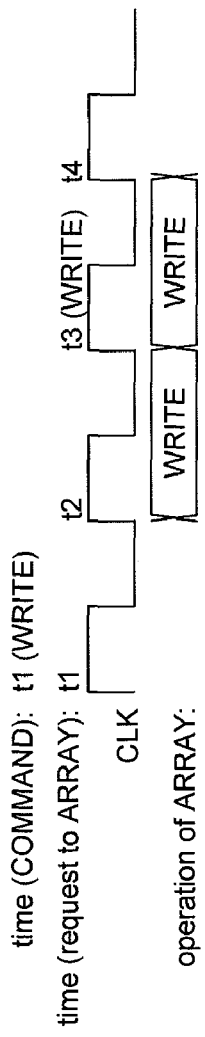
FIG.32A WRITE operation
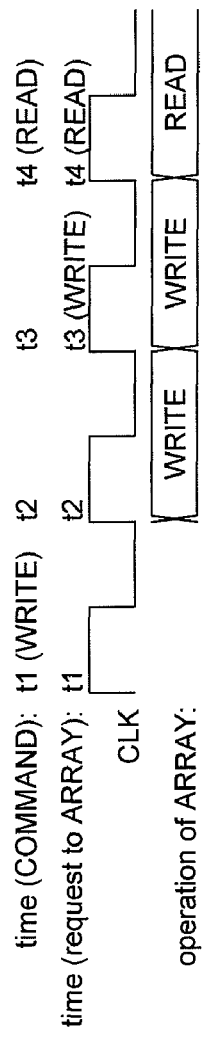
FIG.32B WRITE to READ operation
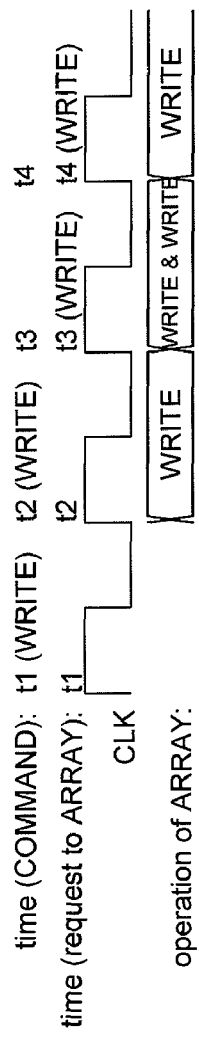
FIG.32C WRITE to WRITE operation

SEMICONDUCTOR MEMORY DEVICE THAT CAN PERFORM SUCCESSIVE ACCESSES

BACKGROUND OF THE INVENTION

1. Field of the Invention

The present invention relates to a semiconductor memory device, and more particularly relates to a semiconductor memory device to which successive accesses can be made.

2. Description of Related Art

Semiconductor memory devices represented by DRAM (Dynamic Random Access Memory) are generally configured such that a memory cell array is connected via an I/O line to an input/output circuit. During a write operation, write data is supplied from the input/output circuit via the I/O line to the memory cell array, and during a read operation, read data read from the memory cell array is supplied via the I/O line to the input/output circuit.

FIG. 41 is a circuit diagram showing a configuration of principal parts of a conventional DRAM.

The DRAM shown in FIG. 41 includes a memory cell array 1 that includes word lines WL0, WL1, . . . , bit line pairs BL0, BL1, . . . , and memory cells MC arranged at intersections of the word lines with the bit lines. A sense amplifier 2 is connected to each of the bit line pairs BL0, BL1, . . . . The sense amplifier 2 is connected via a corresponding column switch 5 to an I/O line LIO. Column select signals YS0, YS1, . . . that are output signals of column select drivers 4 are supplied to the respective column switches 5, so that any one of the switches is brought into on state.

The I/O line LIO is a wiring for transmitting complementary differential signals and connected to an input/output circuit 20. The input/output circuit 20 includes a write buffer 10 that supplies write data provided through a write bus WBUS to the I/O line LIO and a read amplifier 6 that supplies read data provided through the I/O line LIO to a read bus RBUS.

An operation of the DRAM with the configuration described above is described.

First, when a word driver 3 drives any one of the word lines WL0, WL1, . . . , the word line WL0 for example, signal charges stored in the memory cells MC are read to the respective bit line pairs BL0, BL1, . . . . Because the amounts of signals appearing in the bit line pairs BL0, BL1, . . . are small, however, the signals are amplified by the respective sense amplifiers 2. The bit line pairs BL0, BL1, . . . are driven in full amplitude, the selected memory cells MC are rewritten to be in a full level, and the amplified signals are held by the sense amplifiers 2.

Next, any one of the column select signals YS0, YS1, . . . is activated by the corresponding column select driver 4, thereby turning on the corresponding column switch 5. Any one of the bit line pairs is thus connected to the I/O line LIO.

However, the signal level read to the I/O line LIO is also small. Accordingly, to perform a read operation, the signal read to the I/O line LIO is further amplified by the read amplifier 6, latched at a hold circuit 7, and then outputted via a tri-state buffer 8 to the read bus RBUS. The read amplifier 6, the hold circuit 7, and the tri-state buffer 8 operate in synchronization with an activation signal RAE. The activation signal RAE is a timing signal during the read operation.

On the other hand, when a write operation is performed, write data supplied through the write bus WBUS is latched at a hold circuit 9 and then supplied to the I/O line LIO via the write buffer 10. The hold circuit 9 and the write buffer 10 operate in synchronization with an activation signal WBE. The activation signal WBE is a timing signal during the write operation. The write data provided to the I/O line LIO is supplied via a switched-on column switch 5 to any of the bit line pairs. The write data is thus forcibly overwritten in the sense amplifier 2 and this written data is to be written in the memory cells MC.

An operation timing when the write operation and the read operation are requested successively (write-to-read operation) is described next.

FIG. 42 is a timing diagram showing an operation timing when a write operation and a read operation are requested successively for the same address.

First, when a write request is issued at a time t1, write data D is supplied to the write bus WBUS after a predetermined period of time. At a time tWBE, the activation signal WBE is activated, so that the write data D is outputted to the I/O line LIO. The column select signal YS0 is then activated, so that the write data D is written in the corresponding bit line pair BL0. Next, when a read request is issued at a time t2, the data D written by the write request at the time t1 is read to the I/O line LIO. After a significant potential difference in the I/O line LIO, the activation signal RAE is activated at a time tRAE, so that read data D is read to the read bus RBUS.

When the write operation is completed within one clock cycle as described above, any data collision does not occur on the I/O line LIO and the bit line even if the write operation and the read operation are requested successively for the same address. Although not illustrated, when the read operation and the write operation are requested alternately and successively for the same address, when the write operation is requested more than twice consecutively for the same address, and when the read operation is requested more than twice consecutively for the same address, any data collision does not occur and accurate operations can be performed. That is, when the write operation or the read operation is completed within a clock cycle, the accurate operations can be performed no matter what accesses are requested. Accordingly, the I/O line LIO can be shared by the sense amplifiers 2 as shown in FIG. 41. The I/O line LIO literally serves as both an input and an output.

Recently, however, operations of memory devices have become complicated. Some cases that complicated calculations including coding are performed before write in a memory cell array will be probably increased. An example of such cases is a memory device having an ECC (Error Correcting Code) circuit incorporated therein. The write operation may not be completed within a clock cycle. In the case that the write operation cannot be completed within a clock cycle, when the write operation and the read operation are successively requested, the write operation cuts into the time that the subsequent read operation. Such a problem is described below in detail using a timing diagram.

FIG. 43 is a timing diagram showing an operation timing when the write operation and the read operation are successively requested (write-to-read operation) for different addresses in a memory that cannot complete the write operation in a clock cycle.

First, when a write request is issued first at the time t1, a calculation that takes a long time is performed. When the calculation is completed, write data D0 is supplied to the write bus WBUS. The activation signal WBE is then activated at the time tWBE, so that the write data D0 is outputted to the I/O line LIO. The column select signal YS0 is then activated and the write data D0 is written in the corresponding bit line pair BL0. When a read request is issued at the time t2, the corresponding column select signal YS1 is activated and read data D1 appears in the I/O line LIO. According to this example, the activation of the activation signal WBE at the time tWBE and the activation of the column select signal YS0 are naturally delayed from the write request at the time t1 by a calculation time. The column select signal YS1 rises when the write data D0 is being written in the bit line pair BL0 and the write data D0 is written even in the bit line pair BL1. The read data D1 from the bit line pair BL1 is thus affected by the write data D0 for BL0. Even if the read data D1 on the bit line pair BL1 is not inverted as shown in FIG. 43, the I/O line LIO is affected significantly by the write data D0. Accordingly, the value supplied to the read bus RBUS by the activation signal RAE that is activated at the time tRAE in response to the read request at the time t2 may be D0 not the expected D1. That is, incorrect data is read.

FIG. 44 shows an operation timing when the write operation and the read operation are successively requested (write-to-read operation) for the same address in the memory that cannot complete the write operation in a clock cycle.

The write operation is the same as the operation described with reference to FIG. 43. That is, in response to the write request at the time t1, the write data D is transmitted successively to the write bus WBUS, the I/O line LIO, and the bit line pair BL0. While the write data is being written in the bit line pair BL0, however, the column select signal YS0 rises in response to the read request at the time t2. When the activation of the activation signal RAE at the time tRAE is performed during an activating period of the write buffer 10 (WBE=H), the data D can be read correctly. When the activation of the activation signal RAE is performed after the activating period of the write buffer 10 (WBE=L) as shown in the example of FIG. 44, the bit line pair BL0 in amplitude is connected to the I/O line LIO and thus the potential of the I/O line LIO is drawn. Accordingly, when the signal amount on the I/O line LIO is small and the activation signal RAE is activated at the time tRAE, the correct value cannot be read to the read bus RBUS (X: undefined).

As shown in FIG. 43, when the write operation goes on into the subsequent read operation in the write-to-read operation for different addresses, it suffices that the I/O line LIO is divided into a data line for write and a data line for read. Data collisions between the write data and the read data are thus eliminated. Similarly, it suffices that the column select signal YS is divided into a column select signal YS1 for write and a column select signal for read. Such I/O division is also described in "Symposium on VLSI Circuits, Dig of Tech. Papers" (pp. 17-18, 1990, Y. NAKAGOME et al.) and "Super LSI Memory" (ITOH Kiyoo, published by Baihukan, November 1994, ISBN4563036099, pp. 165-167).

However, problems about the write-to-read operation for the same address shown in FIG. 44 cannot be solved only by the I/O division. Thus, the only way to perform correctly the write-to-read operation requested for the same address is to set a clock cycle to be longer, which hinders a high speed operation. Accordingly, a semiconductor memory device that can perform correctly the write-to-read operation for the same address and realize a high speed operation is desired.

When the write operation that takes time to start is required, a data collision occurs not only in the write-to-read operation but also in the write-to-write operation. Two kinds of write operations, that is, the write operation that takes time to start because of a calculation and the write operation that can start promptly depending on clocks as usual are provided. In this case, the write operation that takes time to start overlaps the next cycle, that is, the read operation in the next cycle or the write operation that can start promptly in response to clocks in the next cycle. Particularly when the write operation that takes time to start overlaps the write operation that can start promptly in response to clocks, this problem cannot be solved by dividing the I/O line into a data line for write and a data line for read. Such a problem occurs in the clearest manner when the write cycle is configured by two kinds of write operations, that is, the write operation that can start promptly in response to clocks and the write operation that takes time to start. Accordingly, a semiconductor memory device that can perform correctly the write-to-write operation for different addresses and for the same address and realize a high speed operation is also desired.

SUMMARY

The present invention seeks to solve one or more of the above problems, or to improve upon those problems at least in part.

The semiconductor memory device of the present invention is characterized as follows so as to perform the read operation or the write operation promptly and consecutively subsequent to the write operation that takes long time to start. When the write-to-read operation is a target operation, the present invention comprises a memory cell array that includes a plurality of word lines, a plurality of bit lines, and a plurality of memory cells arranged at intersections of the word lines with the bit lines, an input/output circuit that includes a write path to which write data to be written in the memory cell array is supplied and a read path to which read data read from the memory cell array is supplied, and a first data line and a second data line that connect the input/output circuit to the memory cell array. The input/output circuit further includes a write buffer that supplies write data on the write path to the first data line, a read amplifier that supplies read data supplied through to the read path the second data line, a detection circuit that detects matching between a write address that the write data is to be written to and a read address that the read data is to be read from, and a bypass circuit that supplies the write data on the write path to the read path in response to the matching detected by the detection circuit.

When the write-to-write operation is a target operation, the present invention comprises a memory cell array that includes a plurality of word lines, a plurality of bit lines, and a plurality of memory cells arranged at intersections of the word lines with the bit lines, an input/output circuit that includes a first write path and a second write path to which write data to be written in the memory cell array is supplied, and a first data line and a second data line that connect the input/output circuit to the memory cell array. The input/output circuit further includes a first write buffer that supplies write data on the first write path to the first data line, a second write buffer that supplies write data on the second write path to the second data line, a detection circuit that detects matching between a first write address that the write data is to be written through the first data line and a second write address that the write data is to be written through the second data line, and an inhibition circuit that inhibits activation of either the first write buffer or the second write buffer in response to the matching detected by the detection circuit.

According to the present invention, when the write-to-read operation is a target operation, the input/output circuit and the memory cell array are connected to each other by two types of data lines. Even if the write operation is not completed within one clock cycle, the write operation and the read operation can be performed consecutively. The bypass circuit that supplies the write data to the read bus when the write address matches with the read address is provided. Accordingly, when the write-to-read operation is requested for the same address, the read data can be outputted correctly without actually performing the read operation.

When the write-to-write operation is a target operation, the input/output circuit and the memory cell array are connected to each other by two types of data lines. Even if the write operation is not completed within one clock cycle, that write operation and the write operation that can start at a normal timing can be performed consecutively. There is provided a circuit that inhibits one of writes when the write addresses match with each other. When the write-to-write operation is requested for the same address, a collision of two pieces of write data is avoided, so that desired data can be written.

BRIEF DESCRIPTION OF THE DRAWINGS

The above features and advantages of the present invention will be more apparent from the following description of certain preferred embodiments taken in conjunction with the accompanying drawings, in which:

FIG. 5 is a circuit diagram of a detection circuit 130a;

FIGS. 7A, 7B, and 7C are explanatory diagram of operation timings when the calculation involves the read operation in the second embodiment, where FIG. 7A shows a single write operation, FIG. 7B shows a write-to-read operation, and FIG. 7C shows a write-to-write operation;

FIG. 30 is a circuit diagram of a detection circuit 730a;

FIGS. 32A, 32B, and 32C are explanatory diagrams of operation timings in the thirteenth embodiment, where FIG. 32A shows a single write operation, FIG. 32B shows a write-to-read operation, and FIG. 32C shows a write-to-write operation;

DETAILED DESCRIPTION OF THE EMBODIMENTS

Preferred embodiments of the present invention will be explained below in detail with reference to the accompanying drawings.

Figure 1:
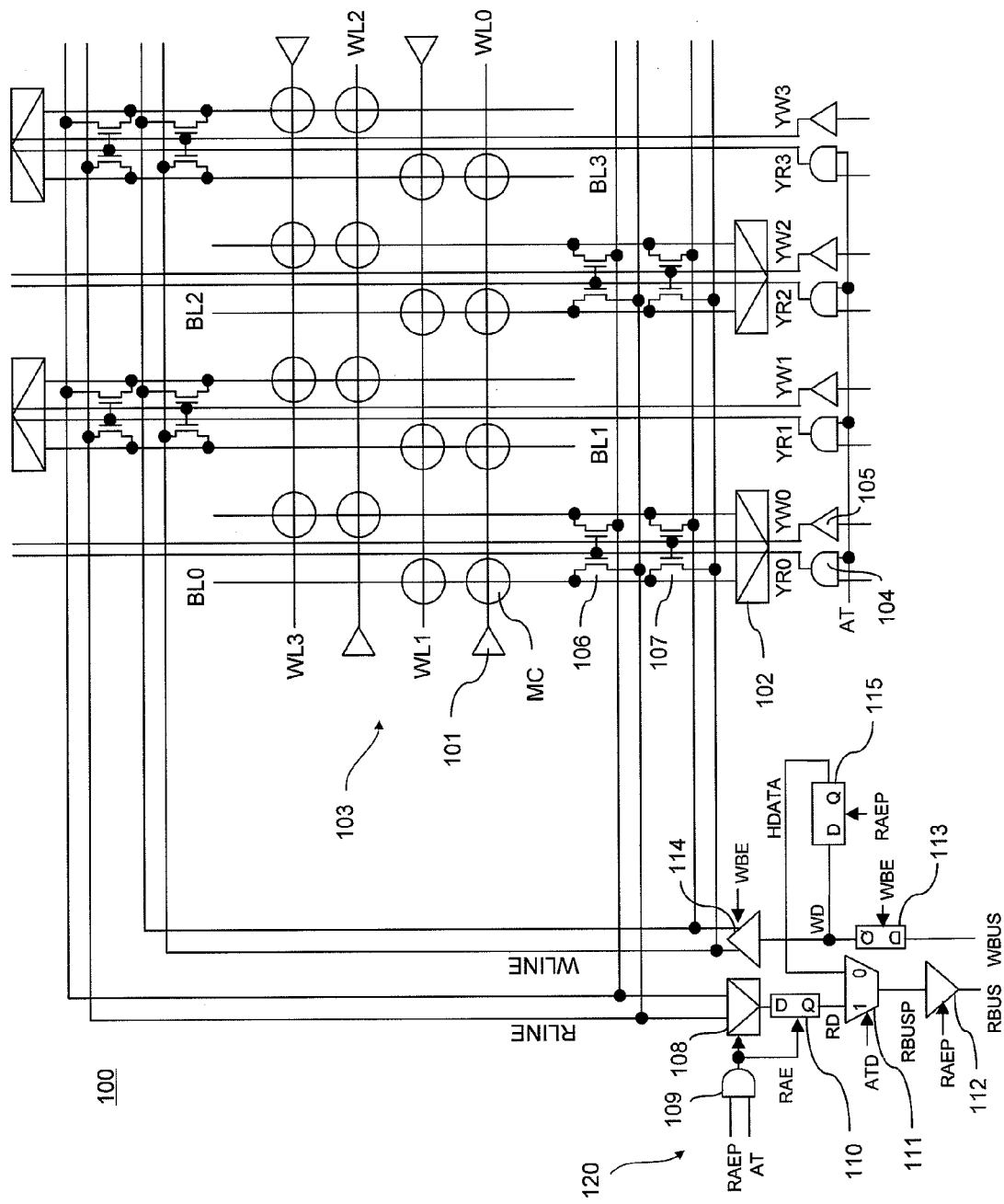
FIG. 1 is a circuit diagram showing a configuration of principal parts of a semiconductor memory device 100 according to a first embodiment of the present invention.

FIG. 1 is a circuit diagram showing a configuration of principal parts of a semiconductor memory device 100 according to a first embodiment of the present invention. While the semiconductor memory device 100 of the first embodiment is a DRAM, it is not limited thereto.

As shown in FIG. 1, the semiconductor memory device 100 according to the first embodiment includes a memory cell array 103 that includes the word lines WL0, WL1, . . . , the bit line pairs BL0, BL1, . . . , and the memory cells MC arranged at intersections of the word lines with the bit lines. Sense amplifiers 102 are connected to each of the bit line pairs BL0, BL1, . . . . Each of the sense amplifiers 102 is connected via a corresponding column switch 106 to a data line RLINE for read and via a corresponding column switch 107 to a data line WLINE for write. Column select signals YR0, YR1, . . . for read serving as outputs of column select drivers 104 for read are supplied to the respective column switches 106 and anyone of the switches is turned on during the read operation. Column select signals YW0, YW1, . . . for write serving as outputs of column select drivers 105 for write are supplied to the respective column switches 107 and any one of the switches is turned on during the write operation.

The data line RLINE for read is a wiring for transmitting complementary read data and connected to an input/output circuit 120. The data line WLINE for write is a wiring for transmitting complementary write data and connected to the input/output circuit 120. The input/output circuit 120 includes a write buffer 114 that supplies write data WD provided through the write bus WBUS to the data line WLINE for write and a read amplifier 108 that supplies read data RD provided through the data line RLINE for read to the read bus RBUS.

The input/output circuit 120 further includes a register 115 that temporarily holds the write data WD and a multiplexer 111 selecting either an output of the read amplifier 108 or an output of the register 115. The selection of the multiplexer 111 is controlled by a detection circuit to be described later. The register 115 and the multiplexer 111 constitute a bypass circuit that supplies the write data supplied to the read bus RBUS through the write bus WBUS.

A basic operation of the semiconductor memory device 100 according to the first embodiment is described next.

First, when the read operation is requested, a word driver 101 drives any of the word lines WL0, WL1, . . . , the word line WL0. Signal charges stored in the memory cells MC are read to the respective bit line pairs BL0, BL1, . . . . Because the amounts of signals appearing in the bit line pairs BL0, BL1, . . . are small, the signals are amplified by the sense amplifiers 102. The bit line pairs BL0, BL1, . . . come in full amplitude, the selected memory cells MC are rewritten to be in a full level, and the amplified signals are held by the respective sense amplifiers 102.

Next, any of the column select signals YR0, YR1, . . . for read is activated by the corresponding column select driver 104 for read, thereby turning on the corresponding column switch 106. Any of the bit line pairs is thus connected to the data line RLINE for read. Because the signal read to the data line RLINE for read is also a small one, the signal is further amplified by the read amplifier 108, latched at a hold circuit 110, and then outputted from the read bus RBUS via the multiplexer 111 and a tri-state buffer 112.

The read amplifier 108 and the hold circuit 110 operate in synchronization with an activation signal RAE. The activation signal RAE is an output of an AND gate 109 to which an activation signal RAEP and an address transition detection signal AT are inputted. The activation signal RAEP is a timing signal during the read operation and the address transition detection signal AT is an output signal from the detection circuit to be described later. A delay address transition detection signal ATD obtained by delaying the address transition detection signal AT is inputted to the multiplexer 111. The multiplexer selects an input 1, that is, the actual read data RD when the delay address transition detection signal ATD is not activated (a normal case). The multiplexer 111 selects an input 0, that is, the output of the register 115 when the delay address transition detection signal ATD is activated (when matching is detected). The tri-state buffer 112 operates in synchronization with the activation signal RAEP.

On the other hand, when the write operation is performed, the write data WD supplied through the write bus WBUS is latched at a hold circuit 113 and then supplied to the data line WLINE for write via the write buffer 114. The hold circuit 113 and the write buffer 114 operate in synchronization with the activation signal WBE. The activation signal WBE is a timing signal during the write operation. The write data WD supplied to the data line WLINE for write is supplied to one of the bit line pairs via the switched-on column switch 107 by the control of the corresponding column select driver 105 for write. The write data WD is thus forcibly written in the sense amplifier 102 and then in the memory cells MC.

The write data WD latched at the hold circuit 113 is also supplied to the register 115. The register 115 is a circuit operating in synchronization with the activation signal RAEP and the output thereof is supplied to the input 0 of the multiplexer 111 as described above.

Figure 2:
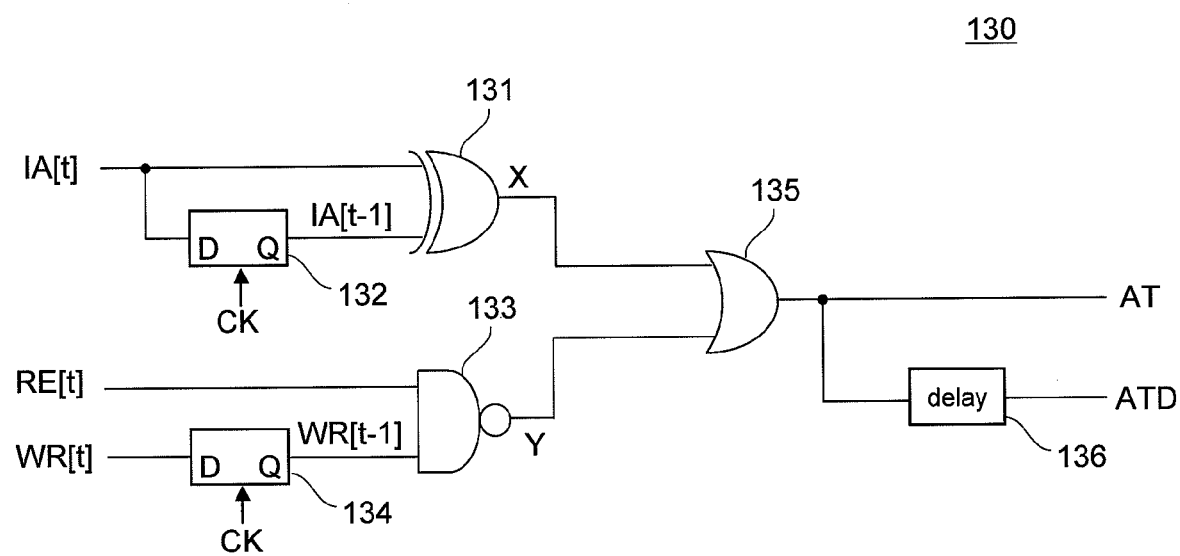
FIG. 2 is a circuit diagram of a detection circuit 130.

FIG. 2 is a circuit diagram of a detection circuit 130 that generates the address transition detection signal AT.

As shown in FIG. 2, a current selected address IA[t], a current read-state flag RE[t], and a current write-state flag WR[t] are supplied to the detection circuit 130. The "state flag" means a signal that becomes "H" when a corresponding cycle is in a corresponding state and becomes "L" in otherwise cases.

The current selected address IA[t] is supplied as it is to an EXOR gate 131 and also to a DQ latch 132. The DQ latch 132 is a circuit latching and then outputting the current selected address IA[t] in synchronization with an internal clock corresponding to an internal clock one cycle after the current cycle. The output is thus IA [t−1] indicating the selected address one cycle before the current cycle. Detailed descriptions thereof are made as follows. When the DQ latch transmits data from D to Q during a period the internal clock is H and latches the data at Q during a period the internal clock is L, that is, when the DQ latch is a gate with a latching function, the internal clock supplied to the DQ latch is an internal clock earlier than the internal clock outputting the selected address IA[t] by the period the internal clock is H. Thus, the data one cycle before the current cycle can be placed in the current cycle while preventing data penetration. When the DQ latch is a so-called DQ flip-flop that the gate with a latching function is connected in a master-slave manner, the internal clock supplied to the DQ latch can be a clock that is the same as the internal clock outputting the selected address IA[t] and the data one cycle before the current cycle can be placed easily in the current cycle. IA [t−1] indicating the selected address one cycle before the current cycle is supplied to the EXOR gate 131. Accordingly, when the same selected address is inputted twice consecutively, the EXOR gate 131 sets an output X to L. In other cases, the output X is maintained at a high level.

The current read-state flag RE[t] is supplied as it is to a NAND gate 133 and the current write-state flag WR[t] is supplied to a DQ latch 134. The DQ latch 134 performs the same operation as the DQ latch 132 and is a circuit latching the current write-state flag WR[t] in synchronization with an internal clock corresponding to the internal clock one cycle after the current cycle. The output of the DQ latch 134 is thus a write-state flag WR[t−1] one cycle before the current cycle. The write-state flag WR[t−1] one cycle before the current cycle is supplied to the NAND gate 133. When the write operation and the read operation are successively requested (write-to-read operation), the NAND gate 133 sets an output Y to L. In other cases, the output Y is maintained at a high level.

The outputs X and Y are supplied to an OR gate 135. Only when the same selected address is inputted during the write-to-read operation, a logical level of the address transition detection signal AT becomes L. In other cases, the address transition detection signal AT is maintained at a high level.

The address transition detection signal AT is supplied to a delay circuit 136. An output of the delay circuit 136 is the delay address transition detection signal ATD. The delay address transition detection signal ATD is obtained by delaying the address transition detection signal AT to adjust the timing.

The operation when the address transition detection signal AT is at an L level is described next. As described above, the address transition detection signal AT becomes the L level when the write operation is performed in the previous cycle, the read operation is performed in the current cycle, and the address in the previous cycle matches with the address in the current cycle.

The address transition detection signal AT is supplied to the column select drivers 104 for read shown in FIG. 1. When the address transition detection signal AT is at the L level, the outputs of the column select drivers 104 for read are fixed at a low level even though the read operation is performed in the current cycle. Because the column select signals YR for read are not activated at all, all column switches 106 are turned off. Data read to the sense amplifier 102 thus remains unprocessed. Actually, the write operation has been performed in the last cycle and thus the sense amplifier 102 continues the write operation. This write operation continues without any interruptions. Because the activation signal RAEP is cut off by the AND gate 109, the read amplifier 108 does not perform amplification. The read amplifier 108 thus does not consume any current. The hold circuit 110 is not operated either. Data held by the hold circuit 110 is data whose read is not required such as data read in the previous read operation.

Meanwhile, the register 115 receives the activation signal RAEP and fetches data WD written in the last write cycle to hold the data in a signal line HDATA. Because the currently described operation is "the write-to-read operation and the address of the read cycle is the same as that of the write cycle", a value held in the signal line HDATA should be data to be read. The value held in the signal line HDATA is selected by the multiplexer 111 and outputted to a signal line RBUSP. Because the tri-state buffer 112 is also activated by the activation signal RAEP, the write data WD is returned as it is to the read bus RBUS.

The hold circuit 110, the register 115, the multiplexer 111, and the tri-state buffer 112 operating at the time of the read operation are in synchronization with the activation signal RAEP when taking the delay address transition detection signal ATD having the same timing as the activation signal RAEP into consideration. While the hold circuit 110 and the register 115 can be circuits holding data for only the period that RAEP="H", the present invention is described by exemplifying circuits holding data for one cycle like DQ-FF. The circuit holding data for one cycle can carry over the data held in the signal line RBUSP into the next cycle, which leads probably to an improved flexibility in calculations.

The operation when the write operation and the read operation are successively requested (write-to-read operation) is described next using a timing diagram.

Figure 3:
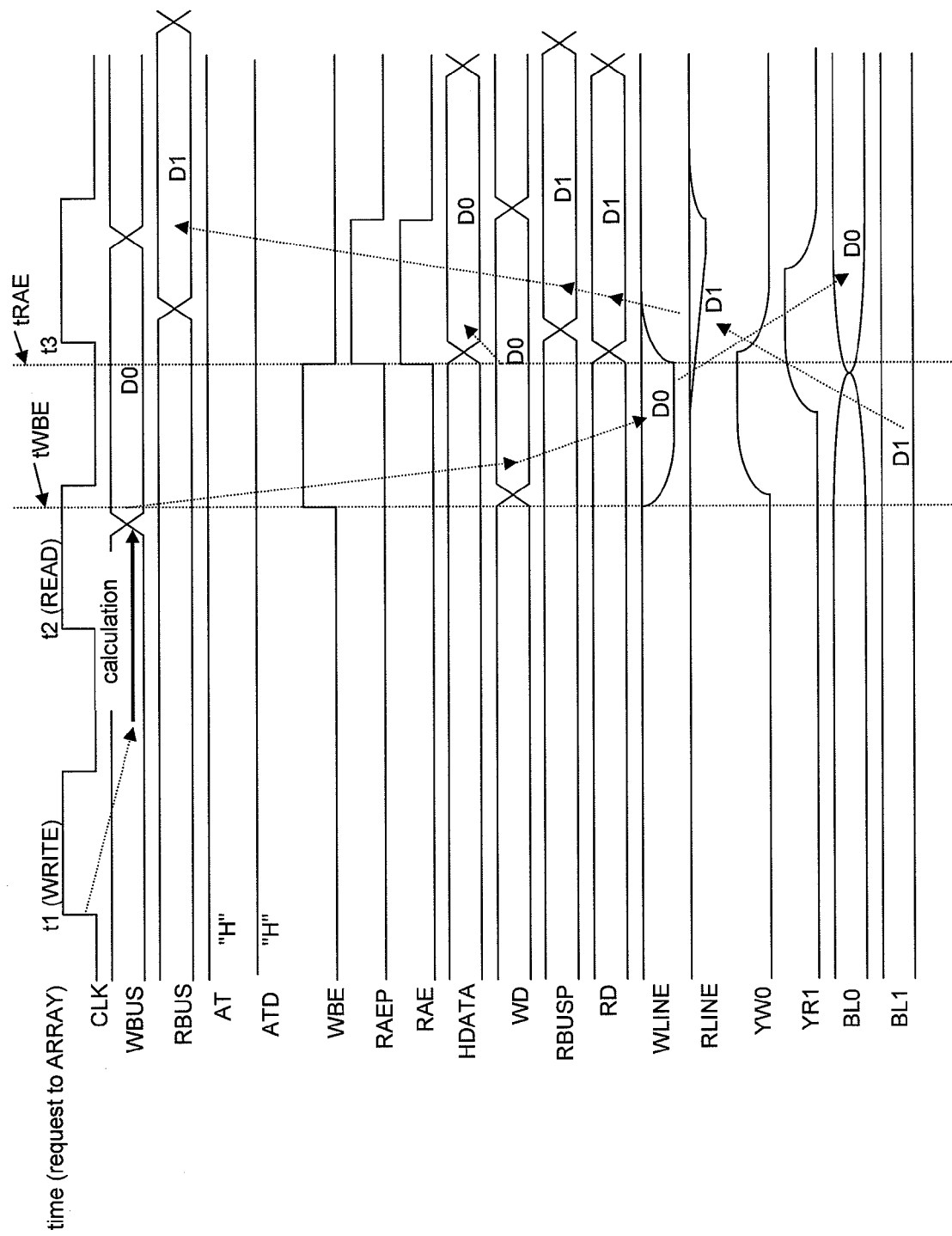
FIG. 3 is a timing diagram showing an operation timing when the write operation and the read operation are successively requested (write-to-read operation) for different addresses according to the first embodiment.

FIG. 3 is a timing diagram showing an operation timing when the write operation and the read operation are successively requested (write-to-read operation) for different addresses.

First, when an address corresponding to the bit line pair BL0 is specified and a write request is issued at the time t1, write data D0 is supplied to the write bus WBUS with a delay because of calculations. The activation signal WBE is then activated at the time tWBE determined by anticipating the delay. The write data D0 is thus fetched into the hold circuit 113 and outputted to the data line WLINE for write. The column select signal YW0 for write is then activated, so that the write data D0 is written in the bit line pair BL0.

Next, while an address corresponding to the bit line pair BL1 is specified and a read request is issued at the time t2, the address transition detection signal AT is "H" even in the read-to-write operation because the address is different from the address in the write operation at the time t1. Accordingly, while the column select signal YW0 for write is being activated, the column select signal YR1 for read is activated. In this case, the bit line pair selected by YR1 is BL1 that is different from the bit line pair BL0 selected by YW0. Thus, any data collision does not occur.

Although the data D1 in the bit line pair BL1 is read to the data line RLINE for read, any data collision does not occur because the data line RLINE for read is different from the data line WLINE for write that the write operation has been performed by the previous write request. When the activation signal RAEP rises at the time tRAE, the activation signal RAE also rises at substantially the same time because of AT="H". The read amplifier 108 is thus activated and the read data D1 is held at the hold circuit 110. In response to the activation signal RAEP rising, the last write data D0 held by the register 115 is transferred to the signal line HDATA. Because the delay address transition detection signal ATD is also "H", the multiplexer 111 selects the input 1 and the read data D1 is read to the read bus RBUS.

As described above, desired data write and read can be performed without any collisions of values.

Figure 4:
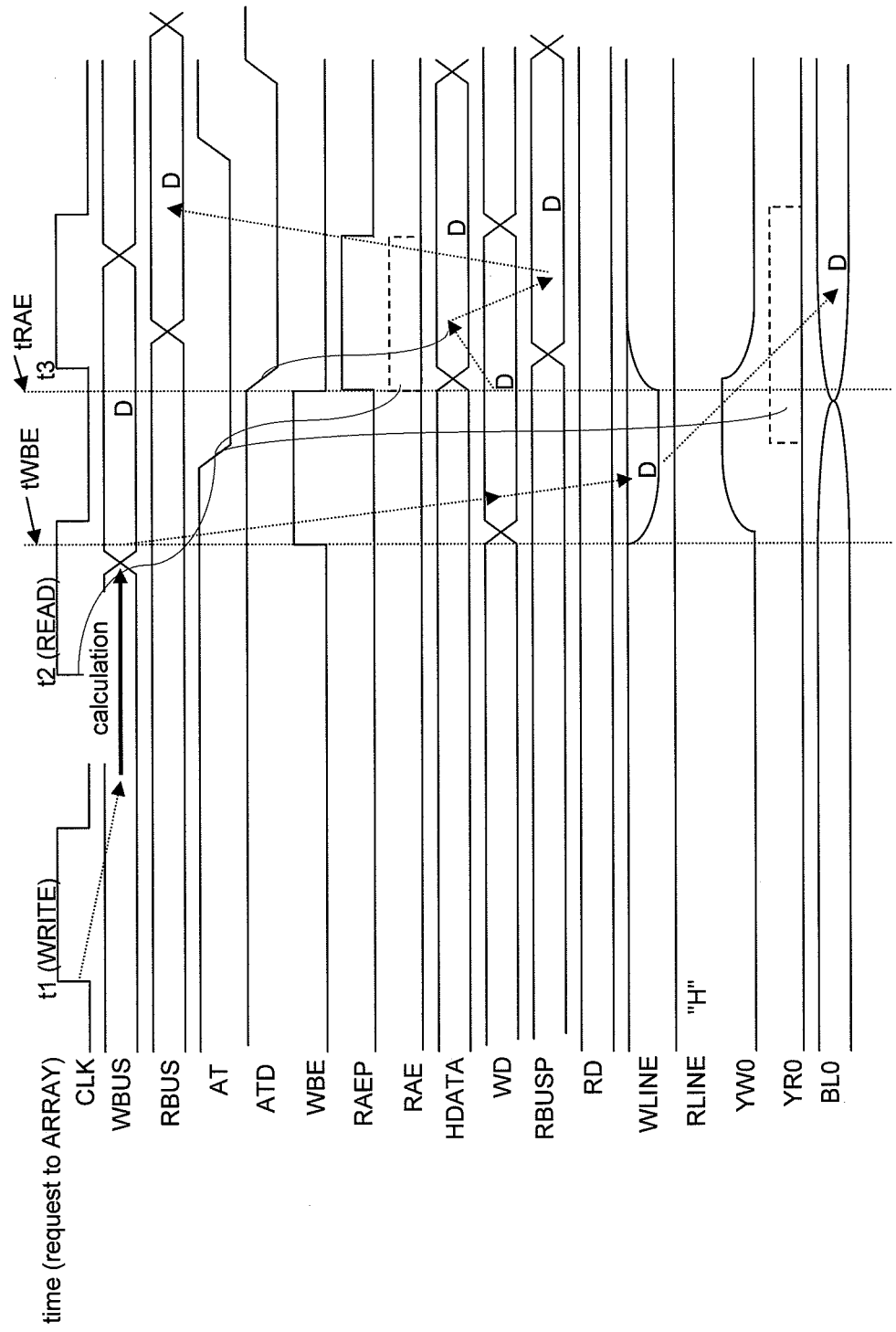
FIG. 4 is a timing diagram showing an operation timing when the write operation and the read operation are successively requested (write-to-read operation) for the same address according to the first embodiment.

FIG. 4 is a timing diagram showing an operation timing when the write operation and the read operation are successively requested (write-to-read operation) for the same address.

First, when the address corresponding to the bit line pair BL0 is specified and a write request is issued at the time t1, the write data D is supplied to the write bus WBUS with a delay because of calculations. The activation signal WBE is then activated at the time tWBE determined by anticipating the delay. The write data D is thus fetched into the hold circuit 113 and outputted to the data line WLINE for write. The column select signal YW0 for write is then activated, so that the write data D is written in the corresponding bit line pair BL0. Such a series of operations is the same as those shown in FIG. 3.

Next, when the address corresponding to the bit line pair BL0 is specified and a read request is issued at the time t2, the read-to-write operation for the same address is established. The address transition detection signal AT thus becomes "L". The column select signal YR0 for read activated in a normal operation is not activated. At this time, the data D is being written in the bit line pair BL0 by the previous write request and thus the signal amount is still small. If the data D is read on the way, it can be broken. Because AT="L", however, the data D is not read. Accordingly, the write operation continues stably without particular load changes in the bit line pair BL0.

Subsequently, while the activation signal RAEP rises at the time tRAE, the activation signal RAE does not rise because AT="L" and the read amplifier 108 is not activated. Meanwhile, write data WD is held by the register 115 in synchronization with the activation signal RAEP and this data is transferred to the signal line HDATA. Because the delay address transition detection signal ATD is also "L", the multiplexer 111 selects the input 0 and the write data WD is read as it is to the read bus RBUS as the read data D.

As described above, even in the write-to-read operation for the same address, desired data write and read can be performed without any collisions of values.

As described above, the semiconductor memory device 100 of the first embodiment is configured such that the input/output circuit 120 and the memory cell array 103 are connected to each other by two types of data lines, that is, the data line RLINE for read and the data line WLINE for write. As a result, even if the write operation takes a long time, the write-to-read operation can be performed in a clock cycle. The semiconductor memory device 100 further includes the bypass circuit that returns the write data as it is to the read bus. When the write-to-read operation is requested for the same address, the read data can be outputted correctly without actually performing the read operation. The write-to-read operation for the same address thus does not limit the clock cycle.

While the "calculation" during the write operation does not involve an operation in the array according to the configuration described above, the read operation for the memory cell array 103 can be involved. That is, for the write request, the read operation can be performed first and then the write operation can be performed. In this case, problems that are internally the same as in the write-to-read operation may occur in the write-to-write operation as well as the described write-to-read operation. When the read operation is performed first and then the write operation is performed during write, the write operation in the previous write goes on into the read operation in the next write, so that the same problems as those described above may occur. However, these problems can be solved by the present invention.

Figure 5:
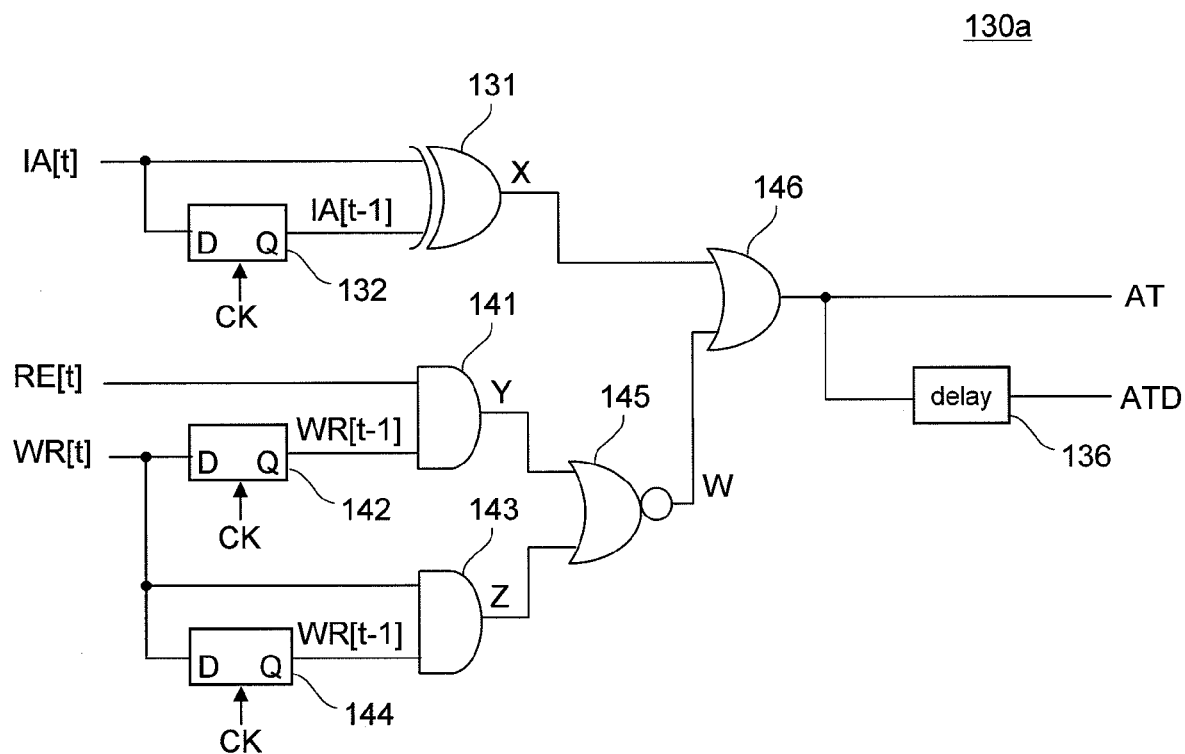

FIG. 5 is a circuit diagram of a detection circuit 130a that can detect the matching between addresses in the write-to-read operation and the write-to-write operation. Components shown in FIG. 5 that are the same as those in the detection circuit 130 shown in FIG. 2 are denoted by like reference numerals and descriptions thereof will be omitted.

The detection circuit 130a shown in FIG. 5 includes an AND gate 141 to which the current read-state flag RE[t] and the write-state flag WR[t−1] one cycle before the current cycle generated by a DQ latch 142 are supplied. When the write operation and the read operation are successively requested (write-to-read operation), the AND gate 141 sets an output Y to H. In other cases, the output Y is maintained at the L level.

The detection circuit 130a shown in FIG. 5 further includes an AND gate 143 to which the current write-state flag WR[t] and the write-state flag WR[t−1] one cycle before the current cycle generated by a DQ latch 144 are supplied. When the write operation is requested twice consecutively (write-to-write operation), the AND gate 143 sets an output Z to H. In other cases, the output Z is maintained at the L level.

The outputs Y and Z are supplied to a NOR gate 145 and an output W of the NOR gate 145 and an output X of the EXOR gate 131 are supplied to an OR gate 146. Thus, when the same selected address is inputted during the write-to-read operation and when the same selected address is inputted during the write-to-write operation, the logical level of the address transition detection signal AT becomes L.

As described above, the circuit that generates the address transition detection signal AT can be changed depending on calculations performed during the write operation. The above example involving the read operation in a calculation is described below in detail in other embodiments of the present invention. Write in the array is delayed by the calculation time according to the control of the first embodiment. Accordingly, note that operations become difficult with respect to a spec tDPL(tWR) that determines the time when a pre-charge command can be inputted after a write command.

A second embodiment of the present invention is described next.

According to the first embodiment described above, the write operation upon the memory cell array 103 can be performed in a delayed manner so as to overlap perfectly the successive read cycle. In this case, the request for the write operation upon the memory cell array 103 is received in synchronization with a clock, but the delay before the actual write operation is started is not in synchronization with a clock and access needs to be made through a delay line corresponding to the calculation time. Accordingly, the design of the delay line can be slightly complicated.

On the other hand, according to the second embodiment, the access for the write operation upon the memory cell array 103 is in synchronization with the next cycle so as to be in pure synchronization with a clock. The effective write cycle is thus formed of two cycles including the current cycle and the next cycle. Accordingly, one cycle is provided for a calculation and one cycle is provided for an array access and the device can be designed so as to be in synchronization with a clock, so that the design becomes easy. Note that the spec tDPL(tWR) requires a latency of one cycle. For the circuit that generates the address transition detection signal AT, the circuit shown in FIG. 2 is used when its calculation does not involve the array access and the circuit shown in FIG. 5 is used when its calculation involves the read operation. The circuit configuration shown in FIG. 1 can be used as it is as a configuration of principal parts of the semiconductor memory device according to the second embodiment.

Figure 6:
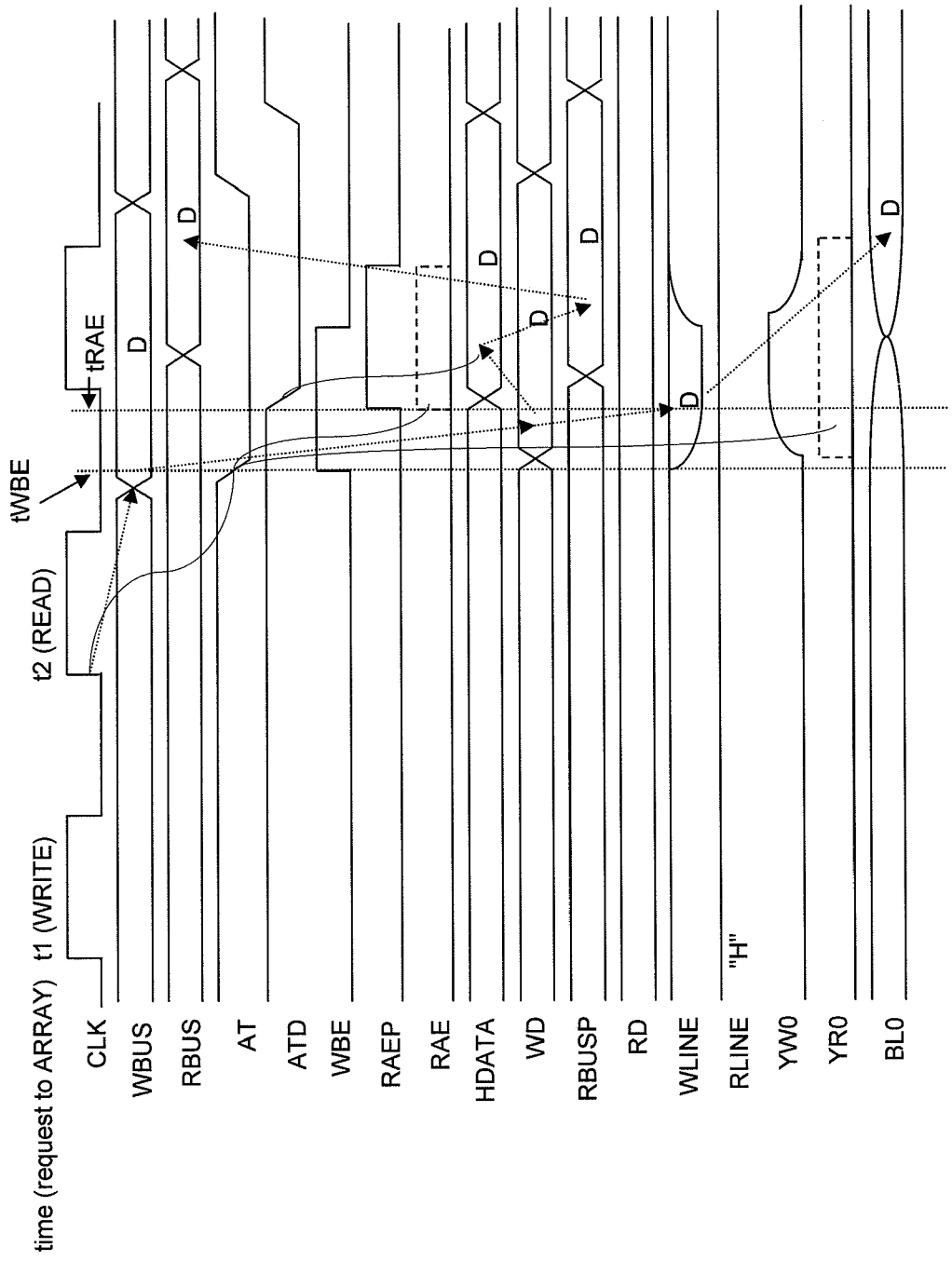
FIG. 6 is a timing diagram showing an operation timing when the write operation upon the memory cell array 103 is performed so as to overlap the successive read cycle and shows a case that the write-to-read operation is requested for the same address according to the second embodiment.

FIG. 6 is a timing diagram showing an operation timing when the write operation upon the memory cell array 103 is performed so as to overlap the successive read cycle and shows a case that the write-to-read operation is requested for the same address.

First, when the address corresponding to the bit line pair BL0 is specified and the write operation is requested at the time t1, data D is written in the write bus WBUS in synchronization with the time t2 one cycle after the current cycle. The activation signal WEE also rises at the time tWBE in synchronization with the time t2. The data D is thus fetched into the hold circuit 113 and supplied to the data line WLINE for write by the write buffer 114. The column select signal YW0 for write then rises, so that the data D is written in the bit line pair BL0.

Meanwhile, the address corresponding to the bit line pair BL0 is specified and the read operation is requested at the time t2. Because the write address is the same as the read address, the address transition detection signal AT is "L". The column select signal YR0 for read is thus maintained in an inactivated state. At this time, the data D is being written in the bit line pair BL0 by the previous write request and thus the signal amount is still small. If the data D is read on the way, it can be broken. Because AT="L", however, the data D is not read. The write operation continues stably without particular load changes in the bit line pair BL0. That is, read data usually read to the data line RLINE for read is not provided. The activation signal RAEP then rises at the time tRAE but the activation signal RAE does not rise because AT="L", so that the read amplifier 108 is not activated either. The write data D is held by the register 115 in synchronization with the activation signal RAEP and transferred to the signal line HDATA. As the delay address transition detection signal ATD is also "L", the multiplexer 111 selects the input 0 and the write data D is read as it is to the read bus RBUS as the read data D.

Needless to mention, the write-to-read operation for different addresses can be performed without any problems in the second embodiment.

According to recent DRAMs, a predetermined latency can be added to the period from when a write command is inputted to when the write operation upon an array is started. For example, according to DDR DRAMs, DQS starts to be inputted in the current cycle, data is fetched in synchronization with DQS in the next cycle, and the data is provided in synchronization with CLK in the cycle after the next cycle. Two cycles of the latency are thus provided. When a calculation is completed within the two cycles and the write operation is performed in the regular latency, the spec tDPL(tWR) is not violated. When the calculation involves the read operation in such a configuration, the configuration described in the second embodiment can be applied one cycle earlier. This case is described with reference to FIGS. 7A, 7B, and 7C.

FIGS. 7A, 7B, and 7C are explanatory diagram of operation timings when the calculation involves the read operation, where FIG. 7A shows a single write operation, FIG. 7B shows a write-to-read operation, and FIG. 7C shows a write-to-write operation.

In the write operation shown in FIG. 7A, with respect to a write command issued at the time t1, the regular write request upon an array is started at a time t3 but read is performed at the time t2 and write is actually performed at the time t3.

In the write-to-read operation shown in FIG. 7B, with respect to the write command issued at the time t1, read is performed at the time t2 and write is performed at the time t3. A read command is then issued at a time t4.

In the write-to-write operation shown in FIG. 7C, with respect to the write command issued at the time t1, read is performed at the time t2 and write is performed at the time t3. With respect to a write command issued at the time t2, read is performed at the time t3 and write is performed at the time t4. Only the read operation is performed at the time t2. The write operation and the read operation are performed at the same time at the time t3. Only the write operation is performed at the time t4.

Figure 8:
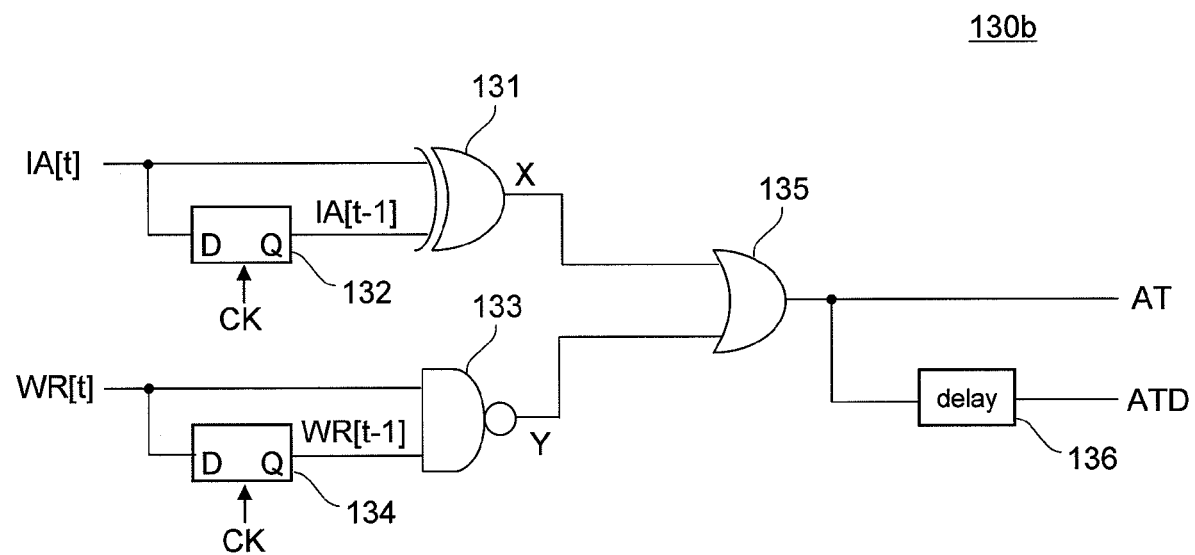
FIG. 8 is a circuit diagram of a detection circuit 130b.

The overlap between the write operation and the read operation does not occur in the write-to-read operation shown in FIG. 7B and occurs only in the write-to-write operation shown in FIG. 7C. A circuit shown in FIG. 8 needs to be used as the circuit that generates the address transition detection signal AT. While a detection circuit 130b shown in FIG. 8 has basically the same circuit configuration as the detection circuit 130 shown in FIG. 2, it is different from the detection circuit 130 in that the current write-state flag WR[t] is inputted to one end of the NAND gate 133. The address transition detection signal AT is thus obtained by the logical OR of a state signal Y that becomes "L" only in the write-to-write operation and a state signal X that becomes "L" only when the same address is inputted successively. Only when the write-to-write operation is performed and addresses in the write cycles are the same, AT="L".

According to the second embodiment, when the write-to-write operation is requested for the same address in the semiconductor memory device which, with respect to the write request, needs to perform the read operation before actually performing the write operation upon the memory cell array 103 and performs these operations in pure synchronization with clocks, the successive write operation can be performed correctly without actually performing the read operation.

A third embodiment of the present invention is described next.

When the write operation and the read operation can be performed in the same cycle like the second embodiment described above, the write request and the read request can be received at the same time as long as these operations are performed within one clock cycle. The third embodiment takes such a matter into consideration. The circuit configuration shown in FIG. 1 can be used as it is as a configuration of principal parts of the semiconductor memory device according to the third embodiment.

Figure 9:
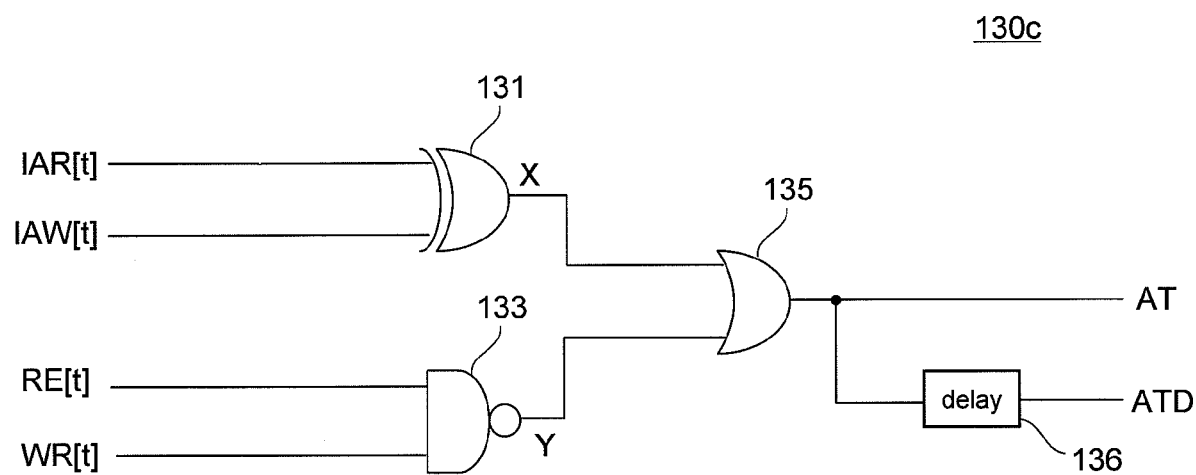
FIG. 9 is a circuit diagram of a detection circuit 130c.

According to the third embodiment, the write operation overlaps the read operation when the write request and the read request are received at the same time. A circuit shown in FIG. 9 needs to be used as the circuit that generates the address transition detection signal AT in the third embodiment. A detection circuit 130c shown in FIG. 9 has a circuit configuration obtained by removing the DQ latches 132 and 134 from the detection circuit 130 shown in FIG. 2. A current read address IAR[t] and a current write address IAW[t] are supplied to the EXOR gate 131 and the current read-state flag RE [t] and the current write-state flag WR[t] are inputted to the NAND gate 133. The address transition detection signal AT thus becomes "L" only when the write request and the read request are issued at the same time and the read address is the same as the write address.

Figure 10:
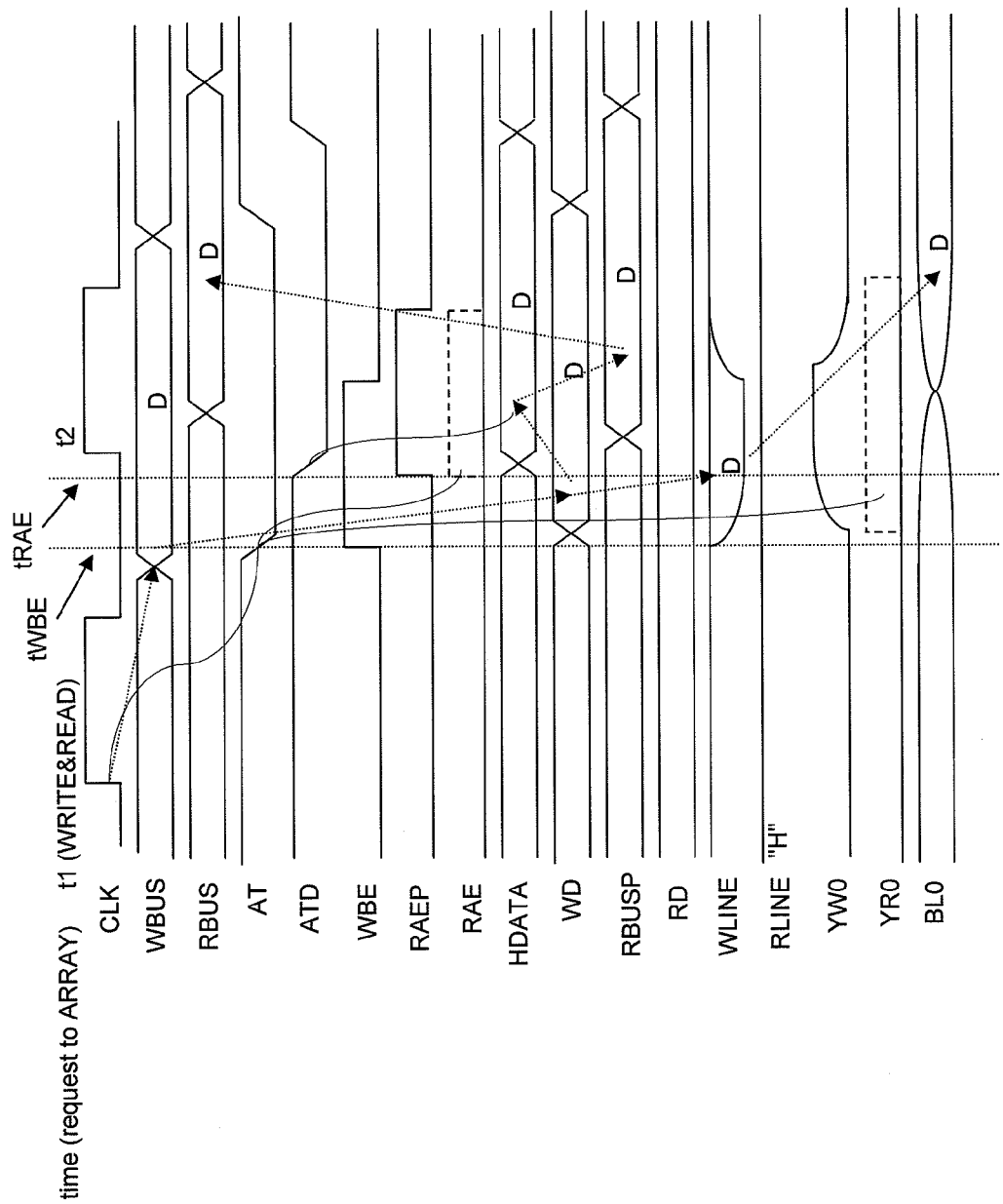
FIG. 10 is a timing diagram showing an operation timing when the write request and the read request are issued at the same time and the read address is the same as the write address according to the third embodiment.

FIG. 10 is a timing diagram showing an operation timing when the write request and the read request are issued at the same time and the read address is the same as the write address.

First, when the address corresponding to the bit line pair BL0 is specified and the write operation is requested at the time t1, data D is written in the write bus WBUS in synchronization with the time t1. The activation signal WBE also rises at the time tWBE in synchronization with the time t1. The data D is thus fetched into the hold circuit 113 and supplied to the data line WLINE for write by the write buffer 114. The column select signal YW0 for write then rises, so that the data D is written in the bit line pair BL0.

Meanwhile, the read operation is also requested at the time t2 by specifying the address corresponding to the bit line pair BL0. That is, because the write address is the same as the read address, the address transition detection signal AT is "L". The column select signal YR0 for read is thus maintained in an inactivated state. At this time, the data D is being written in the bit line pair BL0 by the previous write request and thus the signal amount is still small. If the data D is read on the way, it can be broken. Because AT="L", however, the data D is not read. The write operation continues stably without particular load changes in the bit line pair BL0. That is, the read data usually read to the data line RLINE for read is not provided. The activation signal RAEP then rises at the time tRAE but the activation signal RAE does not rise because AT="L", so that the read amplifier 108 is not activated either. The write data D is held by the register 115 in synchronization with the activation signal RAEP and transferred to the signal line HDATA. As the delay address transition detection signal ATD is also "L", the multiplexer 111 selects the input 0 and the write data D is read as it is to the read bus RBUS as the read data D.

Needless to mention, the write-to-read operation for different addresses can be performed without any problems in the third embodiment.

Examples of the semiconductor memory device that the write request and the read request can be performed at the same time like the third embodiment include dual-port memories. More specific embodiments that the present invention is applied to the dual-port memory are described later. The third embodiment is characterized by that when the write request and the read request are provided for the same address, the write operation is actually performed for the write request and the write data is returned as it is as read data without actually performing the read operation for the read request.

A fourth embodiment of the present invention is described next.

According to the third embodiment described above, when the write request and the read request are provided for the same address, the write operation is actually performed for the write request but the read operation is not actually performed for the read request and the write data is returned as it is as the read data. According to the fourth embodiment, when the write request and the read request are provided for the same address, the read operation is actually performed for the read request and then the write operation is actually performed for the write request. The circuit configuration shown in FIG. 1 can be used as it is as a configuration of principal parts of the semiconductor memory device according to the fourth embodiment.

In this case, the activation of the write buffer activation signal WBE needs to be delayed with respect to the activation signal RAEP in response to the read request. As a result, the write operation goes on into the next cycle. The same measures as in the first embodiment are required. A circuit shown in FIG. 11 needs to be used as the circuit that generated the address transition detection signal AT in the fourth embodiment. A detection circuit 130d shown in FIG. 11 has a circuit configuration obtained by adding DQ latches 151 and 152 to the detection circuit 130c shown in FIG. 9. The current read address IAR[t] and a write address IAW[t−1] one cycle before the current cycle are supplied to the EXOR gate 131 and the current read-state flag RE[t] and the write-state flag WR[t−1] one cycle before the current cycle are inputted to the NAND gate 133. The address transition detection signal AT becomes "L" only when the read request is issued in the cycle next to the write request and the read address is the same as the write address.

Figure 12:
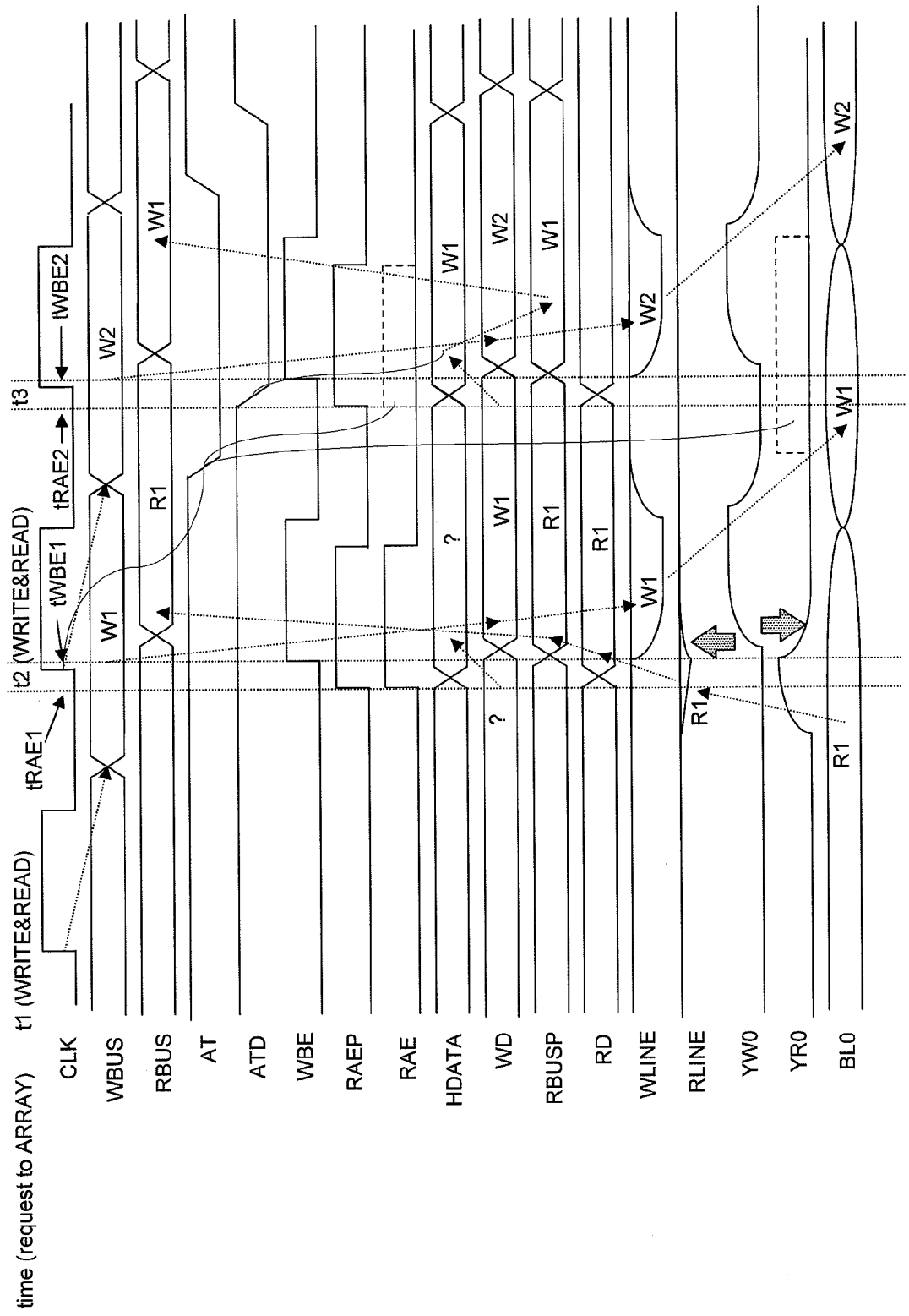
FIG. 12 is a timing diagram showing an operation timing when the simultaneous issue of the write request and the read request is performed consecutively and the read address is the same as the write address according to the fourth embodiment.

FIG. 12 is a timing diagram showing an operation timing when the simultaneous issue of the write request and the read request is performed consecutively and the read address is the same as the write address.

First, when the address corresponding to the bit line pair BL0 is specified and the read operation is requested at the time t1, the column select signal YR0 for read is activated because AT="H", read data R1 is read form the bit line pair BL0 and supplied to the data line RLINE for read. The activation signal RAEP then rises at a time tRAE1 corresponding to the time t1 and the activation signal RAE also rises because AT="H". The data R1 is thus amplified by the read amplifier 108 and held by the hold circuit 110. The multiplexer 111 then selects the input 1 and the read data R1 is outputted via the multiplexer 111 to the read bus RBUS.

Meanwhile, the write operation is also requested at the time t1 by specifying the address corresponding to the bit line pair BL0. Data W1 is written in the write bus WBUS in synchronization with the time t1. The write buffer activation signal WBE rises at a time tWBE1 later than the time tRAE1. The data W1 is thus held by the hold circuit 113 and supplied to the data line WLINE for write by the write buffer 114. The column select signal YW0 for write then rises and the data W1 is written in the bit line pair BL0. Because YR0 and YW0 have the same address and select the same bit line pair BL0, a method of falling of YR0 will be required to write the data W1 easily. Because the data R1 has been held by the hold circuit 110, problems do not occur.

Subsequently, when the address corresponding to the bit line pair BL0 is specified and the read operation is requested again at the time t2, the address transition detection signal AT becomes "L" because the address corresponding to the current read request is the same as the address corresponding to the write request in the previous cycle. The column select signal YR0 for read that rises in normal cases thus does not rise. At this time, the data W1 is being written in the bit line pair BL0 by the previous write request and thus the signal amount is still small. If the data W1 is read on the way, it can be broken. Because AT="L", however, the data W1 is not read. The write operation continues stably without particular load changes in the bit line pair BL0. That is, the read data usually read to the data line RLINE for read is not provided. The activation signal RAEP then rises at a time tRAE2 but the activation signal RAE does not rise because AT="L", so that the read amplifier 108 is not activated either. The write data W1 is held by the register 115 in synchronization with the activation signal RAEP and transferred to the signal line HDATA. As the delay address transition detection signal ATD is also "L", the multiplexer 111 selects the input 0 and the write data W1 is read as it is to the read bus RBUS as the read data.

Meanwhile, the write operation is also requested at the time t2 by specifying the address corresponding to the bit line pair BL0. Data W2 is written in the write bus WBUS in synchronization with the time t2. The write buffer activation signal WBE rises at a time tWBE2 later than the time tRAE2. The data W2 is thus fetched into the hold circuit 113 and supplied to the data line WLINE for write by the write buffer 114.

Even if the write request and the read request are received for the same address, the operation that written data is read first and then the data is written can be realized without rate-controlling a cycle time tCK. Because write in the array is delayed by a read amplifier timing wait time in the operation described in the fourth embodiment, operations become difficult with respect to the spec tDPL(tWR) that determines the time when a pre-charge command can be inputted after a write command like the first embodiment.

A fifth embodiment of the present invention is described next.

The fifth embodiment describes an example that the present invention is applied to an ECC circuit built-in DRAM.

Write and read are described first with respect to a single error correcting Hamming code that is a systematic code usually used for memories among a normal ECC operation. Assume that the number of information bits is k bit, the number of check bits is m bit, and total data is n(=k+m)bit. A calculation is performed, modulo 2. An element is {0, 1}, and addition + is exclusive-OR. The systematic code means a code that an information bit and a check bit can be separated perfectly from each other.

Write is described first. An information bit i with a k bit width to be written is represented by formula (1).

$$i = \begin{bmatrix} i_1 \\ i_2 \\ \vdots \\ i_k \end{bmatrix} \tag{1}$$

Because the information bit i and a check bit p can be processed in a separated manner in the systematic code, the information bit i is written as it is in a memory array for information bit and the check bit p with an m bit width obtained by being transformed using an m×k (row m×column k) transformation matrix A is written in a memory array for check bit. These processes are represented by formulas (2) to (4).

$$\begin{cases} p = \begin{bmatrix} p_1 \\ p_2 \\ \vdots \\ p_m \end{bmatrix} = A \cdot i \tag{2} \\ \\ A = \begin{bmatrix} A_{11} & A_{12} & \cdots & A_{1k} \\ A_{21} & A_{22} & \cdots & A_{2k} \\ \vdots & \vdots & \cdots & \vdots \\ A_{m1} & A_{m2} & \cdots & A_{mk} \end{bmatrix} = [a_1\ a_2 \cdots a_k] \tag{3} \\ \\ a_i = \begin{bmatrix} A_{1i} \\ A_{2i} \\ \vdots \\ A_{mi} \end{bmatrix} \text{ where } i = 1, 2, ..., k \tag{4} \end{cases}$$

Column vectors $a_i$ (i=1, 2, ..., k) serving as elements of the transformation matrix A are not zero vectors and unit vectors, either. The column vectors are different from each other. Write is performed as described above and "coding" corresponds to the part that the transformation matrix A is caused to act on the information bit i to transform into the check bit p. As a result, the total data D with an n(=k+m)bit width represented by formula (5) is written in the memory array.

$$d = \begin{bmatrix} i_1 \\ i_2 \\ \vdots \\ i_k \\ p_1 \\ p_2 \\ \vdots \\ p_m \end{bmatrix} = \begin{bmatrix} i \\ p \end{bmatrix} \tag{5}$$

Read is described next. Assume that an error e with an n bit width is superimposed on the total data d written in the memory array, so that the total data d is changed into d'. Similarly, assume that the information bit is changed into i' and the check bit is changed into p'. These processes are represented by formulas (6) and (7).

$$\begin{cases} d' = \begin{bmatrix} i' \\ p' \end{bmatrix} = \begin{bmatrix} i + e1 \\ p + e2 \end{bmatrix} = d + e \tag{6} \\ \\ e = \begin{bmatrix} e1_1 \\ e1_2 \\ \vdots \\ e1_k \\ e2_1 \\ e2_2 \\ \vdots \\ e2_m \end{bmatrix} = \begin{bmatrix} e1 \\ e2 \end{bmatrix} \tag{7} \end{cases}$$

First, the transformation matrix A that is the same as the matrix used for writing the information bit i' is caused to act to compare to the coded and written check bit p', so that a comparison bit q with an m bit width is obtained. That is, the comparison bit q is represented by formula (8) from formula (6).

$$q = A \cdot i' = A \cdot i + A \cdot e1 \tag{8}$$

When there are no errors, the comparison bit q should match with the check bit p', which can be found surely by formula (8). "Coding" corresponds to the process that the transformation matrix A is caused to act on the information bit i' to obtain the comparison bit q. The systematic code is characterized by that the same transformation matrix A as the matrix used for read can be used.

Next, to determine whether the comparison bit q matches with the check bit p', assume that addition (modulo 2) is performed and a result bit s with an m bit width is obtained. The result bit s is represented by formulas (9) to (11) from formulas (2), (6), and (8). This calculation utilizes the law of addition a+a=0, modulo 2.

$$\begin{cases} s = q + p' \\ \quad = \{A \cdot i + A \cdot e1\} + \{p + e2\} \\ \quad = \{A \cdot i + A \cdot e1\} + \{A \cdot i + e2\} \\ \quad = A \cdot e1 + e2 \\ \quad = [A \quad Um] \cdot \begin{bmatrix} e1 \\ e2 \end{bmatrix} = H \cdot e \text{ where } Um \text{ represents } m \times m \text{ unit matrix} \\ H = [a_1 \cdots a_k \; um_1 \cdots um_m] \\ um_i = \begin{bmatrix} 0 \\ \vdots \\ 0 \\ 1 \\ 0 \\ \vdots \\ 0 \end{bmatrix} \begin{matrix} \leftarrow \text{row}(1) \\ \vdots \\ \leftarrow \text{row}(i-1) \\ \leftarrow \text{row}(i) \\ \leftarrow \text{row}(i+1) \\ \vdots \\ \leftarrow \text{row}(m) \end{matrix} \text{, where } i = 1, 2, \ldots, m \end{cases}$$

(9)

(10)

(11)

Assume that the error e is a single error. When an error exists at the ith bit of e, the result bit s is represented by formula (12) from formulas (9) and (10).

$$s = H \cdot e \qquad (12)$$

$$= [a_1 \cdots a_k \; um_1 \cdots um_m] \cdot \begin{bmatrix} 0 \\ \vdots \\ 0 \\ 1 \\ 0 \\ \vdots \\ 0 \end{bmatrix} \begin{matrix} \leftarrow \text{row}(1) \\ \vdots \\ \leftarrow \text{row}(i-1) \\ \leftarrow \text{row}(i) \\ \leftarrow \text{row}(i+1) \\ \vdots \\ \leftarrow \text{row}(n) \end{matrix}$$

$$= \begin{cases} a_i & \text{case of } i \in [l, k] \\ um_{i-k} & \text{case of } i \in [k+1, n(=k+m)] \end{cases}$$

That is, when the error exists at the information bit i' (i∈[1,k]), $a_i$ which is the ith column vector element of the transformation matrix A is obtained. When the error exists at the check bit p' (i∈[k+1,n]), umi-k which is the (i-k)th column unit vector element of the unit matrix um is obtained. $a_i$ is neither the zero vector nor the unit vector and is different from each other as described above. It is thus determined that the error occurs in the ith bit from the result of the result bit s. $a_i$ is not the zero vector so as to be distinguished from the case the error does not exist. $a_i$ is not the unit vector so as to be distinguished from the case the error exists at the check bit p' (i∈[k+1,n]). Because the result bit s provides error bit information, it is called a syndrome. Because a matrix H in formula (10) is used for calculating the syndrome as in formula (12), it is called a Hamming check matrix. A vector function F is then caused to act on a syndrome s with an m bit width, that is, the syndrome s is decoded, so that error bit position data t with a k bit width that is error bit information of the information bit i' is calculated. Error correction is performed only upon the information bit i' and the check bit p' is excluded. This is because the information bit i' is read correctly even if the error exists at the check bit p' in the single error correcting Hamming code. This is often used for reducing circuits, which is represented by formula (13).

$$t = F(s) = \begin{bmatrix} f_1(s) \\ f_2(s) \\ \vdots \\ f_k(s) \end{bmatrix} \xrightarrow{\text{when error exists at } i\text{th bit}} \begin{bmatrix} 0 \\ \vdots \\ 0 \\ 1 \\ 0 \\ \vdots \\ 0 \end{bmatrix} \begin{matrix} \leftarrow \text{row}(1) \\ \vdots \\ \leftarrow \text{row}(i-1) \\ \leftarrow \text{row}(i) \\ \leftarrow \text{row}(i+1) \\ \vdots \\ \leftarrow \text{row}(k) \end{matrix} = e1 \qquad (13)$$

A function f1 (i=1, 2, . . . , k) that is the element of the vector function F is selected so as to be 1 only when the syndrome s is equal to the ith column vector element $a_i$ of the transformation matrix A. Only the element indicating a bit of the information bit i' to be corrected in the elements of the error bit position data t is 1 and other elements are 0. The error bit position data t is thus equal to the error e1. The process of comparing the comparison bit q to the check bit p' to obtain the error bit position data t from the syndrome corresponds to "check".

The error bit position data t is then caused to act on the information bit i' for correction, which is represented by formula (14).

$$i'+t=\{i+e1\}+e1=i \qquad (14)$$

Formulas (6) and (13) and the law of addition a+a=0 modulo 2 are used. The process that the position data t obtained from the syndrome is caused to act on the information bit i' to correct the information bit corresponds to "correction".

As described above, "coding"→"check"→"correction" is performed in read.

As described above, as data stored in the ECC circuit built-in DRAM, the "information bit" actually required and the "check bit" used for correcting the information bit when errors occur in the information bit are provided. During the write operation, the information bit is written and coded to generate the check bit (coding step) and the resultant check bit is written. During the read operation, the information bit and the check bit are read, the read information bit is coded (coding step), and the coded information bit is compared to the check bit. As a result, a failed bit in the information bit is found (check step), the failed bit in the information bit is corrected, and the resultant bit is read (correction). As described above, "coding" is performed in write and "coding"→"check"→"correction" is performed in read.

The number of check bits required for correcting a certain bits of the information bit is calculated by the information theory. Even in the simplest single error correction, the number of check bits m capable of correcting k bits of the information bit needs to satisfy the following formula (15). That is, when the number of outcomes $2^m$ that can be represented by m check bits is larger than the sum of the number of failed bits (m+k) when such failed bits exist and 1 that is the number of outcomes when the failed bits do not exist, the failed bits can be determined by the check bit.

$$2^m \geq m+k+1 \qquad (15)$$

From formula (15), when k=8, m=4, when k=16, m=5, and when k=32, m=6. As the number of information bits is increased, the ratio of number of check bits m required to the number of information bits k is decreased. As a DRAM requires a "byte mask function" for masking a part of data to be read/written at the same time, the check bit needs to be assigned per one byte, that is, 8 bits even if a large number of bits of data are read/written at the same time. In this case, for 8 bits of information bit, 4 bits of the check bit are required. The total number of bits is thus 12 bits, which is 1.5 times larger than the information bit. This means that the memory cell array becomes larger 1.5 times, resulting in a significant increase in a chip size.

The fifth embodiment solves the above problem. To avoid the problem, during the read operation, read is performed as usual like "coding"→"check"→"correction". During the write operation, it suffices that read ("coding"→"check"→"correction") is performed first, the corrected data is then mixed with the write data, and write ("coding") is performed using the updated total information bit. Before write is actually performed upon the memory cell array, the already written data is read once, so that the number of information bits is increased.

The method described in Japanese Patent Application Laid-open (JP-A) No. 2007-42176 is known to be one of methods utilizing the above principle. The method described in JP-A No. 2007-42176 utilizes a sense-amplifier activating operation and a pre-charge operation in a DRAM. "Coding"→"check"→"correction" (corresponding to the read operation described above) is performed first by an ACT command and the corrected data is held at a sense amplifier. When a READ command is inputted, the corrected data held by the sense amplifier is read. When a write command is inputted, write data is overwritten on the corrected data held by the sense amplifier. "Coding" (corresponding to the write operation described above) is finally performed by a pre-charge command.

That is, in the read command, the data corrected and read by the ACT command is read. In the write command, the data read by the ACT command is mixed with the write data and the resultant data is coded finally by the pre-charge command, so that the write operation is performed. According to JP-A No. 2007-42176, already written data is read temporarily using the row cycle, thereby increasing the number of information bits. The ECC operation is thus performed without any limitation on the number of information bits.

However, because the method of JP-A No. 2007-42176 performs a calculation using the row cycle, the calculation is performed upon all active sense amplifiers. That is, because the calculation needs to be performed also upon data that is not actually inputted/outputted, more consumption power is required. As the calculation is performed upon the sense amplifier, a sense amplifier for information bit and a sense amplifier for check bit need to be always in the same combination. The column select line needs to be also in the same combination. Needless to mention, a redundant column select line for redundancy repair needs to be in the same combination. When the number of information bits is designed to be relatively large, the number of redundant column select lines required for repairing a failed bit is increased and the design of repair becomes difficult.

The fifth embodiment also solves the problems in JP-A No. 2007-42176. According to the fifth embodiment, a circuit configuration that can perform the ECC operation without any limitations on the number of information bits by using not the row cycle but a column cycle is provided. Thus, the problems in JP-A No. 2007-42176 can be solved. That is, because only the minimum necessary calculation is performed for the ECC operation of actually inputted/outputted data, there will be no wasteful calculation. Further, the calculation is performed outside the array. There is thus no limitation at all on circuits for redundancy repair.

In the read cycle, only the read operation is performed. In the write cycle, the read operation needs to be performed first and then the write operation needs to be performed. This is an example that a calculation involves the read operation upon an array in the first embodiment. Specific descriptions thereof are made below. This operation is possible when the write operation/read operation is performed upon the entire array and the read operation is performed so that coding is integrated into check such as "coding and check"→"correction" so as to be different from a coder for the write operation even if an ECC code is not a systematic code. In the case of the systematic code, however, a coder for the write operation can be the same as the one for the read operation, which leads to easier timing design. Accordingly, a case of the systematic code is exemplified in the following descriptions.

Figure 13:
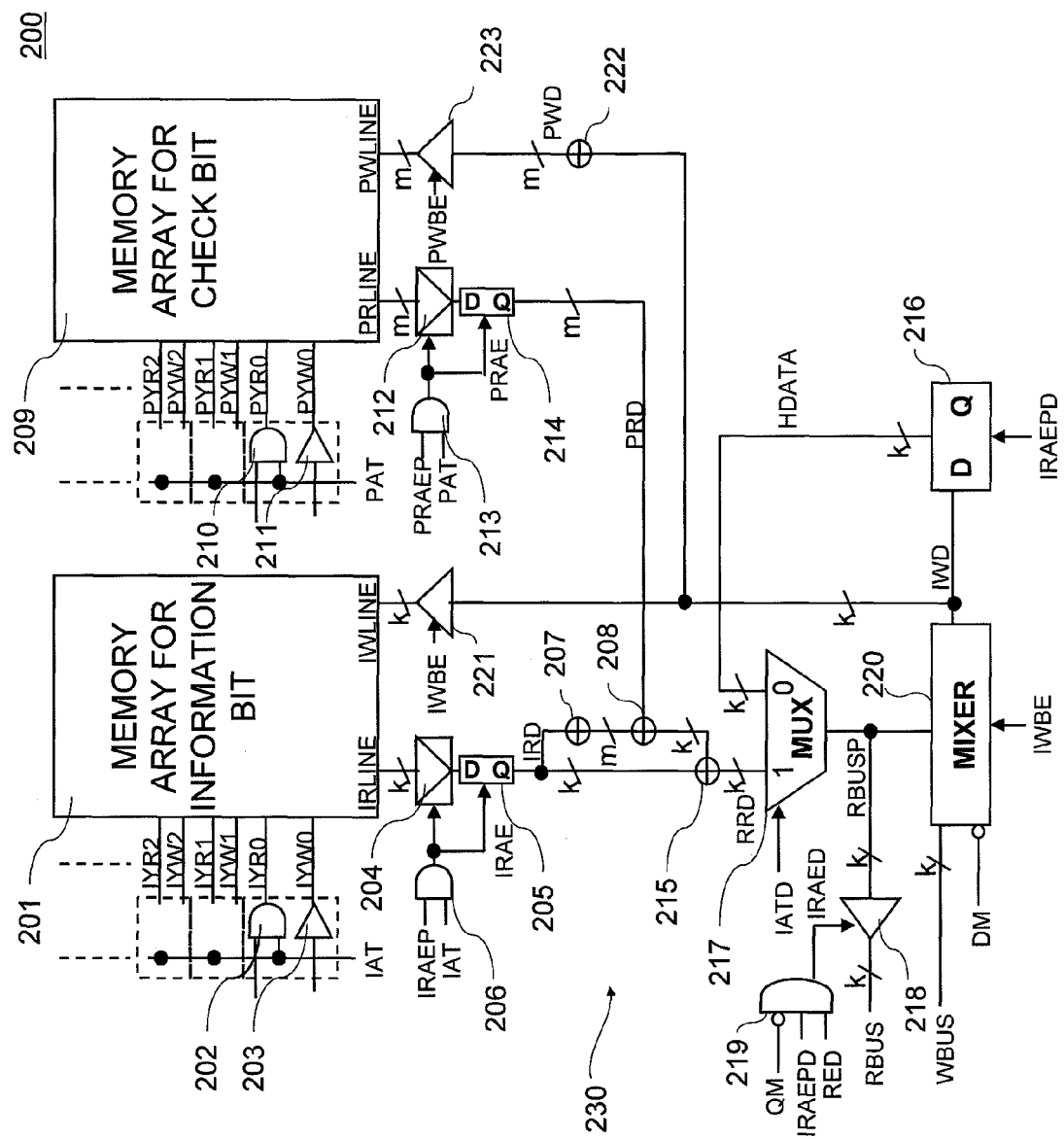
FIG. 13 is a circuit diagram showing a configuration of principal parts of a semiconductor memory device 200 according to the fifth embodiment of the present invention.

FIG. 13 is a circuit diagram showing a configuration of principal parts of a semiconductor memory device 200 according to the fifth embodiment. Although not particularly limited thereto, the semiconductor memory device 200 according to the fifth embodiment is also a DRAM.

As shown in FIG. 13, the semiconductor memory device 200 according to the fifth embodiment includes a memory array 201 for information bit and a memory array 209 for check bit. The memory array 201 for information bit stores information bits and the memory array 209 for check bit stores check bits. Circuit configurations of the respective memory arrays 201 and 209 are the same as the memory cell array 103 shown in FIG. 1.

Read data (information bit) to be read from the memory array 201 for information bit is supplied to a data line IRLINE for read based on column select signals IYR0, IYR1, . . . for read serving as outputs of a column select driver 202 for read. Write data (information bit) to be written in the memory array 201 for information bit is supplied from a data line IWLINE for write based on column select signals IYW0, IYW1, . . . for write serving as outputs of a column select driver 203 for write. Similarly, read data (check bit) to be read from the memory array 209 for check bit is supplied to a data line PRLINE for read based on column select signals. PYR0, PYR1, . . . for read serving as outputs of a column select driver 210 for read. Write data to be written in the memory array 209 (for check bit) is supplied from a data line PWLINE for write based on column select signals PYW0, PYW1, . . . for write serving as outputs of a column select driver 211 for write. In this regard, the semiconductor memory device 200 is the same as the semiconductor memory device 100 shown in FIG. 1.

The bit width of the data line IRLINE for read and the data line IWLINE for write provided for the memory array 201 for information bit is k bits. The bit width of the data line PRLINE for read and the data line PWLINE for write provided for the memory array 209 for check bit is m bits. These data lines IRLINE, IWLINE, PRLINE, and PWLINE are connected to an input/output circuit 230.

The input/output circuit 230 includes a coding circuit 207, a check circuit 208, and a correction circuit 215 provided between the data line IRLINE for read and a multiplexer 217. The coding circuit 207 generates m bits of check bit from k bits of information bit. The check circuit 208 checks the check bit generated by the coding circuit 207 with the check bit read through the data line PRLINE for read from the memory array 209 for check bit. The correction circuit 215 corrects the information bit based on the check result of the check circuit 208 so that the information bit including errors becomes the correct one. The information bit corrected by the correction circuit 215 is supplied via the multiplexer 217 to the read bus RBUS and to a mixer 220.

The mixer 220 temporarily stores the information bit read from the memory array 201 for information bit and corrected and overwrites the information bit by write data inputted through the write bus WBUS. Overwrite of the information bit by the write data can be performed on a byte basis by a byte mask signal DM for write. Even if the information bit has plural bytes, partial overwrite can be performed on a one byte basis.

An output of the mixer 220 is supplied via a write buffer 221 to the data line IWLINE for write. The output of the mixer 220 is also supplied to a coding circuit 222, so that m bits of the check bit are generated from k bits of the information bit. The generated check bit is supplied via a write buffer 223 to the data line PWLINE for write. The output of the mixer 220 is also supplied to a register 216. An output of the register 216 is supplied to the multiplexer 217.

Because other configurations of the semiconductor memory device 200 are similar to those of the semiconductor memory device 100, descriptions thereof will be omitted.

According to the fifth embodiment, an address transition detection signal IAT is activated by addresses matching with each other. The address transition detection signal IAT is used when controlling the information bit. A delay address transition detection signal IATD is obtained by delaying the address transition detection signal IAT according to an activation signal IRAEPD for determining a timing of outputting corrected data to the read bus RBUS. An address transition detection signal PAT is used when controlling the check bit. Although these signals have different operation timings, signals that they base on can use the detection circuit 130a shown in FIG. 5. That is, while it is IAT and PAT="H" in a normal case, when an address of a READ cycle is the same as that of a write cycle during the write-to-read operation or when addresses in write cycles are the same during the write-to-write operation, it is IAT, IATD, and PAT="L".

There is described below a normal operation, that is, an operation when the address transition detection signals IAT, IATD, and PAT are "H".

A read cycle is described first. In the read cycle, only the read operation is performed. For the memory array 201 for information bit, the column select line IYR for read is driven by the column select driver 202 and k bits of information bit data are read to the data line IRLINE for read. The read information bit is amplified by a read amplifier 204 in synchronization with an activation signal IRAEP and held by a hold circuit 205. Further, k bits of the information bit data are converted into m bits of code bit data by the coding circuit 207.

On the other hand, for the memory array 209 for check bit, the column select line PYR for read is driven by the column select driver 210 and m bits of check bit data are read to the data line PRLINE for read. The read check bit is amplified by a read amplifier 212 in synchronization with an activation signal PRAEP and held by a hold circuit 214. Timings of driving the column select line PYR for check bit and of activating the read amplifier 212 are delayed with respect to the column select line and the read amplifier for the information bit by the time required for the coding circuit 207 to code. Thus, the check bit generated by the coding circuit 207 and the check bit read from the memory array 209 for check bit reach the check circuit 208 substantially at the same time.

The check circuit 208 performs a calculation using these two check bits so as to provide k error bit position data, that is, a syndrome. The resultant syndrome is supplied to the correction circuit 215. The correction circuit 215 performs a calculation using the information bit data held by the hold circuit 205 and the syndrome supplied from the check circuit, corrects errors included in the information bit data, and outputs corrected data RRD. At this time, while some data appears in the signal line HDATA in synchronization with the activation signal IRAEPD, the multiplexer 217 selects an input 1 because the delay address transition detection signal IATD="H". The multiplexer 217 thus outputs the corrected data RRD to the signal line RBUSP.

When the delay address transition detection signal IATD changes, it is designed so as to change at the same timing as the activation signal IRAEPD. An AND gate 219 is a circuit that determines whether data on the signal line RBUSP is outputted to the read bus RBUS and generates a signal IRAED by the activation signal IRAEPD and a signal RED. Read on a 1 byte basis can be also performed by a byte mask signal QM for read. The signal RED is obtained by delaying a read-state flag according to the activation signal IRAEPD. In this case, RED="H" and bytes of data required for the read bus RBUS are outputted according to the read mask information QM by causing the data in the signal line RBUSP to be in synchronization with the activation signal IRAEPD. The timing of activating the activation signal IRAEPD needs to be delayed with respect to the timing of activating the read amplifier 204 for information bit by the sum of the coding time in the coding circuit 207, the check time in the check circuit 208, and the correction time in the correction circuit 215. In this way, the corrected information bit data is outputted to the read bus RBUS.

A write cycle is described next. In the write cycle, the read operation is performed first and the write operation is then performed. Details of the read operation are the same as those described above and the corrected information bit data is outputted via the multiplexer 217 to the signal line RBUSP. As RED="L" in the write cycle, the output of the AND gate 219 is at the L level and a tri-state buffer 218 is inactivated. Read data is not outputted to the read bus RBUS.

In the subsequent write operation, write data supplied from the write bus WBUS is fetched into the mixer 220 in synchronization with a write buffer activation signal IWBE. The data corrected by the preceding read operation is supplied from the signal line RBUSP to the mixer 220. The mixer 220 mixes the write data with the read data according to data mask information DM to output k information bit data to the signal line IWD. The outputted information bit data is held by the register 216. To fetch the data from the signal line RBUSP into the mixer 220, the hold circuits 205 and 214 need to hold data before the fetch and desirably have a one cycle holding circuit configuration. The mixer 220 needs to pass the data to the register 216 when the read cycle is performed immediately after the write cycle. The mixer 220 thus has the one cycle holding circuit configuration.

Subsequently, k information bit data are written in the memory array 201 for information bit by the write buffer 221. The coding circuit 222 codes the k information bit data on the signal line IWD to generate m code bit data. The generated code bit data (check bits) are written in the memory array 209 for check bit by the write buffer 223 in synchronization with a write buffer activation signal PWBE. The timing of activating the write buffer 223 for check bit needs to be delayed with respect to the write buffer for information bit by the coding time in the coding circuit 222. Coding and write can be performed using the information bit with the number of bits more than the number of bits limited by the data mask.

The coding circuit 207 and the coding circuit 222 can have a circuit configuration with the same code theory. Thus, when the coding circuit 207 and the coding circuit 222 have exactly the same layout, their delay times match with each other. The design of timing thus becomes easy. That is, it is sufficient to delay the timing of controlling the memory array 209 for check bit evenly with respect the control timing of the memory array 201 for information bit by the coding time in the coding circuit 207 (=the coding time in the coding circuit 222).

More specifically, it is preferable that a word line control unit (not shown) of the memory array 209 for check bit and a word line control unit (not shown) of the memory array 201 for information bit are separate circuits and the ACT timing and the PRE timing are also delayed by the coding time in the coding circuit 207 (=the coding time in the coding circuit 222). The write time that goes on into the PRE operation by the coding time in the coding circuit 222 can be eliminated. When a read operation control system of the memory array 201 for information bit is caused to be in synchronization with an internal clock ICLK, it suffices that an internal clock ICLKD delayed with respect to the internal clock ICLK by the sum of the time required for the read amplifier 204 to amplify and the time required for "coding"→"check"→"correction" is used for data output and a write operation control system of the memory array 201 for information bit. For a read operation control system of the memory array 209 for check bit, it suffices that an internal clock PCLK delayed with respect to the internal clock ICLK by the "coding" time is used. For a write operation control system of the memory array 209 for check bit, it suffices that an internal clock PCLKD delayed with respect to the internal clock PCLK by the sum of the time required for the read amplifier 212 to amplify and the time required for "coding"→"check"→"correction" is used. Although not shown, it suffices that the word line control unit of the memory array 209 for check bit is delayed with respect to the memory array 201 for information bit by the coding time in the coding circuit 207 (=the coding time in the coding circuit 222). Thus, the operations of the respective circuits can be easily made to synchronize with each other.

Figure 14:
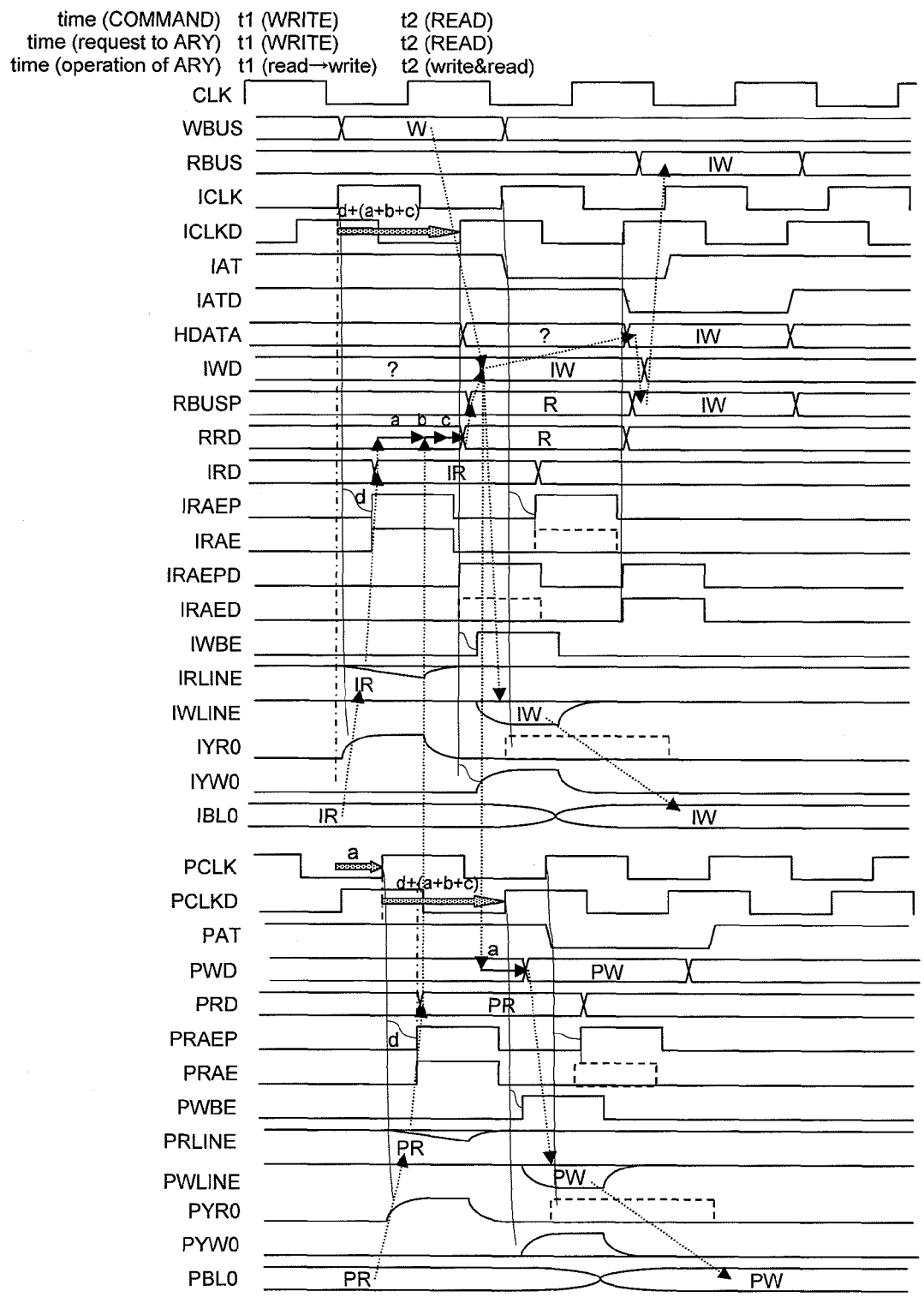
FIG. 14 is a timing diagram showing an operation timing when the address of the read cycle is the same as that of the write cycle in the write-to-read operation according to the fifth embodiment.

FIG. 14 is a timing diagram showing an operation timing when the address of the read cycle is the same as that of the write cycle in the write-to-read operation. FIG. 14 assumes the case of SDR (Single Data Rate). The same operation can be performed at DDR (Double Data Rate) when the same design is provided by considering the latency.

When a write command is inputted first at the time t1, the memory cell array receives a write cycle request at the time t1 and performs the write cycle, that is, the read operation and the write operation in this order. The read operation is started first. With respect to the information bit, the column select signal IYR0 is driven in synchronization with the internal clock ICLK and the information bit data IR is read from the bit line pair IBL0 to the data line IRLINE for read. The activation signal IRAEP waits from an active edge of the internal clock ICLK for an amplification wait time d to rise and is held by the hold circuit 205.

Meanwhile, with respect to the check bit, the column select signal PYR0 is driven in synchronization with the internal clock PCLK obtained by delaying the active edge of the internal clock ICLK by a coding time a and the check bit data PR is read from a bit line pair PBL0 to the data line PRLINE for read. The activation signal PRAEP waits from the internal clock PCLK for the amplification wait time d to rise and is held by the hold circuit 214.

The information bit data held by the hold circuit 205 is mixed with the check bit data held by the hold circuit 214 after the coding time a. The resultant mixed data is read as corrected data R after a check time b and a correction time c. Because the address transition detection signal IATD="H", the corrected data R is read to the signal line RBUSP and supplied to the mixer 220. While the output timing signal IRAEPD rises in synchronization with the internal clock ICLKD obtained by delaying the internal clock ICLK by d+(a+b+c), the signal IRAED does not rise because the current cycle is the write cycle. The corrected data R is not outputted to the read bus RBUS. While the data on the signal line IWD is held in the signal line HDATA by the signal IRAEPD, it is unnecessary data.

The write operation is started next. With respect to the information bit, the write buffer activation signal IWBE rises in synchronization with the internal clock ICLKD, write data W is fetched from the write bus WBUS, the previously read corrected data R is fetched from the signal line RBUSP, and the write data is mixed with the corrected data in the mixer 220. That is, the write data W is overwritten on the corrected data R. At this time, the overwrite operation is performed according to the data mask information DM. When the data mask is not instructed, the write data W is overwritten on all bits of the corrected data R. When the data mask is instructed, however, the write data W is overwritten on bit pairs of the corrected data R that are not masked. Mixed information bit IW for write is outputted to the signal line IWD and held by the register 216. The information bit IW for write on the signal line IWD is supplied via the write buffer 221 to the data line IWLINE for write and written in the bit line IBL0 in response to the activation of the column select signal IYW0. The information bit IW for write on the signal line IWD is also supplied to the coding circuit 222, so that a check bit PW is generated. The check bit PW is supplied via the write buffer 223 to the data line PWLINE for write and written in the bit line PBL0 in response to the activation of the column select signal PYW0. Because the check bit PW is delayed with respect to the information bit IW by the coding time a, it is written in the data line PWLINE for write by the write buffer activation signal PWBE in synchronization with the internal clock PCLKD obtained by delaying the internal clock PCLK by d+(a+b+c).

Subsequently, when a read command is inputted at the time t2, the memory cell array receives a read cycle request at the time t2 and thus the read operation is started. With respect to the information bit, while the column select signal IYR0 is tried to be caused to rise in synchronization with the internal clock ICLK, all column select signals IYR are maintained to be inactivated because the address transition detection signal IATD="L". While the information bit IW is being written currently because of the write operation in the previous cycle, this information bit is not read. While the read amplifier activation signal IRAE is tried to be caused to rise by the read amplifier that activates the timing signal IRAEP, the read amplifier 204 is not activated because the address transition detection signal IATD="L". Accordingly, the read amplifier 204 does not waste the current.

Meanwhile, with respect to the check bit, the column select signal PYR0 is tried to be caused to rise in synchronization with the internal clock PCLK, all column select signals PYR are maintained to be inactivated because the address transition detection signal PAT="L". That is, the check bit PW is currently being written because of the write operation in the previous cycle, but this check bit is not read. While the read amplifier activation signal PRAE is tried to be caused to rise by the read amplifier that activates the timing signal PRAEP, the read amplifier 212 is not activated because the address transition detection signal PAT="L". Accordingly, the read amplifier 212 does not waste the current.

As described above, the information bit and the check bit are not read from the respective memory arrays. The output timing signal IRAEPD then rises in synchronization with the internal clock ICLKD and the information bit held by the signal line IWD and used for write in the previous cycle is fetched into the register 216. The information bit used for write in the previous cycle thus appears in the signal line HDATA. The multiplexer 217 selects the input 0 and the information bit on the signal line HDATA is outputted to the read bus RBUS. Because the data on the signal line IWD is held by a static latch, errors hardly occur and thus any correction is not particularly required.

As described above, according to the fifth embodiment, no matter what accesses are requested in the ECC circuit built-in DRAM, the ECC operation can be realized without rate-controlling the cycle time. When the write operation is requested, even in the case that the data mask is provided, the information bit with the same number of bits as the one when the data mask is not provided is read and the write data is partially overwritten on this information bit. As a result, the number of information bits to be coded is increased. The ratio of number of check bits required to the number of information bits thus becomes decreased and the extension of the memory cell array can be suppressed. As described in the first embodiment, however, write in the memory cell array is delayed by the calculation time. Note that operations become difficult with respect to the spec tDPL(tWR) that determines the time when a pre-charge command can be inputted after a write command. An access time tAA is also delayed by the coding time.

A sixth embodiment of the present invention is described next.

According to the sixth embodiment, while its basic circuit configuration is the same as that of the semiconductor memory device according to the fifth embodiment (see FIG. 13), it is configured not to violate the spec tDPL(tWR) in consideration of the write latency of recent DRAMs as described in the second embodiment. As compared to the fifth embodiment, reference clocks of the signals need to be changed in the sixth embodiment. Although not particularly described below, the way of handling a byte mask signal is the same as that of the fifth embodiment.

The read operation control system of the memory array 201 for information bit uses the internal clock ICLK. The data output uses the internal clock ICLKD delayed with respect to the internal clock ICLK by the sum of the time required for the read amplifier 204 to amplify and the time required for "coding"→"check"→"correction", and the read operation control system of the memory array 209 for check bit uses the internal clock PCLK delayed with respect to the internal clock ICLK by the "coding" time, which is the same as that in the fifth embodiment. The write operation control system of the memory array 201 for information bit uses the internal clock ICLK and the write operation control system of the memory array 209 for check bit uses the internal clock PCLK. The detection circuit 130b shown in FIG. 8 can be used for signals that the address transition detection signals IAT, IATD, and PAT base on. This signal is usually "H" but becomes the L level when "the addresses of the write cycles are the same in the write-to-write operation". Because the mixer 220 fetches data from the signal line RBUSP one cycle after the current cycle, the hold circuits 205 and 214 need to be one-cycle holding circuits.

Figure 15:
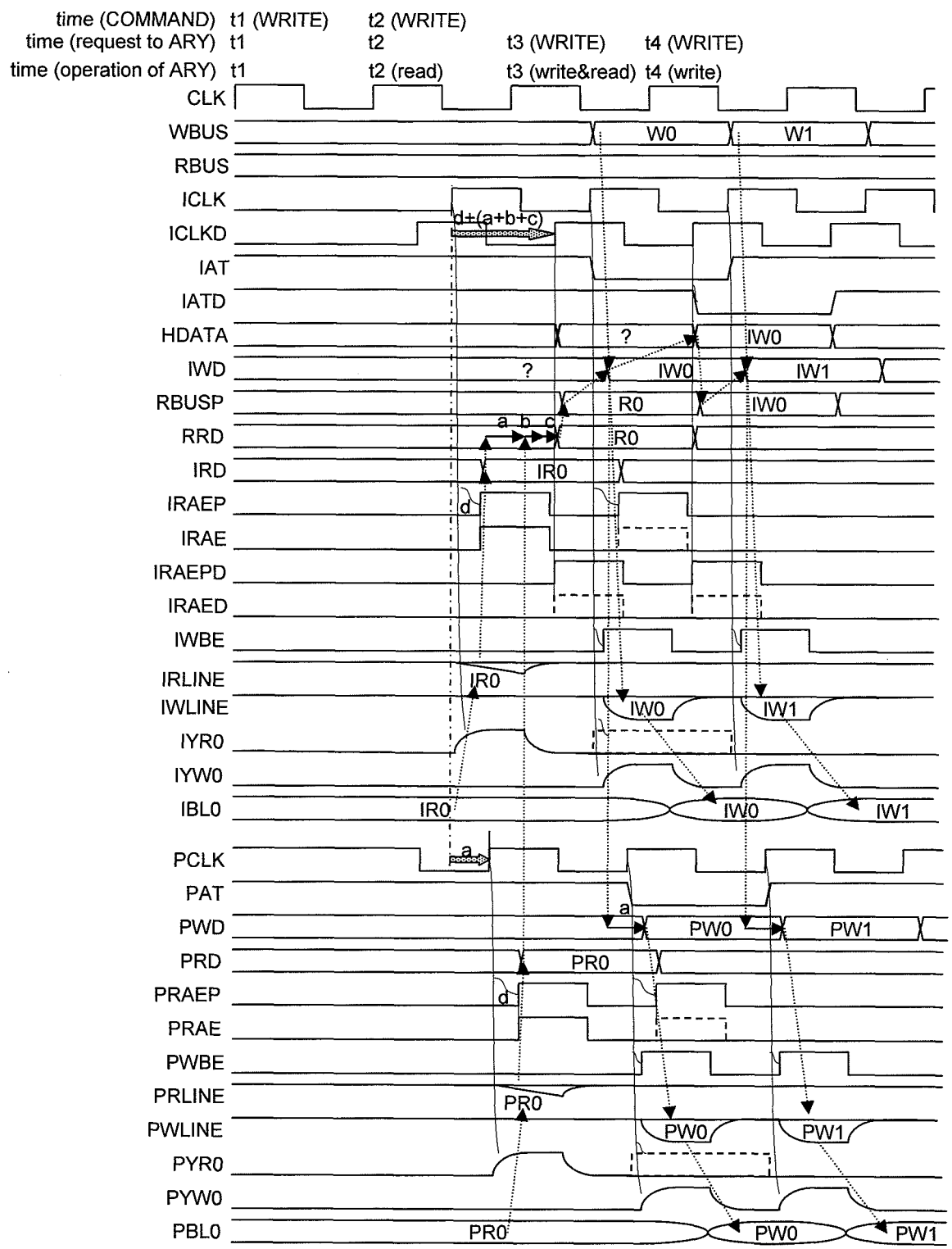
FIG. 15 is a timing diagram showing an operation timing when the addresses of the write cycles are the same in the write-to-write operation according to the sixth embodiment.

FIG. 15 is a timing diagram showing an operation timing when the addresses of the write cycles are the same in the write-to-write operation. FIG. 15 assumes a DDR1 DRAM.

First, when a write command is inputted at the time t1, the memory cell array usually receives a write cycle request at the time t3. Because the read operation can start at the time t2, it is designed so that the write cycle is started at the time t2, that is, after the read operation at the time t2, the write operation is started at the time t3. In this case, note that the detection circuit 130b shown in FIG. 8 operates by having the time t2 as the starting point.

First, the read operation is started. With respect to the information bit, the column select signal IYR0 is driven in synchronization with the internal clock ICLK and the information bit data IR0 is read from the bit line pair IBL0 to the data line IRLINE for read. The read amplifier activating timing signal IRAEP waits from the active edge of the internal clock ICLK for the amplification wait time d to rise and is held by the hold circuit 205.

Meanwhile, with respect to the check bit, the column select signal PYR0 is driven in synchronization with the internal clock PCLK obtained by delaying the internal clock ICLK by the coding time a and the check bit data PR is read from the bit line pair PBL0 to the data line PRLINE for read. The read amplifier that activates the timing signal PRAEP waits from the internal clock PCLK for the amplification wait time d to rise and is held by the hold circuit 214.

The information bit data held by the hold circuit 205 is then mixed with the check bit data held by the hold circuit 214 after the coding time a. The resultant mixed data is read to the signal line RRD as the corrected data R0 after the check time b and the correction time c. Because IATD="H", the corrected data R0 is read to the signal line RBUSP. While the output timing signal IRAEPD rises in synchronization with the internal clock ICLKD obtained by delaying the internal clock ICLK by d+(a+b+c), the signal IRAED does not rise because the current cycle is the write cycle. Accordingly, the corrected data R0 is not outputted to the read bus RBUS. On the other hand, while the data on the signal line IWD is held in the signal line HDATA by the signal IRAEPD, it is unnecessary data.

Subsequently, the write operation is started at the time t3. With respect to the information bit, the write buffer activation signal IWBE rises in synchronization with the internal clock ICLKD, write data W0 is fetched from the write bus WBUS into the mixer 220. The previously read corrected data R0 is fetched from the signal line RBUSP into the mixer 220. The write data is mixed with the corrected data in the mixer 220. The resultant information bit IW0 for write is outputted to the signal line IWD. The information bit IW0 for write is supplied to the data line IWLINE for write by the write buffer 221 and written in the bit line pair IMBL0 in synchronization with the column select signal IYW0. The information bit IW0 for write is also supplied to the coding circuit 222, so that m bits of check bit PW0 are generated. The generated check bit PW0 is supplied to the data line PWLINE for write by the write buffer 223 in synchronization with the write buffer activation signal PWBE that is in synchronization with the internal clock PCLK, and written in the bit line pair PBL0 in synchronization with the column select signal PYW0.

Normally, when the write command is inputted at the time t2, the memory cell array receives the write cycle request at the time t4, but the write cycle is started at the time t3. That is, after the read operation at the time t3, the write operation is started at the time t4. Note that the address transition detection signal IAT also operates by having the time t3 as the starting point.

First, the read operation is started. With respect to the information bit, while the column select signal IYR0 is tried to be caused to rise in synchronization with the internal clock at the time t3, it is not driven because IATD="L". Currently, the write operation in the previous write cycle is being performed in the bit line pair IBL0 but this data is not read. While the read amplifier activating timing signal IRAEP waits from the internal clock ICLK at the time t3 for the amplification wait time d to rise, the activation signal IRAE does not rise because IATD="L" and the read amplifier 204 is not activated. Accordingly, the read amplifier 204 does not flow any wasteful amplifying current.

Meanwhile, with respect to the check bit, while the column select signal PYR0 is tried to be caused to rise in synchronization with the internal clock PCLK at the time t3 obtained by delaying the internal clock ICLK by the coding time a, it is not driven because PATD="L". Currently, the write operation in the previous write cycle is being performed in the bit line pair PBL0, but this data is not read. While the read amplifier that activates the timing signal PRAEP waits from the internal clock PCLK at the time t3 for the amplification wait time d to rise, the activation signal PRAE does not rise because PATD="L" and the read amplifier 212 is not activated. Thus, the read amplifier 212 does not flow any wasteful amplifying current.

As described above, the information bit and the check bit are not read from the memory arrays 201 and 209.

The output timing signal IRAEPD then rises in synchronization with the internal clock ICLKD at the time t3. The information bit data IW0 held by the signal line IWD and used for write in the previous cycle is fetched into the register 216 and outputted to the signal line HDATA. As the address transition detection signal IATD that is in synchronization with the internal clock ICLKD is at an "L" level, the multiplexer 217 selects the input 0 and the data on the signal line HDATA is outputted to the signal line RBUSP.

Subsequently, the write operation is started at the time t4. With respect to the information bit, the write buffer activation signal IWBE rises in synchronization with the internal clock ICLKD at the time t4, the write data W1 is fetched from the write bus WBUS and supplied to the mixer 220. The signal IW0 previously determined as the read data is fetched from the signal line RBUS into the mixer 220. The mixer 220 mixes the write data with the read data. The resultant information bit IW1 for write is outputted to the signal line IWD. The outputted information bit IW0 for write is supplied to the data line IWLINE for write by the write buffer 221 and written in the bit line pair IBL0 in synchronization with the column select signal IYW0.

Meanwhile, the information bit IW1 for write is also supplied to the coding circuit 222, so that m bits of check bit PW1 are generated with a delay of the coding time a. The generated check bit PW1 is supplied to the data line PWLINE for write by the write buffer 223 in synchronization with the write buffer activation signal PWBE that is in synchronization with the internal clock PCLK at the time t4, and written in the bit line pair PBL0 in synchronization with the column select signal PYW0.

As described above, according to the sixth embodiment, no matter what accesses are requested, the ECC operation can be realized without rate-controlling the cycle time. Further, the spec tDPL(tWR) is not violated in the sixth embodiment as in the second embodiment. Note that the access time tAA is delayed by the coding time.

A seventh embodiment of the present invention is described next.

As in the third embodiment described above, an example of semiconductor memory devices that a write request and a read request may be performed at the same time is a dual-port memory. The seventh embodiment is a more specific embodiment when the present invention is applied to the dual-port memory.

The dual-port memory has two input/output ports and can access the same memory space from these ports at the same time. It is used as an intermediary for data passing when devices that need to directly access memories or randomly access buffer regions, such as CPUs and peripheral controllers communicate with each other. Conventionally, the dual-port memories utilize SRAMs in most cases. Japanese Patent Application Laid-open No. 2004-86970 proposes a method of realizing the dual-port memory by using a DRAM.

Figure 16:
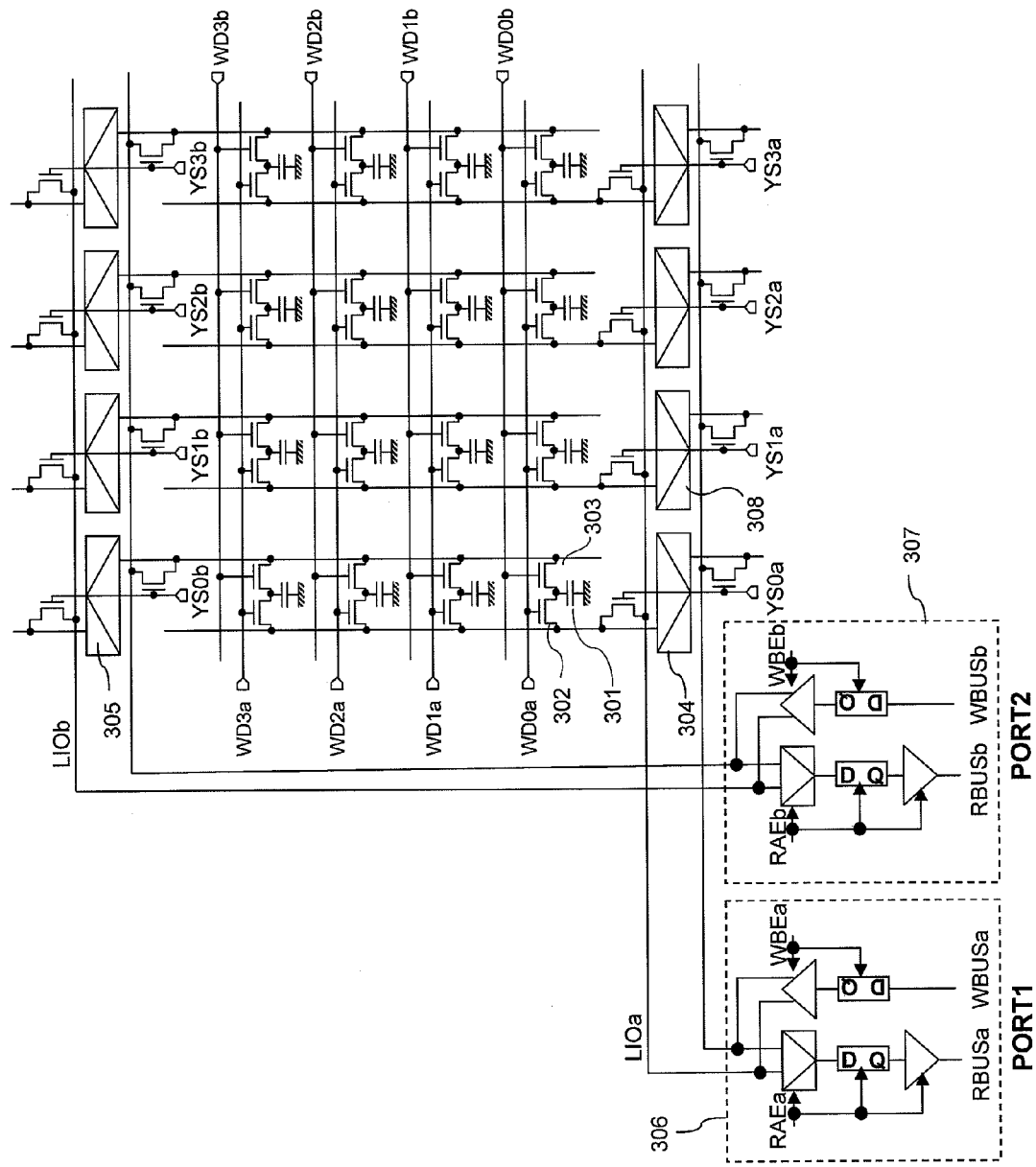
FIG. 16 is a circuit diagram showing a configuration of principal parts of the conventional dual-port memory.

FIG. 16 is a circuit diagram showing a configuration of principal parts of the dual-port memory proposed in JP-A No. 2004-86970.

A DRAM memory cell 301 shown in FIG. 16 is shared by a transfer gate 302 selected by a word line WD0a and a transfer gate 303 selected by a word line WD0b. The transfer gate 302 is a switch that connects the memory cell 301 to a sense amplifier 304 and the transfer gate 303 is a switch that connects the memory cell 301 to a sense amplifier 305. Data in the sense amplifier 304 is provided by a column select signal YS0a to an input/output port (PORT1) 306 and data in the sense amplifier 305 is provided by a column select signal YS0b to an input/output port 307 (PORT2). That is, the sense amplifiers are assigned to the input/output ports 306 and 307, respectively.

Because such a configuration enables a free row access and a column access other than a case that different data are written for the same address, the respective input/output ports can access independently the same memory array. Because the memory cell is a DRAM cell, an initial read period from when the word line rises to when the sense amplifier is activated is susceptible to noise. When large adjacent noise occurs, data may be inverted. However, according to the dual-port memory shown in FIG. 16, when the write operation is performed upon a sense amplifier 308 that has been activated during a period from when the word line WD0a is selected to when the sense amplifier 304 is activated, large adjacent noise is applied to the sense amplifier 304. Thus, the sense amplifier 304 will amplify wrong data. To solve such a problem, the write operation upon the sense amplifier 308 needs to wait until the amplification of the sense amplifier 304 is completed.

In this way, the dual-port memory described in JP-A No. 2004-86970 requires measures against noise that is characteristic of the DRAM memory cell. A smooth clock synchronization operation may not be performed or the clock cycle needs to be extended significantly. The same numbers of the word lines, the bit lines, and the sense amplifiers as the number of the ports need to be prepared, so that the memory array may become about twice larger.

To solve such problems, the seventh embodiment provides a dual-port memory that has a pseudo dual-port configuration with somewhat soften definition of a dual-port memory so as to achieve an appropriate dual-port access while maintaining a clock cycle.

Data passing through the dual-port memory is usually performed by one port connected to a controller device and the other port connected to an output device. In this case, the controller device performs mainly the write operation and the output device performs mainly the read operation. According such usage, it is thus important to be able to perform the write operation and the read operation at the same time.

The seventh embodiment provides a memory that can perform the read operation and the write operation at the same time for the same row address. The address that the read operation and the write operation can be performed at the same time is narrowed down to the same row address, so that a multi-access period can be determined as only after amplification of a sense amplifier and influences of noise during DRAM's initial read operation does not need to be considered. Because full-page data can be processed, a hit probability can be increased by devising access methods. Specifically, the dual-port memory is configured as follows. As described above, the third embodiment provides the memory core that can perform the read operation and the write operation at the same time. Arbitration circuits sharing a write path by a dual-port and sharing a read path by a dual-port are added to the memory core. In the arbitration method, when one port is assigned to the write path, the other port is assigned to the read path. The simultaneous read and write operations in the dual-port can be realized by operating the write path and the read path at the same time.

Figure 17:
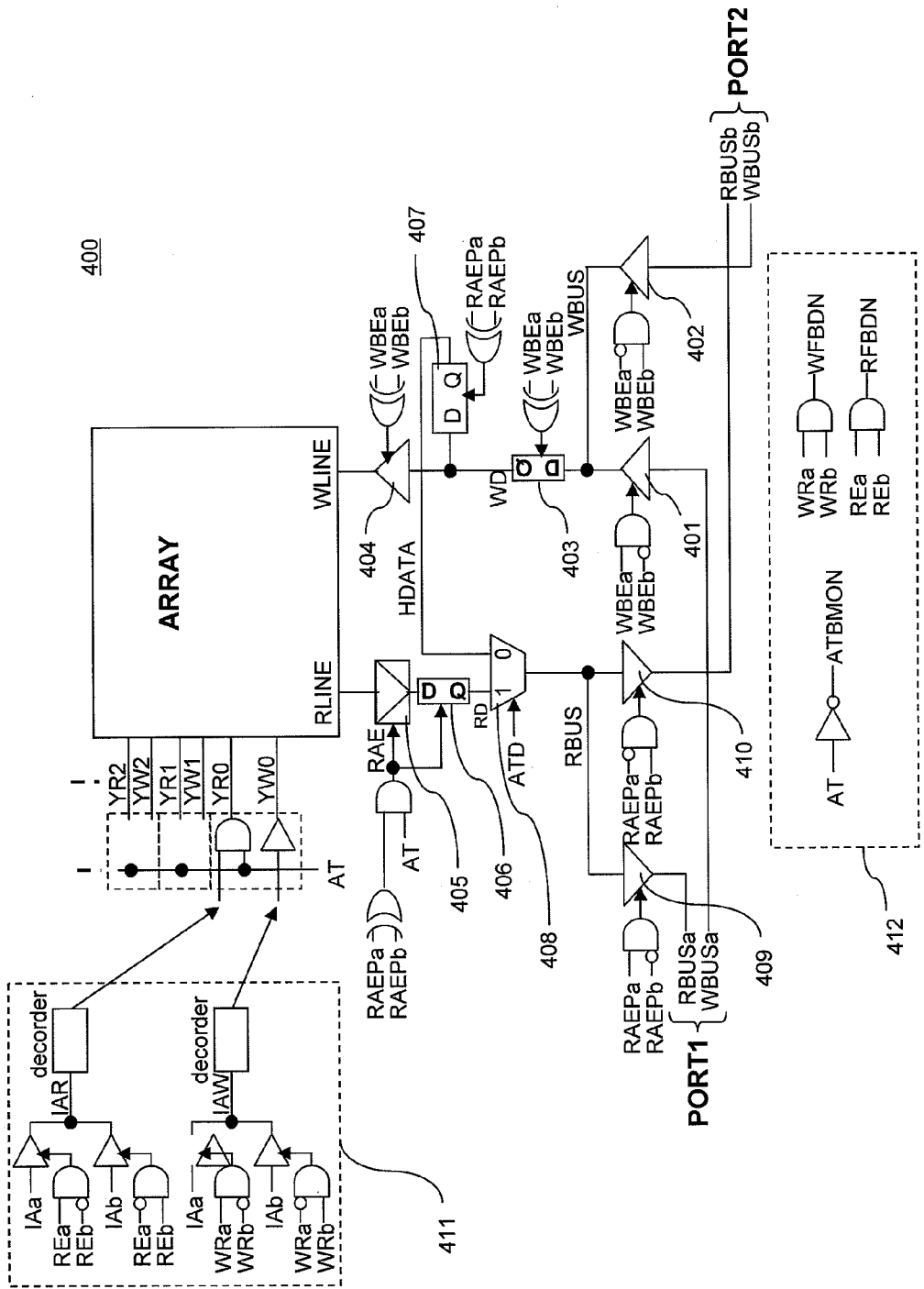
FIG. 17 is a circuit diagram showing a configuration of principal parts of a semiconductor memory device 400 according to the seventh embodiment.

FIG. 17 is a circuit diagram showing a configuration of principal parts of a semiconductor memory device 400 according to the seventh embodiment. The semiconductor memory device 400 according to the seventh embodiment is a DRAM.

As shown in FIG. 17, data control around the array is the same as that in the third embodiment and is configured such that a PORT1 and a PORT2 share the write bus WBUS for a write operation and the read bus RBUS for a read operation. A detection circuit 120c shown in FIG. 9 can be used for the address transition detection signals AT and ATD. The address transition detection signals AT and ATD become "L" only when a write request and a read request are received at the same time and a read address matches with a write address. As in the third embodiment, when the write request and the read request are received at the same address, write data is written in the array and returned as read data.

Each piece of port data is sorted as follows. With reference to FIG. 17, signals with a suffix a being attached thereto are signals for PORT1 and signals with a suffix b being attached thereto are signals for PORT2.

The write operation is described first. When the PORT1 performs the write operation but the PORT2 does not perform the write operation, a gate of a tri-state buffer 401 is opened and write data of the PORT1 is supplied to the write bus WBUS. On the other hand, when the PORT1 does not perform the write operation but the PORT2 performs the write operation, a gate of a tri-state buffer 402 is opened and write data of the PORT2 is supplied to the write bus WBUS. In this way, the write data from each port is placed on the common write bus WBUS in a separated manner. Because a hold circuit 403 needs to hold the write data from either port, it is operated depending on an exclusive-OR output of write buffer activation signals WBEa and WBEb.

The read operation is described next. As a read amplifier 405 and a hold circuit 406 need to be activated when the PORT1 performs the read operation but the PORT2 does not perform the read operation or when the PORT1 does not perform the read operation but the PORT2 performs the read operation, they are activated depending on an exclusive-OR output of activation signals RAEPa and RAEPb. A hold circuit 407 is also activated depending on an exclusive-OR output of the activation signals RAEPa and RAEPb. A multiplexer 408 then selects an input 1 or an input 0 and the signal of the selected input is supplied to the read bus RBUS. When the PORT1 performs the read operation but the PORT2 does not perform the read operation, the data is outputted via a tri-state buffer 409 to the PORT1. When the PORT1 does not perform the read operation but the PORT2 performs the read operation, the data is outputted via a tri-state buffer 410 to the PORT2.

The addresses of the PORT1 and the PORT2 are sorted into an address for a read operation IAR and an address for a write operation IAW by using a selection circuit 411 for use. The addresses of the PORT1 and the PORT2 are also used for generating the address transition detection signal AT. According to the seventh embodiment, cases that the write operation is performed at the same time in the PORT1 and the PORT2 and the read operation is performed at the same time in the PORT1 and the PORT2, that are inoperable combinations, cannot be accepted. Instead, the seventh embodiment includes a detection circuit 412. The detection circuit 412 activates a signal WFBDN when the write operation is requested in the PORT1 and the PORT2 at the same time. The detection circuit 412 activates a signal RFBDN when the read operation is requested in the PORT1 and the PORT2 at the same time. Further, the detection circuit 412 activates a signal ATBMON when the address transition detection signal becomes "L". By using these signals, controls such as rewriting data that could not be written previously and rereading data that could not be read previously will be possible.

It does not necessarily mean that the configuration of the memory cell array in the semiconductor memory device of the present invention cannot be the configuration shown in FIG. 16. The memory cell array shown in FIG. 16 can be used. This applies to other embodiments described below.

An eighth embodiment of the present invention is described next.

The eighth embodiment is obtained by further developing the seventh embodiment. According to the eighth embodiment, a dual-port memory that can perform the simultaneous write operation in the PORT1 and the PORT2 and the simultaneous read operation in the PORT1 and the PORT2 by specifying different addresses in addition to the simultaneous read and write operations for the same row address is provided. The eighth embodiment is one of development examples of the third embodiment.

While the data lines and the column select signals are sorted into the ones for a write operation and the ones for a read operation in the seventh embodiment described above, they are sorted into the ones for the PORT1 and the ones for the PORT2 in the eighth embodiment. Specifically, the dual-port memory is configured as follows. As described above, the third embodiment provides the memory core that can perform the read operation and the write operation at the same time. The write path of the memory core according to the third embodiment is assigned to the PORT1 and the read path is assigned to the PORT2 so that when the PORT1 performs the write operation and the PORT2 performs the read operation, these operations can be performed at the same time. Further, a write function is added to the PORT2 and the data lines are I/O lines so that when the PORT1 performs the write operation and the PORT2 performs the write operation, these operations can be performed at the same time. Assume that such a configuration is called a configuration A. The write path of the memory core according to the third embodiment is assigned to the PORT2 and the read path is assigned to the PORT1 so that when the PORT2 performs the write operation and the PORT1 performs the read operation, these operations can be performed at the same time. Further, the write function is added to the PORT1 and the data lines are I/O lines so that when the PORT2 performs the write operation and the PORT1 performs the write operation, these operations can be performed at the same time. Assume that such a configuration is called a configuration B. By bringing together the configuration A and the configuration B, a configuration that two kinds of the third embodiment are included at the same time while the PORT1 and the PORT2 are provided separately is obtained.

Figure 18:
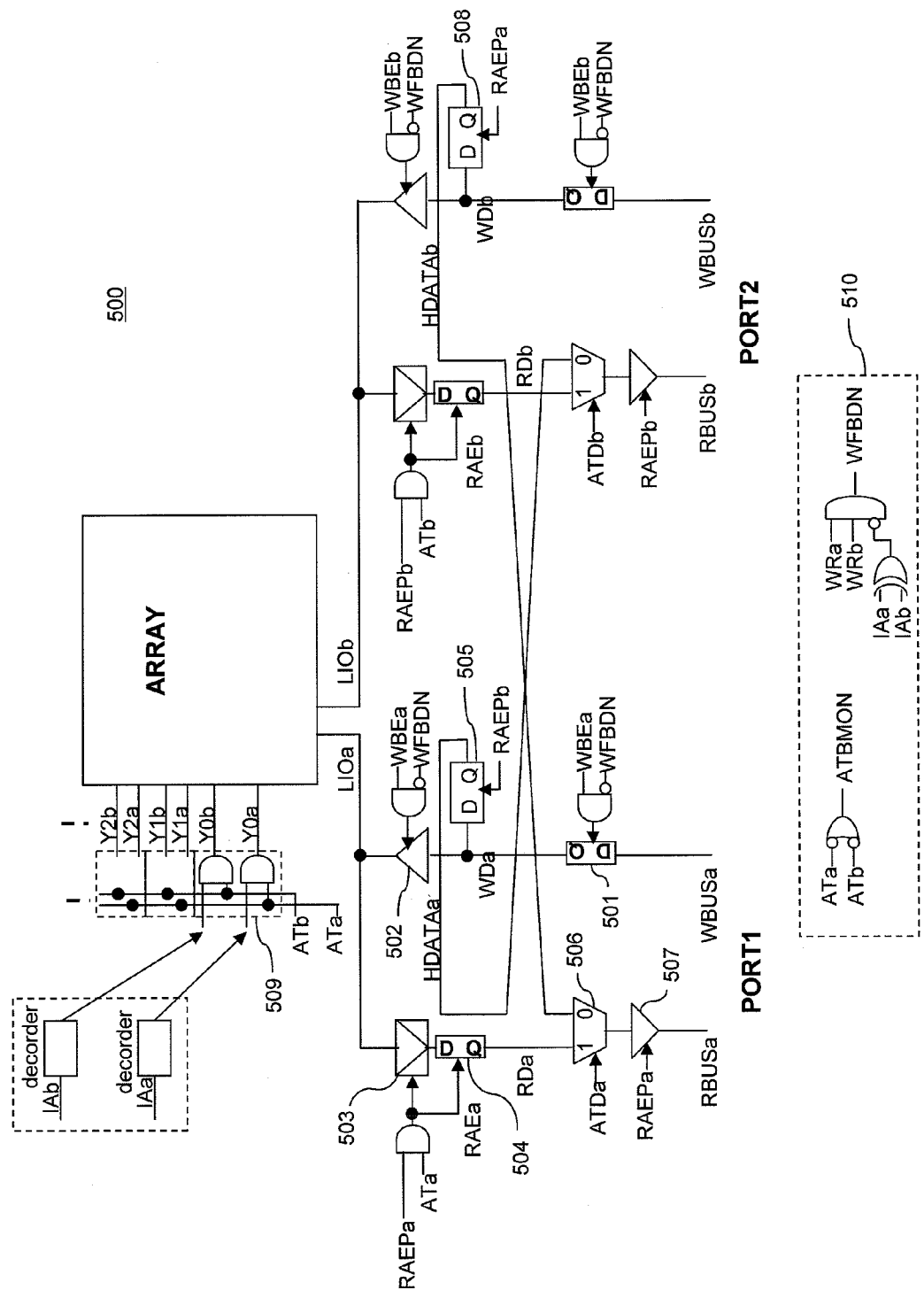
FIG. 18 is a circuit diagram showing a configuration of principal parts of a semiconductor memory device 500 according to the eighth embodiment.

FIG. 18 is a circuit diagram showing a configuration of principal parts of a semiconductor memory device 500 according to the eighth embodiment. The semiconductor memory device 500 according to the eighth embodiment is a DRAM.

As shown in FIG. 18, during the write operation using the PORT1, write data is fetched by a hold circuit 501 and supplied by a write buffer 502 to an I/O line LIOa. During the read operation using the PORT1, read data supplied through the I/O line LIOa is amplified by a read amplifier 503, held by a hold circuit 504, and selected by a multiplexer 506. The resultant data is then outputted from a tri-state buffer 507. Such processes are performed in the PORT1 at independent timings. When the read operation of the PORT1 and the write operation of the PORT2 are performed at the same address, the write data of the PORT2 needs to be used as the read data of the PORT1. In this case, data held not by the hold circuit 504 but by a hold circuit 508 in the PORT2 is selected by the multiplexer 5Q6. Accordingly, the hold circuit 508 in the PORT2 needs to be operated at the timing of the PORT1. Because this description also applies to the PORT2, duplicate descriptions thereof will be omitted.

Figure 19:
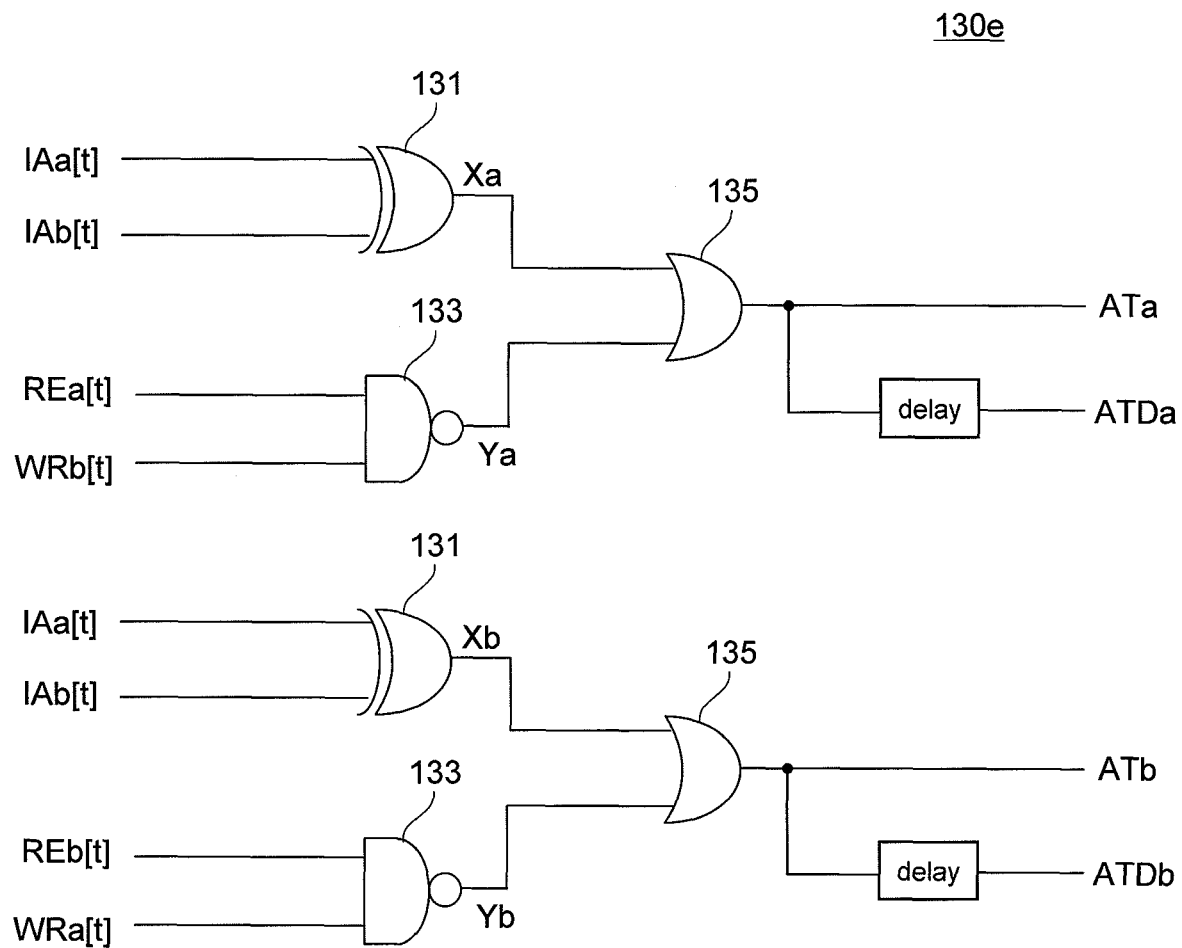
FIG. 19 is a circuit diagram of a detection circuit 130e.

Address transition detection signals ATa and ATb controlling a column select driver 509, the read amplifier 503, and the multiplexer 506 are generated by a detection circuit 130*e* shown in FIG. 19. In the detection circuit 130*e* shown in FIG. 19, when the PORT1 is for read and the PORT2 is for write and the address of the PORT1 is the same as that of the PORT2, the address transition detection signal ATa is at the L level. Similarly, when the PORT1 is for write and the PORT2 is for read and the address of the PORT1 is the same as that of the PORT2, the address transition detection signal ATb is at the L level.

When the address transition detection signal ATa is "L", the column select signal and the read amplifier 503 in the PORT1 are not driven and the write data of the PORT2 is utilized as the read data of the PORT1. The write operation in the PORT2 is normally performed. Similarly, when the address transition detection signal ATb is "L", the column select signal and the read amplifier in the PORT2 are not driven and the write data of the PORT1 is utilized as the read data of the PORT2. The write operation in the PORT1 is normally performed.

The dual-port memory according to the eighth embodiment includes a detection circuit 510. The detection circuit 510 generates a signal WFBDN activated when the simultaneous write operation in the PORT1 and the PORT2 by specifying the same address, which is an inhibited combination of operations, is requested and a signal ATBMON activated when ATa or ATb becomes "L". By using these signals, controls such as writing data that could not be written again and reading data that could not be read again will be possible. In the circuit diagram shown in FIG. 18, it is designed not to operate when an inhibited access is requested.

In the eighth embodiment, the simultaneous read operation in the PORT1 and the PORT2 by specifying the same address is not inhibited. When the signal amount obtained by the simultaneous read operation can ensure merely the signal amount of one read operation, as shown in FIG. 20, only the read operation for one port is performed and the resultant read data is preferably shared by the PORT1 and the PORT2.

Figure 20:
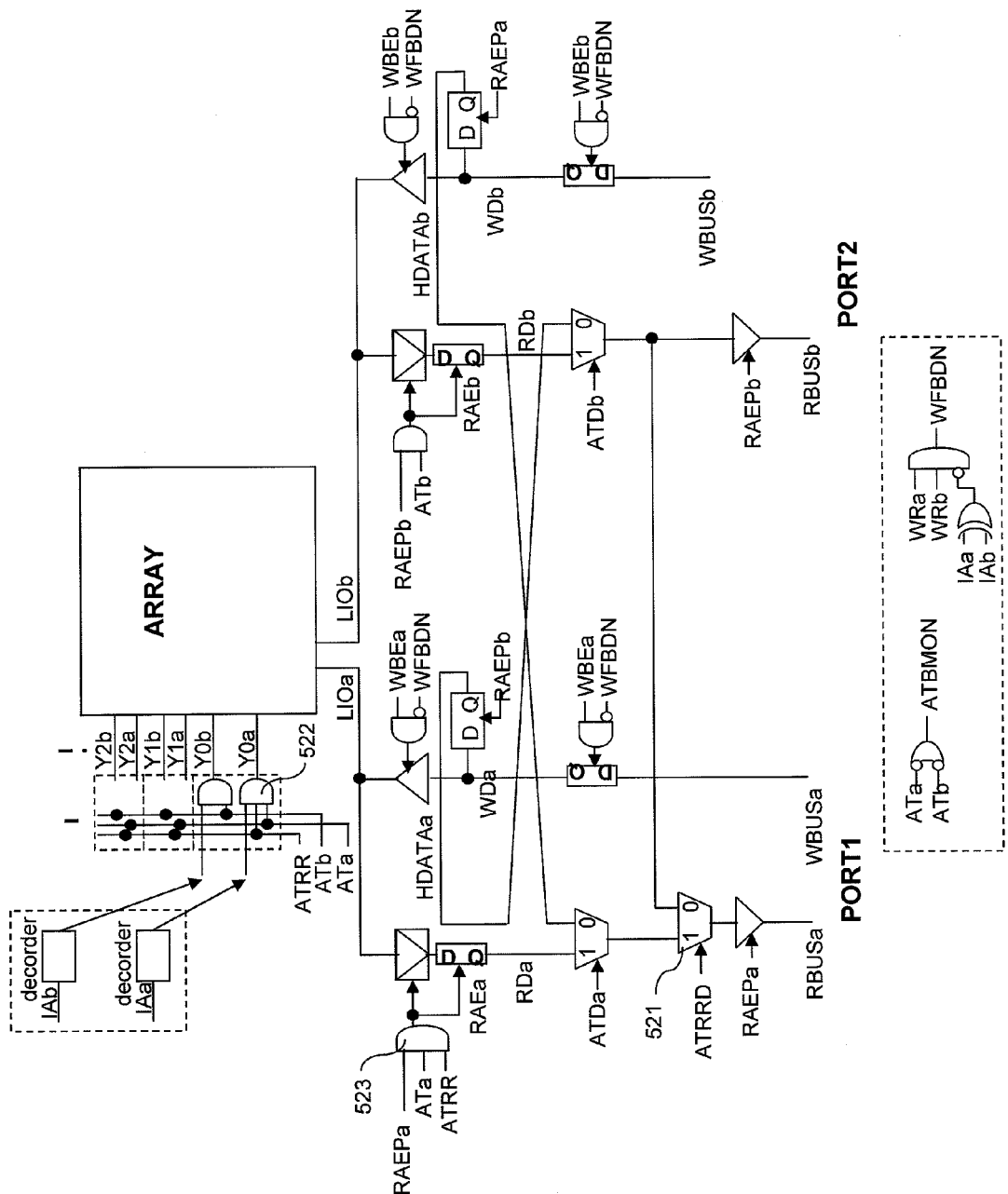
FIG. 20 is a circuit diagram of showing a modified configuration of principal parts of the semiconductor memory device 500.
Figure 21:
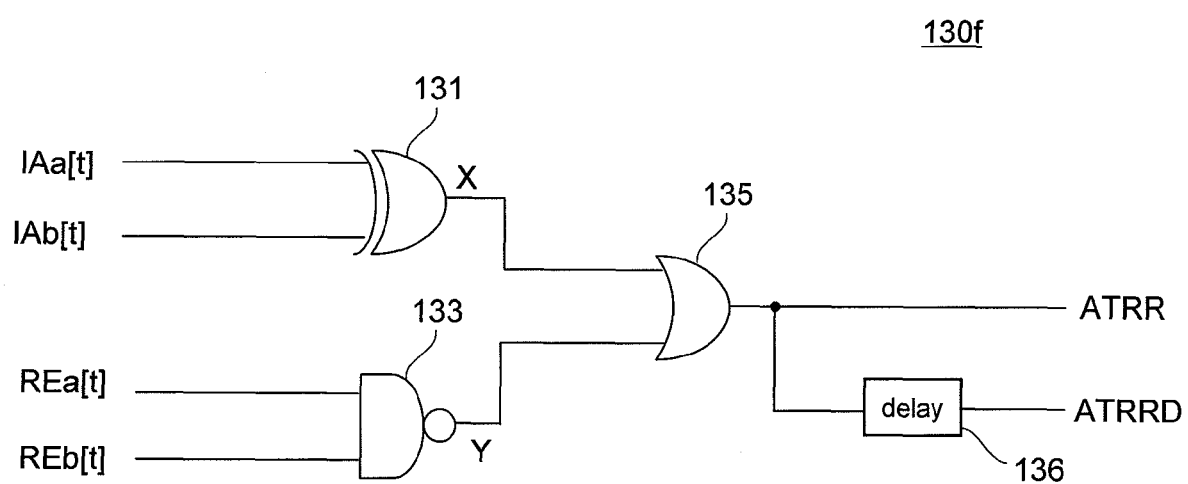
FIG. 21 is a circuit diagram of a detection circuit 130f.

In the circuit shown in FIG. 20, when the read operation is performed in the PORT1 and the PORT2 for the same address, the PORT2 performs the read operation as usual. On the other hand, the PORT1 receives the read data of the PORT2 through a multiplexer 521, stops a column select driver 522 for PORT1 by an address transition detection signal ATRR, and inhibits activation of a read amplifier 523 for PORT1. The address transition detection signal ATRR can be generated by a detection circuit 130*f* shown in FIG. 21. An address transition detection signal ATRRD is a signal obtained by delaying the address transition detection signal ATRR until read amplifier's amplification timing.

A ninth embodiment of the present invention is described next.

According to the fourth embodiment, when a write request and a read request are received at the same address, data stored in a memory cell array is read first and write data is then written. By utilizing such a process, the ninth embodiment provides a dual-port memory that can perform the read operation and the write operation at the same time for the same row address. Specifically, the dual-port memory is configured as follows. As described above, the fourth embodiment also provides the memory core that can perform the read operation and the write operation at the same time. Arbitration circuits sharing a write path by a dual-port and sharing a read path by the dual-port are added to the memory core. According to the arbitration method, when one port is assigned to the write path, the other port is assigned to the read path. Thus, the simultaneous read and write operations by the dual-port can be realized by operating the write path and the read path at the same time.

Figure 11:
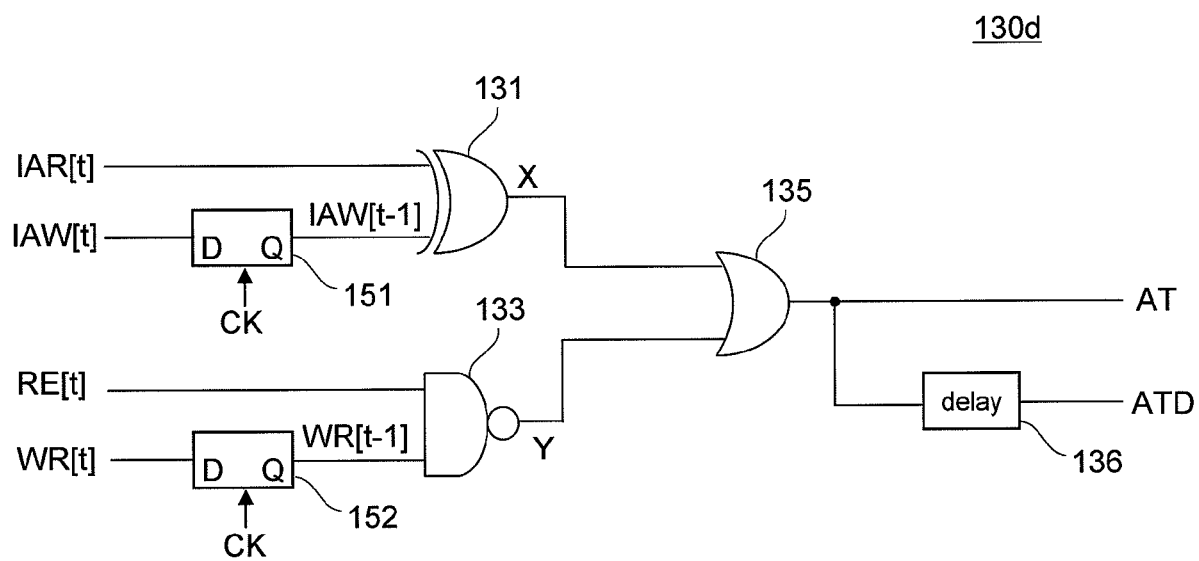
FIG. 11 is a circuit diagram of a detection circuit 130d.

The specific circuit configuration is the same as that of the dual-port memory shown in FIG. 17 according to the seventh embodiment, and the address transition detection signal AT uses the detection circuit 130*d* shown in FIG. 11. In this case, when the address in the write operation is the same as the address in the read operation in the write-to-read operation, AT="L" and the avoidance operation described in the fourth embodiment is performed. Accordingly, written data can be read first and then data can be written without rate-controlling the cycle time tCK. Because write in the array is delayed by the read amplifier activation wait time in the operation, operations become difficult with respect to the spec tDPL(tWR) that determines the time when a pre-charge command can be inputted after a write command like the fourth embodiment.

A tenth embodiment of the present invention is described.

The tenth embodiment is obtained by further developing the ninth embodiment. According to the tenth embodiment, a dual-port memory that can perform the simultaneous read operation and the simultaneous write operation for different addresses in addition to the simultaneous read and write operations for the same row address is provided. The tenth embodiment is one of development examples of the fourth embodiment.

The data lines and the column select signals are sorted into the ones for a write operation and the ones for a read operation in the ninth embodiment. In the tenth embodiment, a set for a write operation and a set for a read operation are further prepared and these sets are used for the PORT1 and the PORT2, respectively. Specifically, the dual-port memory is configured as follows. As described above, the fourth embodiment also provides the memory core that can perform the read operation and the write operation at the same time. The write path of the memory core according to the fourth embodiment is assigned to the PORT1 and the read path is assigned to the PORT2 so that when the PORT1 performs the write operation and the PORT2 performs the read operation, these operations can be performed at the same time and the read operation of the PORT 2 in the next cycle can be processed. Assume that such a configuration is called a configuration A. The write path of the memory core according to the fourth embodiment is assigned to the PORT2 and the read path is assigned to the PORT1 so that when the PORT2 performs the write operation and the PORT1 performs the read operation, these operations can be performed at the same time and the read operation of the PORT1 in the next cycle can be processed. Assume that such a configuration is called a configuration B. By bringing together the configuration A and the configuration B, a configuration that two kinds of the fourth embodiment are included at the same time while the PORT1 and the PORT2 are provided separately with having a set for a write operation and a set for a read operation, respectively can be obtained. However, the configuration of the ninth embodiment cannot handle a combination of the write operation and the read operation in the next cycle at the same port. A bypass register is thus provided so as to process the read operation of the PORT1 in the next cycle to the write operation of the PORT1. Similarly, a bypass register is provided so as to process the read operation of the PORT2 in the next cycle to the write operation of the PORT2. As a result, any operations can be handled.

Figure 22:
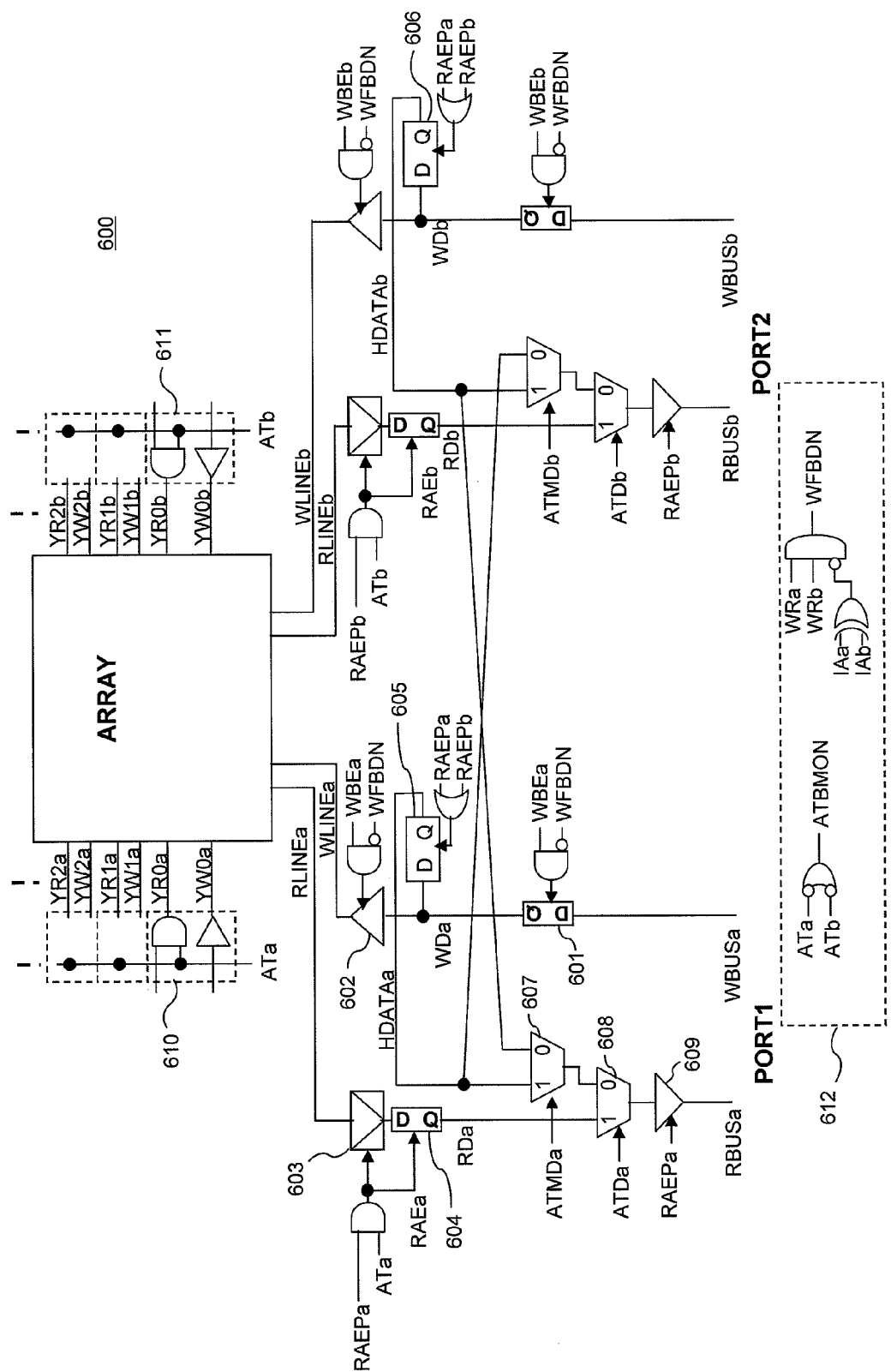
FIG. 22 is a circuit diagram showing a configuration of principal parts of a semiconductor memory device 600 according to the tenth embodiment.

FIG. 22 is a circuit diagram showing a configuration of principal parts of a semiconductor memory device 600 according to the tenth embodiment. The semiconductor memory device 600 according to the eighth embodiment is a DRAM.

As shown in FIG. 22, during the write operation in the PORT1, write data supplied from a write bus WBUSa is fetched by a hold circuit 601 and supplied by a write buffer 602 to a data line WLINEa for write. During the read operation in the PORT1, read data read from a data line RLINEa for read is amplified by a read amplifier 603, held by a hold circuit 604, and selected by multiplexers 607 and 608. The resultant data is then outputted to a read bus RBUSa. Such processes are performed in the PORT1 at independent timings. The same is applied to the PORT2.

Note that, when the read operation of the PORT1 and the write operation of the PORT1 or the PORT2 are performed at the same address, the data of the port that is performing write needs to be used. Accordingly, hold circuits 605 and 606 are operated at the timing of OR of the PORT1 and the PORT2. The multiplexer 607 selects the data held in the PORT1 or the data held in the PORT2. The multiplexer 608 then determines whether the data read from the array or the data held is used. The address transition detection signals ATa and ATb controlling column select drivers 610 and 611, the read amplifier 603, and the multiplexers 607 and 608 need to be generated by a detection circuit 130g shown in FIG. 23.

Figure 23:
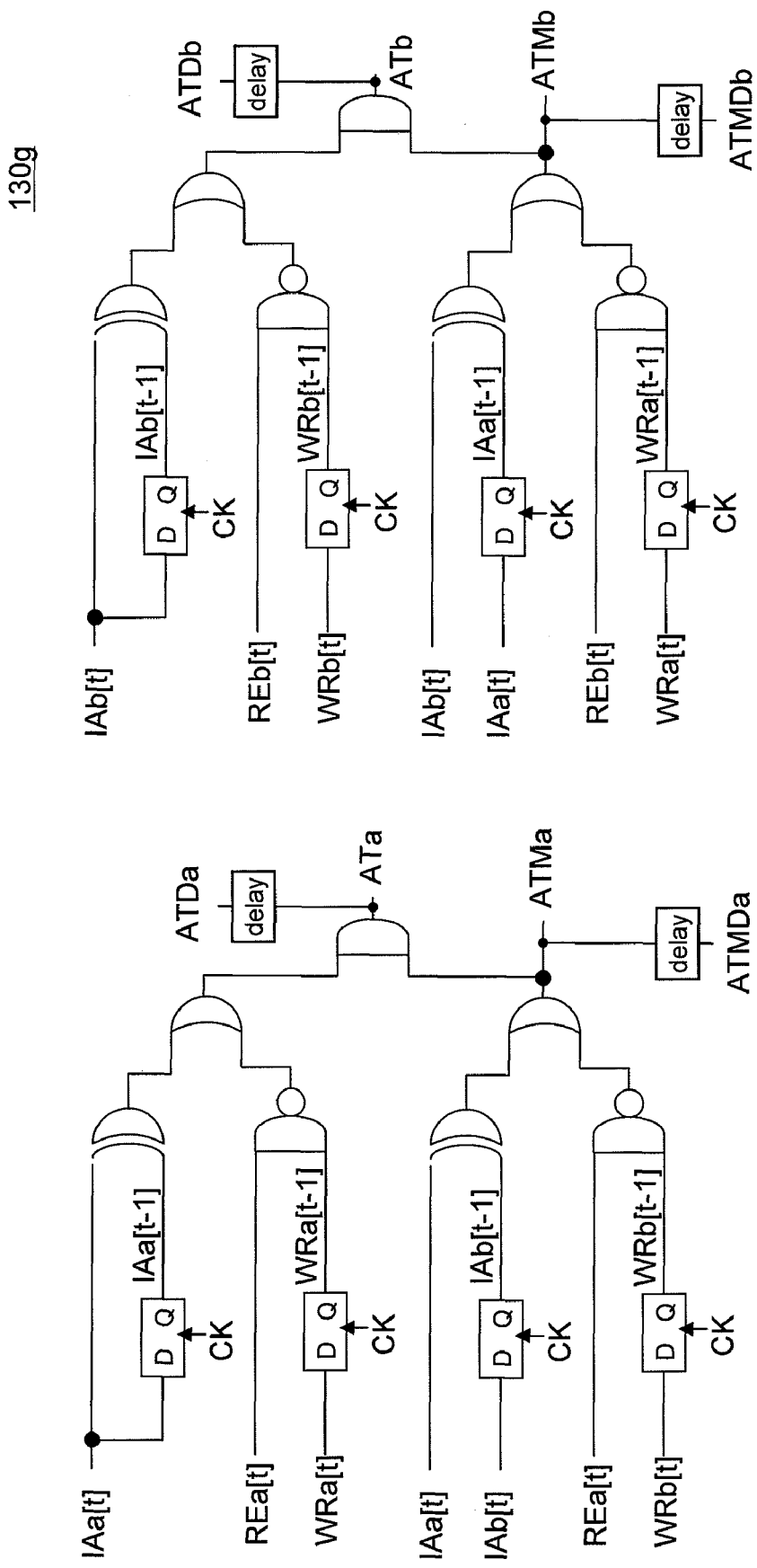
FIG. 23 is a circuit diagram of a detection circuit 130g.

The detection circuit 130g shown in FIG. 23 has the address transition detection signal ATa as the L level when the PORT1 performs the write-to-read operation and the write operation and the read operation are performed for the same address or when the PORT1 performs the read operation after the PORT2 performs the write operation and the write address of the PORT2 is the same as the read address of the PORT1. When the PORT1 performs the read operation after the PORT2 performs the write operation and the write address of the PORT2 is the same as the read address of the PORT1, a signal ATMa is set to be the L level. Similarly, when the PORT2 performs the write-to-read operation and the write operation and the read operation are performed for the same address or when the PORT2 performs the read operation after the PORT1 performs the write operation and the write address of the PORT1 is the same as the read address of the PORT2, the address transition detection signal ATb is set to be the L level. When the PORT2 performs the read operation after the PORT1 performs the write operation and the write address of the PORT1 is the same as the read address of the PORT2, a signal ATMb is set to be the L level.

As shown in FIG. 22, when the address transition detection signal ATa="L", the column select driver 610, the read amplifier 603, and the hold circuit 604 for the PORT1 are not driven and the write operation is performed in the writing port. The signal ATMa becomes H or L depending on the writing port and read of the data used for the write operation in the writing port serving as substitute data is controlled.

The dual-port memory according to the tenth embodiment includes a detection circuit 612. The detection circuit 612 has the same configuration as the detection circuit 510 shown in FIG. 18 and functions as the detection circuit 510. Also in the tenth embodiment, it is designed not to operate when an inhibited access is requested.

In the tenth embodiment, the simultaneous read operation in the PORT1 and the PORT2 by specifying the same address is not inhibited. When the signal amount obtained by the simultaneous read operation can ensure merely the signal amount of one read operation, as shown in FIG. 24, only the read operation for one port is performed and the resultant read data is preferably shared by the PORT1 and the PORT2.

Figure 24:
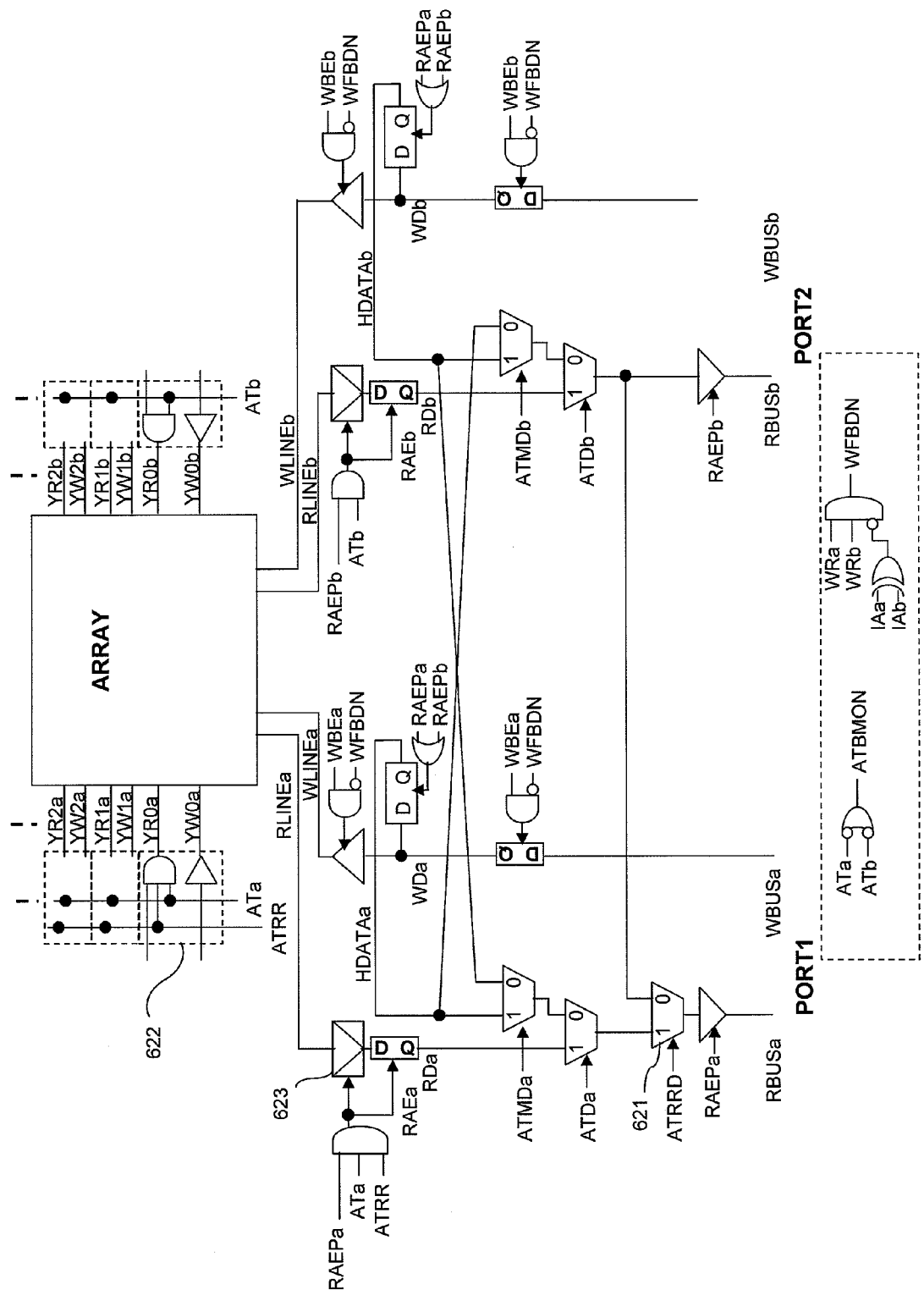
FIG. 24 is a circuit diagram of showing a modified configuration of principal parts of the semiconductor memory device 600.

In the circuit shown in FIG. 24, when the read operation is performed in the PORT1 and the PORT2 for the same address, the PORT2 performs the read operation as usual. On the other hand, the PORT1 receives the read data of the PORT2 through a multiplexer 621, stops a column select driver 622 for the PORT1 by an address transition detection signal ATRR, and inhibits activation of a read amplifier 623 for the PORT1. The address transition detection signal ATRR can be generated by the detection circuit 130f shown in FIG. 21. An address transition detection signal ATRRD is a signal obtained by delaying the address transition detection signal ATRR until the read amplifier's amplification timing.

Because write in the array is delayed by the read amplifier's timing wait time in this operation, operations become difficult with respect to the spec tDPL(tWR) that determines the time when a pre-charge command can be inputted after a write command like the ninth embodiment.

An eleventh embodiment of the present invention is described next.

The eleventh embodiment provides an example of applying the present invention to a PRAM. The PRAM is a semiconductor memory device using phase change materials for memory cells and stores information in a non-volatile manner depending on whether the phase change material is in a crystalline state (a set state) or in an amorphous state (a reset state). When the phase change material is controlled precisely so as to be in the intermediate state between the crystalline state and the amorphous state, more than binary of information can be recorded in a memory cell. Because such a multi-bit PRAM requires the control of the phase change material with high precision, it is desirable in any data writes that reset write (amorphizing) is performed once and set write (crystallizing) is then performed.

When such control is performed, in response to one write request, the write operation needs to be performed twice. Thus, the second write operation according to the first write request collides with the read operation in the next cycle during the write-to-read operation. Also in the write-to-write operation, the second write operation according to the first write request collides with the first write operation in the next cycle. The eleventh embodiment solves these problems. That is, the eleventh embodiment handles the write-to-write operation in addition to measures for the write-to-read operation shown in FIG. 1 according to the first embodiment. Specifically, a circuit is configured as follows. As described above, the first embodiment provides the memory core that avoids the collision of the write operation and the read operation. Because the read operation collides with the second write operation according to the write request in the eleventh embodiment, the second write operation according to the write request is assigned to the write path. Because the first write operation according to the write request does not collide with the read operation in the next cycle, the read path can be used for both operations. A write operation function is provided for the read path and the read line is changed into the I/O. Thus, the problem about the write-to-read operation can be solved. With respect to the write operation, a path for the first write operation is added to the read path of the first embodiment and a path for the second write operation is the write path of the first embodiment. The paths are thus separated and the problem about the write-to-write operation can also be solved.

Figure 25:
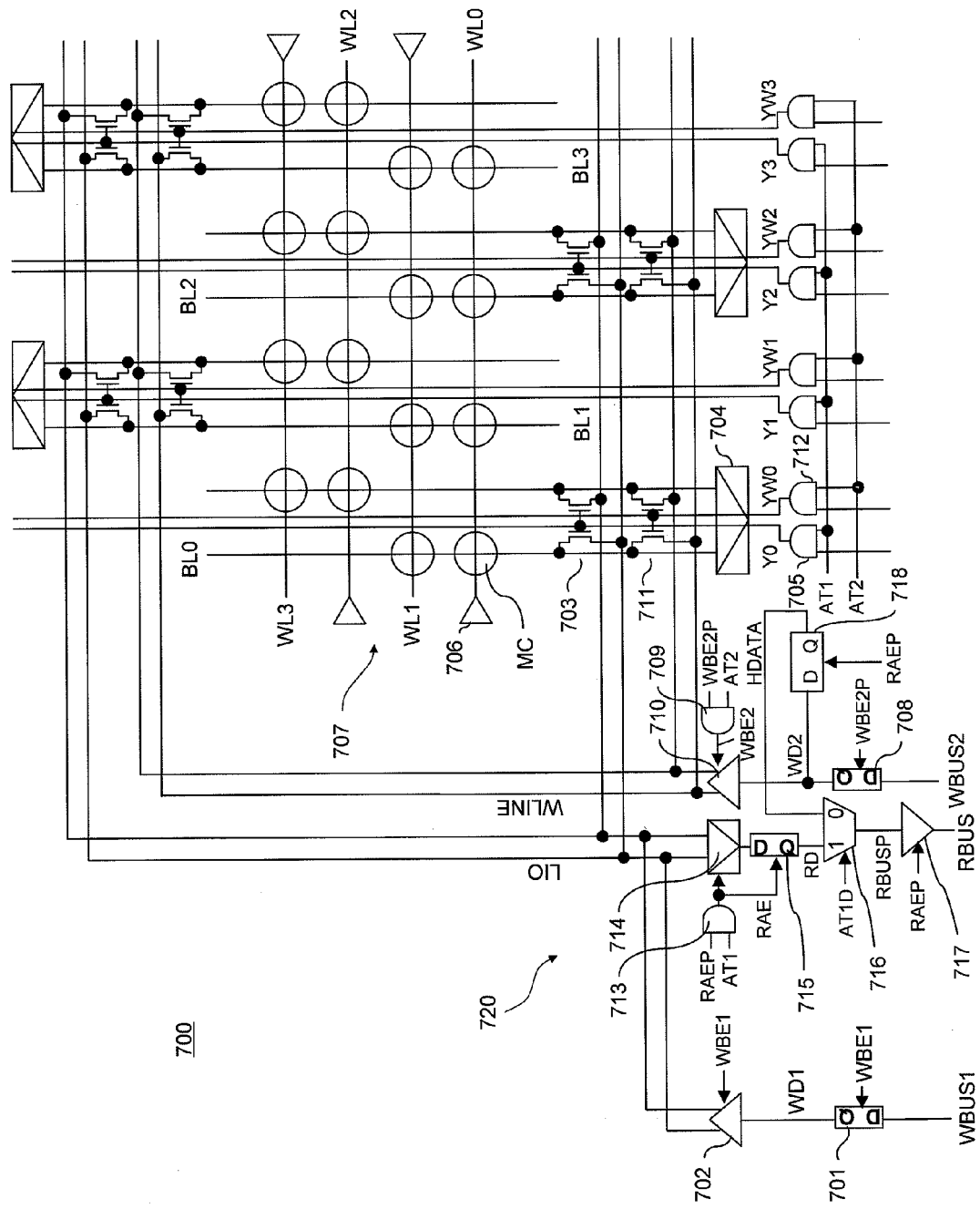
FIG. 25 is a circuit diagram showing a configuration of principal parts of a semiconductor memory device 700 according to the eleventh embodiment.

FIG. 25 is a circuit diagram showing a configuration of principal parts of a semiconductor memory device 700 according to the eleventh embodiment. Although not particularly limited, the semiconductor memory device 700 according to the eleventh embodiment is a PRAM.

As shown in FIG. 25, the semiconductor memory device 700 according to the eleventh embodiment includes a memory cell array 707 that includes the word lines WL0, WL1, ..., the bit line pairs BL0, BL1, ..., and the memory cells MC arranged at intersections of the word lines with the bit lines. Sense amplifiers 704 are connected to each of the bit line pairs BL0, BL1, .... Each of the sense amplifiers 704 is connected via a corresponding column switch 703 to the I/O line LIO and via a corresponding column switch 711 to the data line WLINE for write. Column select signals Y0, Y1, ... serving as outputs of column select drivers 705 are supplied to the respective column switches 703 and any one of the switches is turned on during the read operation or the write operation. Meanwhile, column select signals YW0, YW1, ... for write serving as outputs of column select drivers 712 for write are supplied to the respective column switches 711 and any one of the switches is turned on during the write operation.

The I/O line LIO is a wiring for transmitting complementary read or write data and connected to an input/output circuit 720. The data line WLINE for write is a wiring for transmitting complementary write data and connected to the input/output circuit 720. The input/output circuit 720 includes a write buffer 702 that supplies write data WD1 supplied to the I/O line LIO through a write bus WBUS1, a write buffer 710 that supplies write data WD2 supplied through a write bus WBUS2 to the data line WLINE for write, and a read amplifier 714 that supplies the read data RD supplied to the read bus RBUS through the I/O line LIO.

The input/output circuit 720 further includes a register 718 that temporarily holds the write data WD2 and a multiplexer 716 that selects either the output of the read amplifier 714 or the output of the register 718. The selection of the multiplexer 716 is controlled by an output of a detection circuit 730 shown in FIG. 26.

With reference to FIG. 25, there is described a write cycle and a read cycle when AT1="H", AT2="H", that is, in a normal case.

The write cycle is described first. In the write cycle, pre-write data is written in the write bus WBUS1, fetched into a hold circuit 701 at an activation timing of a signal WBE1, and supplied by the write buffer 702 to the I/O line LIO. The pre-write data is then supplied via the column switch 703 selected by the column select driver 705 to the bit line pair BL0. The bit line pair, BL0 is driven by the sense amplifier 704 to write in memory cells MC selected by a word driver 706. When write in the memory cells MC is completed, the write data is written in the write bus WBUS2, fetched into a hold circuit 708 at an activation timing of a signal WBE2, and supplied by the write buffer 710 to the data line WLINE for write. The write data is then supplied via the column switch 711 selected by the column select driver 712 to the bit line pair BL0. The bit line pair BL0 is driven by the sense amplifier 704 to write again in the memory cells MC selected by the word driver 706.

The read cycle is described next. The read cycle is the same as the normal read operation. That is, the column switch 703 is selected by the column select driver 705 and the read data held by the sense amplifier 704 is read to the I/O line LIO. The read data is amplified by the read amplifier 714 at the activation timing of the activation signal RAEP and held by a hold circuit 715. Further, the read data is read through the multiplexer 716 to the signal line RBUSP and outputted to the read bus RBUS by a tri-state buffer 717. The register 718 and the multiplexer 716 function as the register 115 and the multiplexer 111 shown in FIG. 1.

Figure 26:
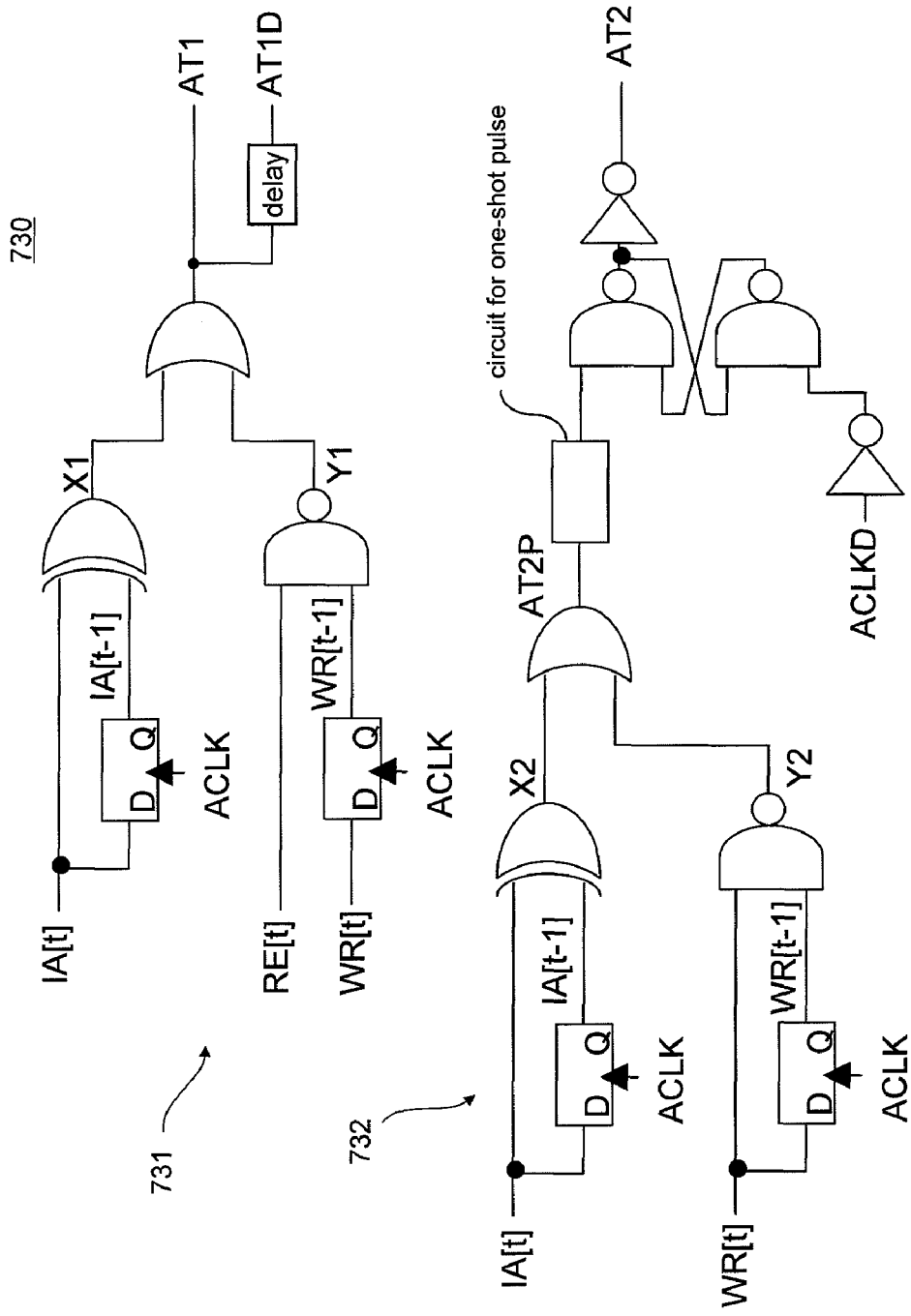
FIG. 26 is a circuit diagram of a detection circuit 730.

The above operation is the operation when the address transition detection signals AT1="H", AT2="H", that is, in a normal case. As shown in FIG. 26, the address transition detection signal AT1 is generated by a detection circuit 731 and becomes "L" when the write-to-read operation is performed and the address does not transit. That is, this circuit part is the same as the detection circuit 130 shown in FIG. 2. When AT1 becomes the L level, during the write-to-read operation for the same address, an operation is activated that with respect to the write operation and the read operation performed at the same time, the memory cell array 707 stops the read operation and performs only the write operation and a peripheral circuit returns data used for the write operation as it is as read data.

Further, the address transition detection signal AT2 is generated by a detection circuit 732, becomes "L" when the write-to-read operation is performed and the address does not transit, and is reset to "H" in the next cycle. When AT2 becomes the L level, during the write-to-write operation for the same address, an operation is activated that with respect to two simultaneous write operations, the earlier write operation is stopped and only the subsequent write operation is performed. The reason why reset by a signal ACLKD is required when generating the address transition detection signal AT2 will become clear from the following descriptions.

Operation timings in the write-to-write operation when addresses are different from each other and when the address are the same are described below with reference to a timing chart. For simplicity, descriptions are made by exemplifying an array control clock ACLK and a clock ACLKD obtained by delaying the array control clock ACLK by a pre-write operation time d.

Figure 27:
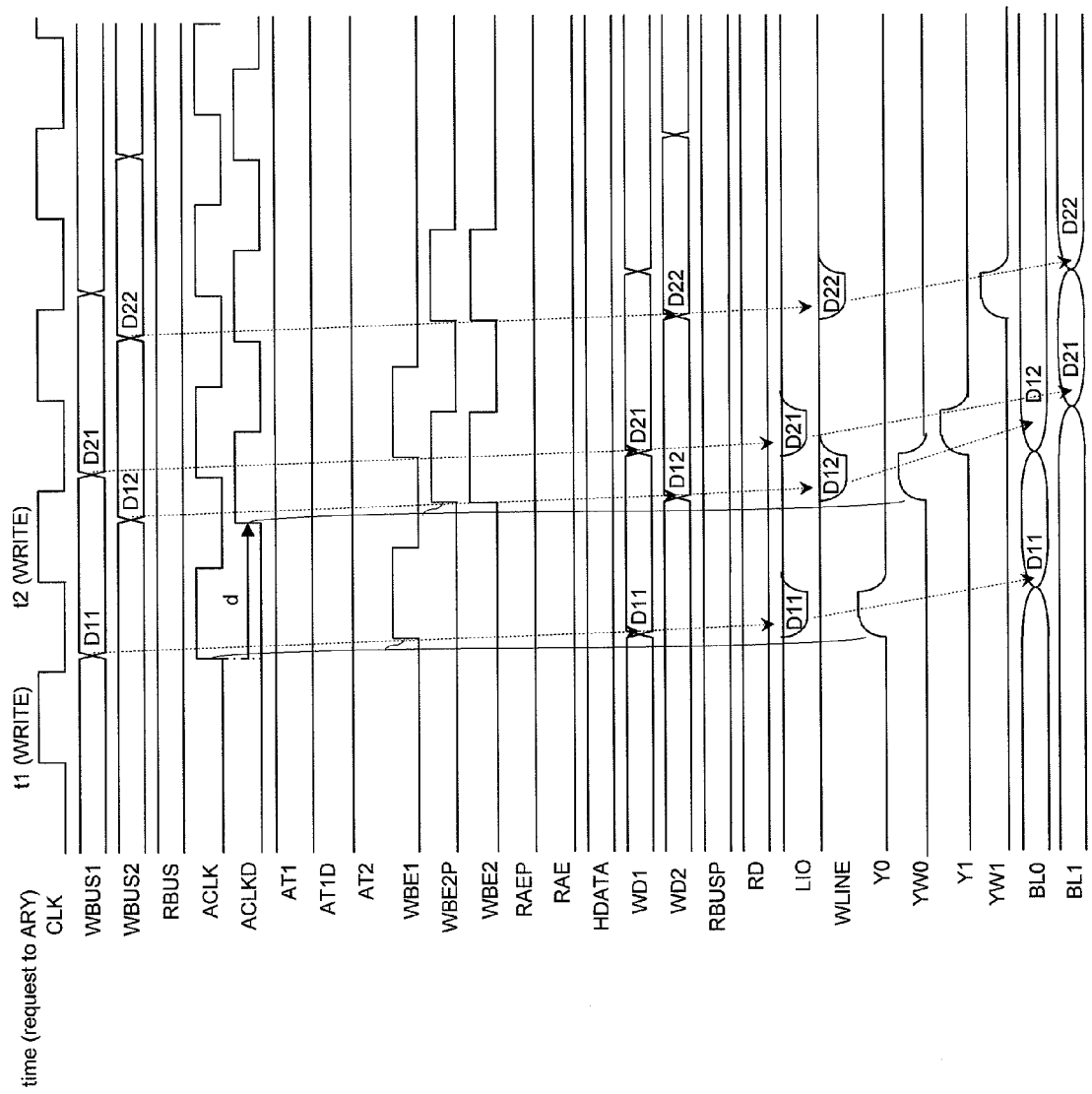
FIG. 27 is a timing diagram showing an operation timing when the write operation is successively requested for different addresses (write-to-write operation) according to the eleventh embodiment.

FIG. 27 is a timing diagram showing an operation timing when the write operation is successively requested for different addresses (write-to-write operation).

First, when the address corresponding to the bit line pair BL0 is specified and a write request is issued at the time t1, pre-write data D11 is supplied to the write bus WBUS1. The pre-write data D11 is then fetched into the hold circuit 701 by the signal WBE1 in synchronization with the array control clock ACLK and supplied to the I/O line LIO by the write buffer 702. Thereafter, the activation of the column select signal Y0 supplies the pre-write data D11 to the bit line pair BL0. Write data D12 is then supplied to the write bus WBUS2 with a delay of the pre-write operation time d. The write data D12 is fetched into the hold circuit 708 by a signal WBE2P in synchronization with the clock ACLKD delayed with respect to the array control clock ACLK by the pre-write operation time d and supplied to the data line WLINE for write by the write buffer 710. Thereafter, the activation of the column select signal YW0 supplies the write data D12 to the bit line pair BL0. In this way, pre-write and write are performed in this order upon predetermined memory cells connected to the bit line pair BL0.

Meanwhile, when the address corresponding to the bit line pair BL1 is specified and a write request is issued at the time t2, pre-write data D21 is supplied to the write bus WBUS1. The pre-write data D21 is then fetched into the hold circuit 701 by the signal WBE1 in synchronization with the array control clock ACLK and supplied to the I/O line LIO by the write buffer 702. Thereafter, the activation of the column select signal Y1 supplies the pre-write data D21 to the bit line pair BL1. Write data D22 is then supplied to the write bus WBUS2 with a delay of the pre-write operation time d. The write data D22 is fetched into the hold circuit 708 by the signal WBE2P in synchronization with the clock ACLKD delayed with respect to the array control clock ACLK by the pre-write operation time d and supplied to the data line WLINE for write by the write buffer 710. The activation of the column select signal YW1 supplies the write data D22 to the bit line pair BL1. In this way, pre-write and write are performed in this order upon predetermined memory cells connected to the bit line pair BL1.

The write operation for the data D12 requested at the time t1 and the pre-write operation for the data D21 requested at the time t2 are performed at the same time. Because the signal paths are separated perfectly as shown in FIG. 27, any data collision does not occur.

Figure 28:
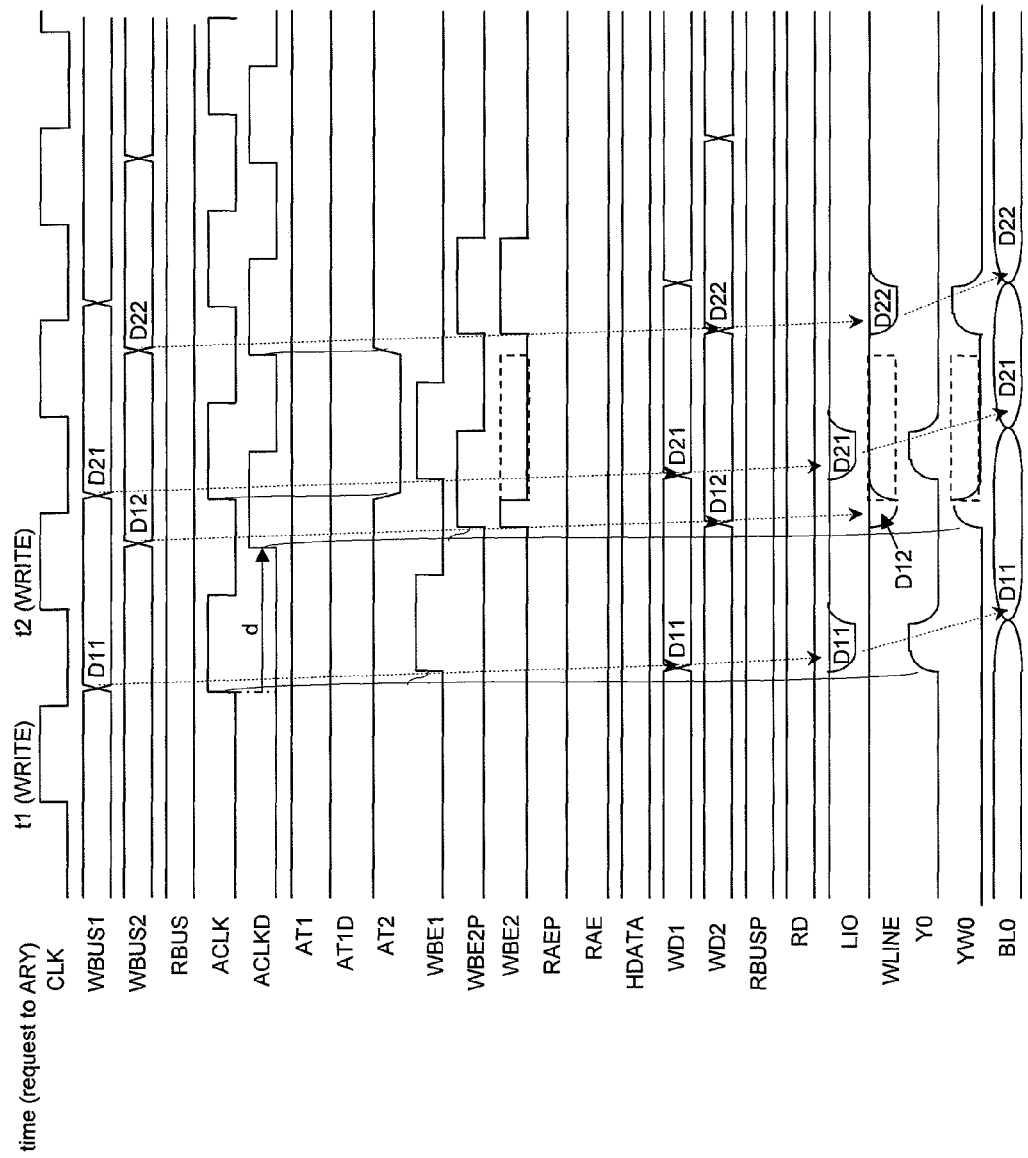
FIG. 28 is a timing diagram showing an operation timing when the write operation is successively requested for the same address (write-to-write operation) according to the eleventh embodiment.

FIG. 28 is a timing diagram showing an operation timing when the write operation is successively requested for the same address (write-to-write operation).

First, when the address corresponding to the bit line pair BL0 is specified and a write request is issued at the time t1, the pre-write data D11 is supplied to the write bus WBUS1. The pre-write data D11 is then fetched into the hold circuit 701 by the signal WBE1 in synchronization with the array control clock ACLK and supplied to the I/O line LIO by the write buffer 702. Thereafter, the activation of the column select signal Y0 supplies the pre-write data D11 to the bit line pair BL0. The write data D12 is then supplied to the write bus WBUS2 with a delay of the pre-write operation time d. The write data D12 is fetched into the hold circuit 708 by the signal WBE2P in synchronization with the clock ACLKD delayed with respect to the array control clock ACLK by the pre-write operation time d and supplied to the data line WLINE for write by the write buffer 710. Because the address corresponding to the bit line pair BL0 is specified and a write request is issued also at the time t2, the operation in the next cycle interrupts during the write described above.

That is, when the address corresponding to the bit line pair BL0 is specified and a write request is issued at the time t2, pre-write data D21 is supplied to the write bus WBUS1. The pre-write data D21 is then fetched into the hold circuit 701 by the signal WBE1 in synchronization with the array control clock ACLK and supplied to the I/O line LIO by the write buffer 702. At this time, the write data D12 in the write cycle requested at the time t1 is being written in the data line WLINE for write. However, because the data D12 is to be overwritten by the pre-write data D21, it does not need to be written. Writing the write data D12 is stopped by the address transition detection signal AT2 and instead the pre-write data D21 is written in the I/O line LIO. Also in the subsequent activation operation of the column select signal, the activation of the column select signal YW0 is inhibited by using the address transition detection signal AT2 and the column select signal Y0 is activated instead. In this way, a collision of different write data on the bit line pair BL0 is avoided.

Next, the write data D22 is written in the write bus WBUS2 with a delay of the time d and fetched into the hold circuit 708 by the signal WBE2P in synchronization with the clock ACLKD. The held write data D22 is then supplied to the data line WLINE for write. However, when the address transition detection signal AT2 is caused to be in synchronization with only the array control clock ACLK, the address transition detection signal AT2 that becomes the L level is superimposed over the signal WBE2P at an H level at the time t2, which affects write in the data line WLINE for write. The address transition detection signal AT2 is thus reset using the clock ACLKD. Write in the data line WLINE for write is performed by the signal WBE2P and write in the bit line pair BL0 is performed by the column select signal YW0 in synchronization with the clock ACLKD.

As described above, in the write-to-write operation, the operations for different addresses and the operations for the same address can be performed without any data collision.

Next, there is described a write-to-write-to-read operation for the same address, which is the most complicated operation.

Figure 29:
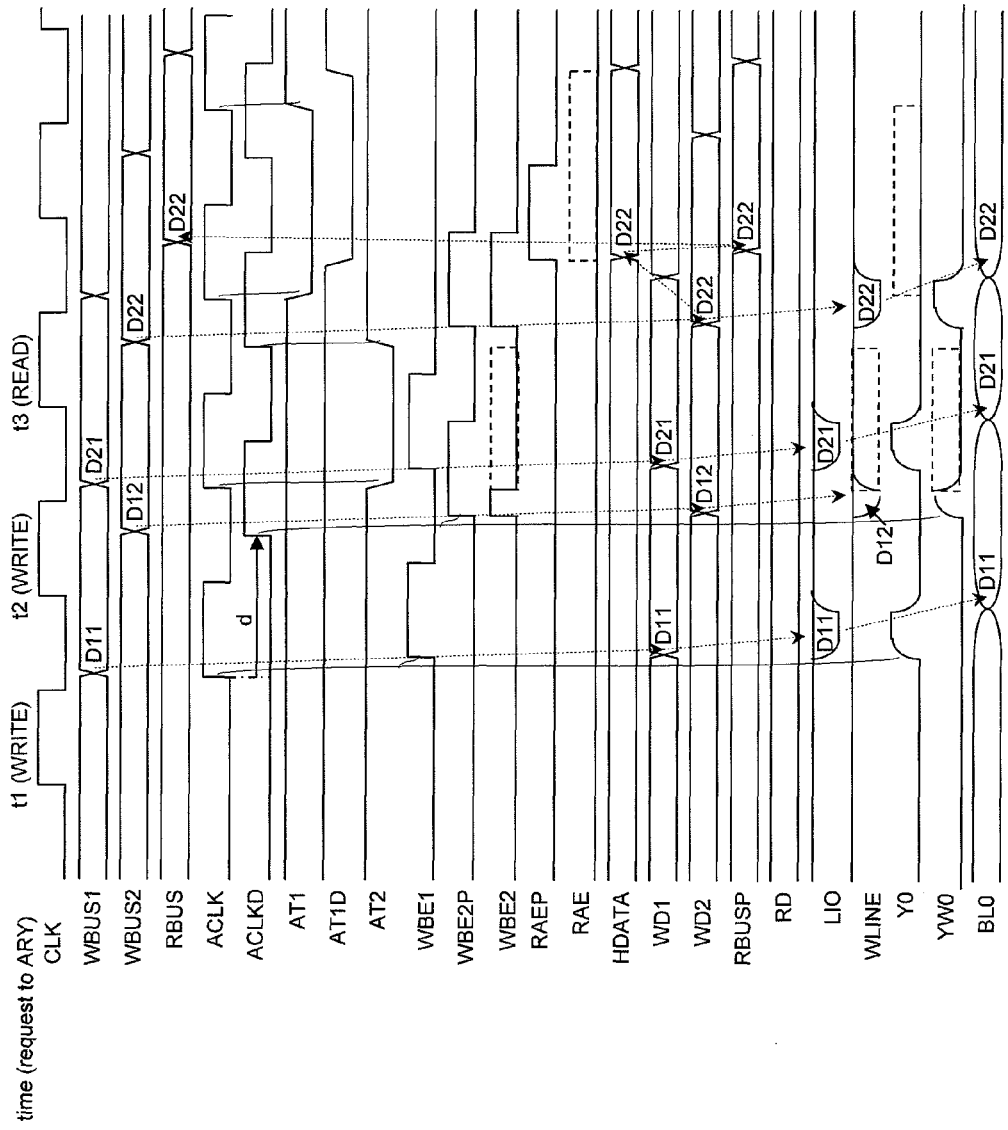
FIG. 29 is a timing diagram showing the write-to-write-to-read operation for the same address according to the eleventh embodiment.

FIG. 29 is a timing diagram showing the write-to-write-to-read operation for the same address.

First, when the address corresponding to the bit line pair BL0 is specified and a write request is issued at the time t1, the pre-write data D11 is supplied to the write bus WBUS1. The pre-write data D11 is then fetched into the hold circuit 701 by the signal WBE1 in synchronization with the array control clock ACLK and supplied to the I/O line LIO by the write buffer 702. Thereafter, the activation of the column select signal Y0 supplies the pre-write data D11 to the bit line pair BL0. The write data D12 is then supplied to the write bus WBUS2 with a delay of the pre-write operation time d. The write data D12 is fetched into the hold circuit 708 by the signal WBE2P in synchronization with the clock ACLKD delayed with respect to the array control clock ACLK by the pre-write operation time d and supplied to the data line WLINE for write by the write buffer 710. Because the address corresponding to the bit line pair BL0 is specified and the write request is issued also at the time t2 in this example, the operation in the next cycle interrupts during the write described above.

That is, when the address corresponding to the bit line pair BL0 is specified and a write request is issued at the time t2, the pre-write data D21 is supplied to the write bus WBUS1. The pre-write data D21 is then fetched into the hold circuit 701 by the signal WBE1 in synchronization with the array control clock ACLK and supplied to the I/O line LIO by the write buffer 702. At this time, the write data D12 in the write cycle requested at the time t1 is being written in the data line WLINE for write. However, because the data D12 is to be overwritten by the pre-write data D21, it does not need to be written. Writing the write data D12 is stopped by the address transition detection signal AT2 and instead the pre-write data D21 is written in the I/O line LIO. Also in the subsequent activation operation of the column select signal, the activation of the column select signal YW0 is inhibited by using the address transition detection signal AT2 and the column select signal Y0 is activated instead.

The write data D22 is then written in the write bus WBUS2 with a delay of the time d and fetched into the hold circuit 708 by the signal WBE2P in synchronization with the clock ACLKD. In response to the address transition detection signal AT="H", the write data D22 is supplied to the data line WLINE for write and written in the bit line pair BL0 by the column select signal YW0.

Further, when the address corresponding to the bit line pair BL0 is specified and a read request is issued at the time t3, the column select signal Y0 is usually caused to rise in synchronization with the array control clock ACLK and data is read from the bit line pair BL0. Because the write data D22 is being written currently, the address transition detection signal AT1="L". The column select signal Y0 does not rise accordingly and only the write operation of the write data D22 continues in the bit line pair BL0. The activation signal RAEP then rises and read data is usually fetched into the hold circuit 715. As the address transition detection signal AT1="L", however, the read amplifier 714 and the hold circuit 715 are not operated. A signal on the signal line HDATA is selected instead by the multiplexer 716 and outputted to the signal line RBUSP. The signal is further outputted to the read bus RBUS by the tri-state buffer 717.

As described above, according to the eleventh embodiment, the write-to-write operation and the write-to-read operation can be performed correctly without rate-controlling the cycle time. Because the write operation is delayed by the pre-write operation in the eleventh embodiment, note that operations become difficult with respect to the spec tDPL accordingly.

While the write in the write bus WBUS2 is delayed with respect to the write in the write bus WBUS1 in the eleventh embodiment, these writes can be performed at the same time. When the data on the write bus WBUS2 is held for one cycle, the data can be fetched even though delayed by the time d.

A twelfth embodiment of the present invention is described next.

Figure 30:
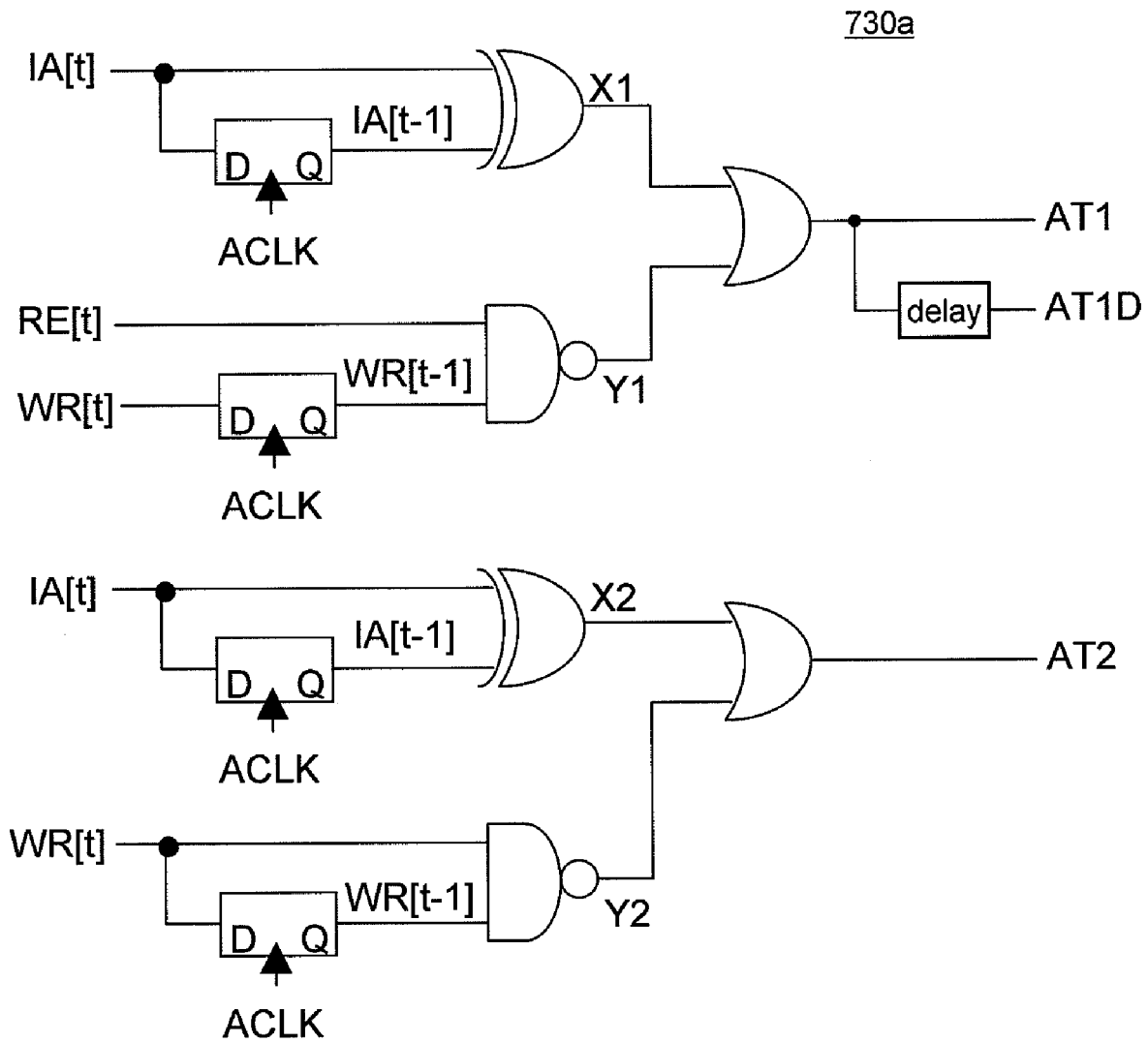

While the eleventh embodiment performs the write operation promptly after the pre-write operation in the write cycle, the twelfth embodiment performs the write operation and the pre-write operation in synchronization with the clock. That is, the twelfth embodiment handles the write-to-write operation in addition to measures for the write-to-read operation in the second embodiment. Because the clock ACLKD estimating the pre-write operation time does not exist, the address transition detection signal AT2 for the write-to-write operation is generated by a detection circuit 730a shown in FIG. 30. The detection circuit 730a shown in FIG. 30 has a circuit configuration obtained by omitting SR-FF from the detection circuit 730 shown in FIG. 26. The circuit part that generates the address transition detection signal AT1 for the write-to-read operation is unchanged.

Figure 31:
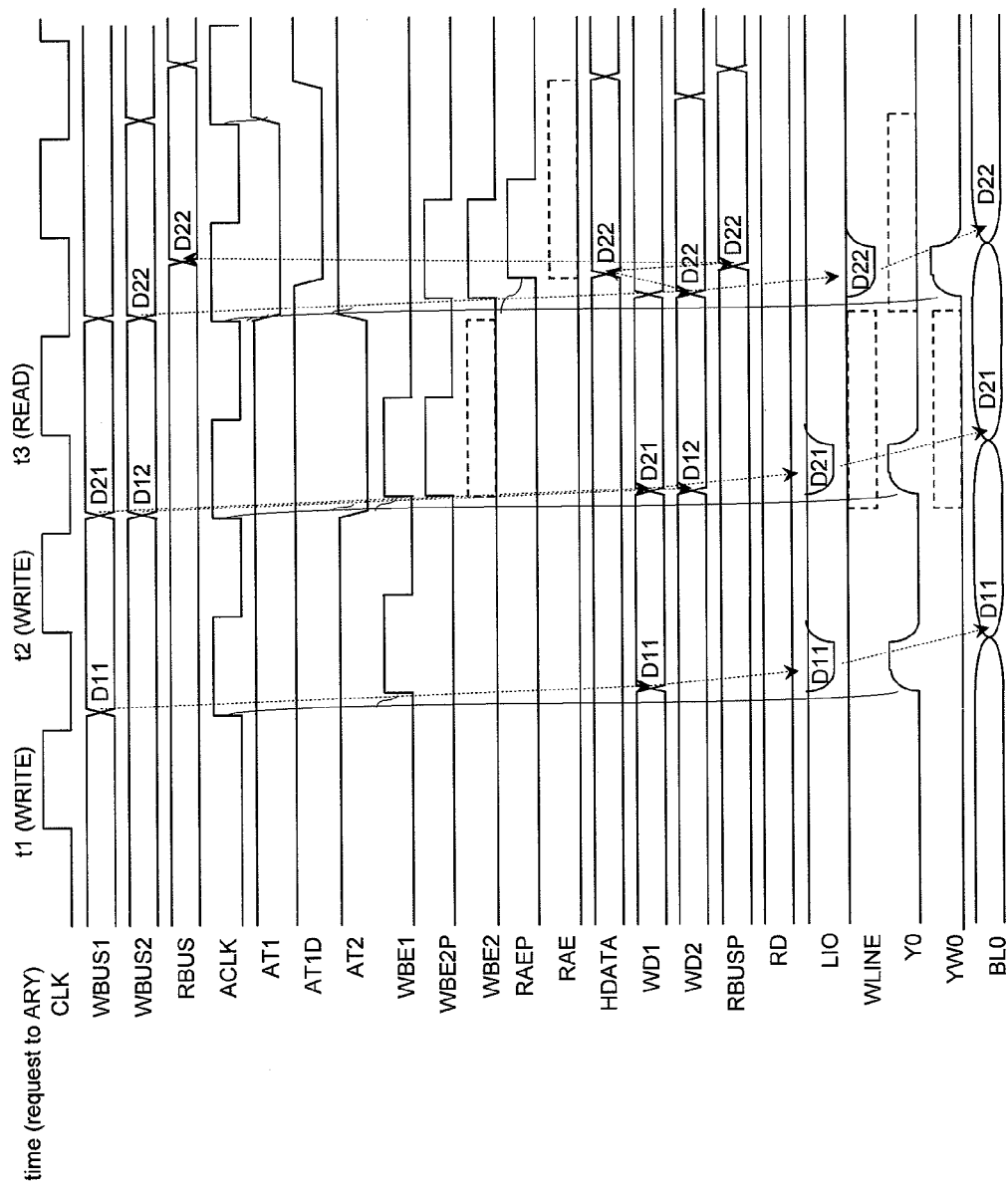
FIG. 31 is a timing diagram showing the write-to-write-to-read operation for the same address according to the twelfth embodiment.

FIG. 31 is a timing diagram showing the write-to-write-to-read operation for the same address.

First, when the address corresponding to the bit line pair BL0 is specified and a write request is issued at the time t1, the pre-write data D11 is supplied to the write bus WBUS1. The pre-write data D11 is then fetched into the hold circuit 701 by the signal WBE1 in synchronization with the array control clock ACLK and supplied to the I/O line LIO by the write buffer 702. Thereafter, the activation of the column select signal Y0 supplies the pre-write data D11 to the bit line pair BL0. The write data D12 is then fetched into the hold circuit 708 by the signal WBE2P in synchronization with the time t2. While write in the data line WLINE for write is tried to be performed by the signal WBE2P in synchronization with the array control clock ACLK at the time t2, the signal WBE2 does not rise at all because the address transition detection signal AT="L" and thus the write in the data line WLINE for write is not performed. The column select signal YW0 does not rise either.

When the address corresponding to the bit line pair BL0 is specified and a write request is issued at the time t2, the pre-write data D21 is supplied to the write bus WBUS1. The pre-write data D21 is then fetched into the hold circuit 701 by the signal WBE1 in synchronization with the array control clock ACLK and supplied to the I/O line LIO by the write buffer 702. At this time, the write cycle at the time t1 when the operations are overlapped stops because AT2="L". Accordingly, any data collision does not occur. While the operation being performed is made to stop in the eleventh embodiment, the twelfth embodiment does not perform the operation at all, which also suppresses the consumption current.

The write data D22 is then written in the write bus WBUS2 in synchronization with the time t3 and fetched into the hold circuit 708 by the signal WBE2P in synchronization with the array control clock ACLK at the time t3. In response to the address transition detection signal AT="H", the write data D22 is supplied to the data line WLINE for write and written in the bit line pair BL0 by the column select signal YW0.

Further, when the address corresponding to the bit line pair BL0 is specified and a read request is issued at the time t3, the column select signal Y0 is usually caused to rise in synchronization with the array control clock ACLK and data is read from the bit line pair BL0. Because the write data D22 is being written currently, however, the address transition detection signal AT1="L". The column select signal Y0 does not rise and only the write operation of the write data D22 continues in the bit line pair BL0. The activation signal RAEP then rises and read data is usually fetched into the hold circuit 715. As the address transition detection signal AT1="L", however, the read amplifier 714 and the hold circuit 715 are not operated. A signal on the signal line HDATA is selected instead by the multiplexer 716 and outputted to the signal line RBUSP. The signal is further outputted to the read bus RBUS by the tri-state buffer 717.

As described above, according to the twelfth embodiment, the write-to-write operation and the write-to-read operation can be performed without rate-controlling the cycle time and without generating any data collision. Because the write operation is delayed by one cycle in the twelfth embodiment, note that a latency of one cycle is required for tDPL.

While the write in the write bus WBUS2 is delayed with respect to the write in the write bus WBUS1 in the twelfth embodiment, this process is essential in the twelfth embodiment. When the data on the write bus WBUS2 and the data on the write bus WBUS1 are supplied at the same time, either write needs to be delayed by one cycle by a shift register.

A thirteenth embodiment of the present invention is described next.

According to recent DRAMs, a predetermined latency can be added to the period from when a write command is inputted to when the write operation upon an array is started. For example, according to DDR DRAMs, DQS starts to be inputted in the current cycle, data is fetched in synchronization with DQS in the next cycle, and the data is provided in synchronization with CLK in the cycle after the next cycle. Two cycles of the latency are thus provided. When a calculation is completed within the two cycles and the write operation is performed in the regular latency, the spec tDPL(tWR) is not violated. The thirteenth embodiment provides an example applying the configuration described in the twelfth embodiment one cycle earlier.

FIGS. 32A, 32B, and 32C are explanatory diagrams of operation timings in the thirteenth embodiment, where FIG. 32A shows a single write operation, FIG. 32B shows a write-to-read operation, and FIG. 32C shows a write-to-write operation. Because the data of the preceding write cannot be received externally in the thirteenth embodiment, assume that the data is determined in advance before the write operation.

In the write operation shown in FIG. 32A, with respect to a write command issued at the time t1, the regular write request upon the array is started at the time t3. Actually, pre-write is performed at the time t2 and write is performed at the time t3.

In the write-to-read operation shown in FIG. 32B, with respect to a write command issued at the time t1, the pre-write is performed at the time t2 and the write is performed at the time t3. A read command is then issued at the time t4 and the read operation is performed.

In the write-to-write operation shown in FIG. 32C, with respect to a write command issued at the time t1, the pre-write is performed at the time t2 and the write is performed at the time t3. With respect to a write command issued at the time t2, the pre-write is performed at the time t3 and the write is performed at the time t4. Only the write operation is performed at the time t2, two write operations are performed at the time t3 at the same time, and only the write operation is performed at the time t4.

Figure 33:
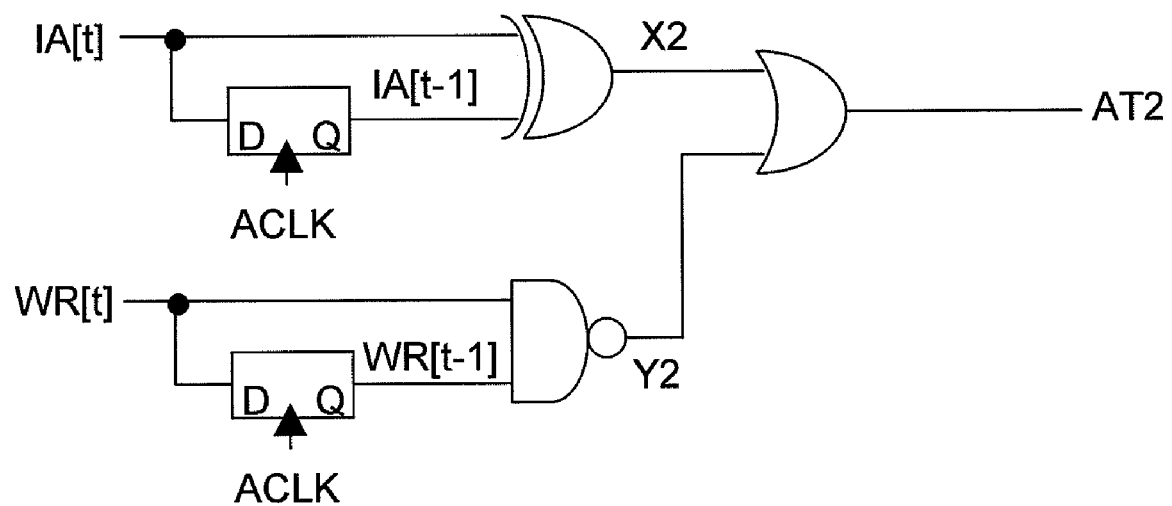
FIG. 33 is a circuit diagram of a detection circuit 730b.
Figure 46:
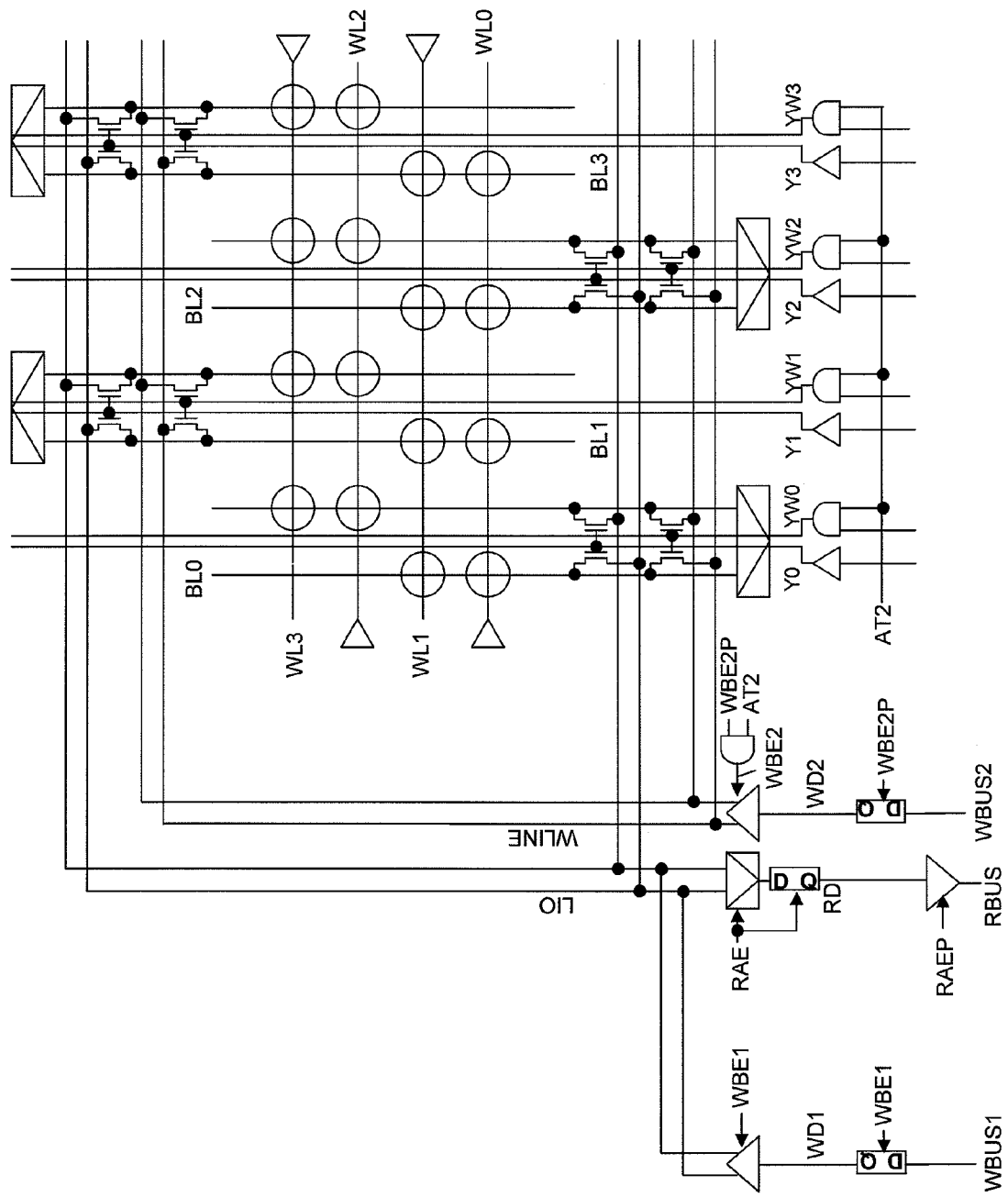
FIG. 46 shows a circuit configuration obtained by deleting the circuit that handles the write-to-read from the semiconductor memory device 700.

According to the thirteenth embodiment, while the operations do not overlap in the write-to-read operation, the operations overlap only in the write-to-write operation. A detection circuit 730b shown in FIG. 33 needs to be used as the circuit that generates address transition detection signal AT in the thirteenth embodiment. The detection circuit 730b shown in FIG. 33 has a configuration obtained by omitting the circuit that generates the address transition detection signal AT1 from the detection circuit 730a shown in FIG. 30. That is, it is sufficient to generate only the address transition detection signal AT2 for the write-to-write operation. A circuit configuration obtained by deleting the circuit that handles the write-to-read from the configuration shown in FIG. 25, such as the circuit configuration shown in FIG. 46 is provided. That is, only measures for the write-to-write operation will suffice, and it is important that data paths for two kinds of write operations are separated from each other.

A fourteenth embodiment of the present invention is described next.

The fourteenth embodiment relates to a multi-bit PRAM capable of storing binary or more information in a memory cell. The fourteenth embodiment is obtained by reconfiguring the eleventh embodiment for a PRAM. Data is usually written in PRAM memory cells by applying current pulses to the memory device as follows.

Figure 34:
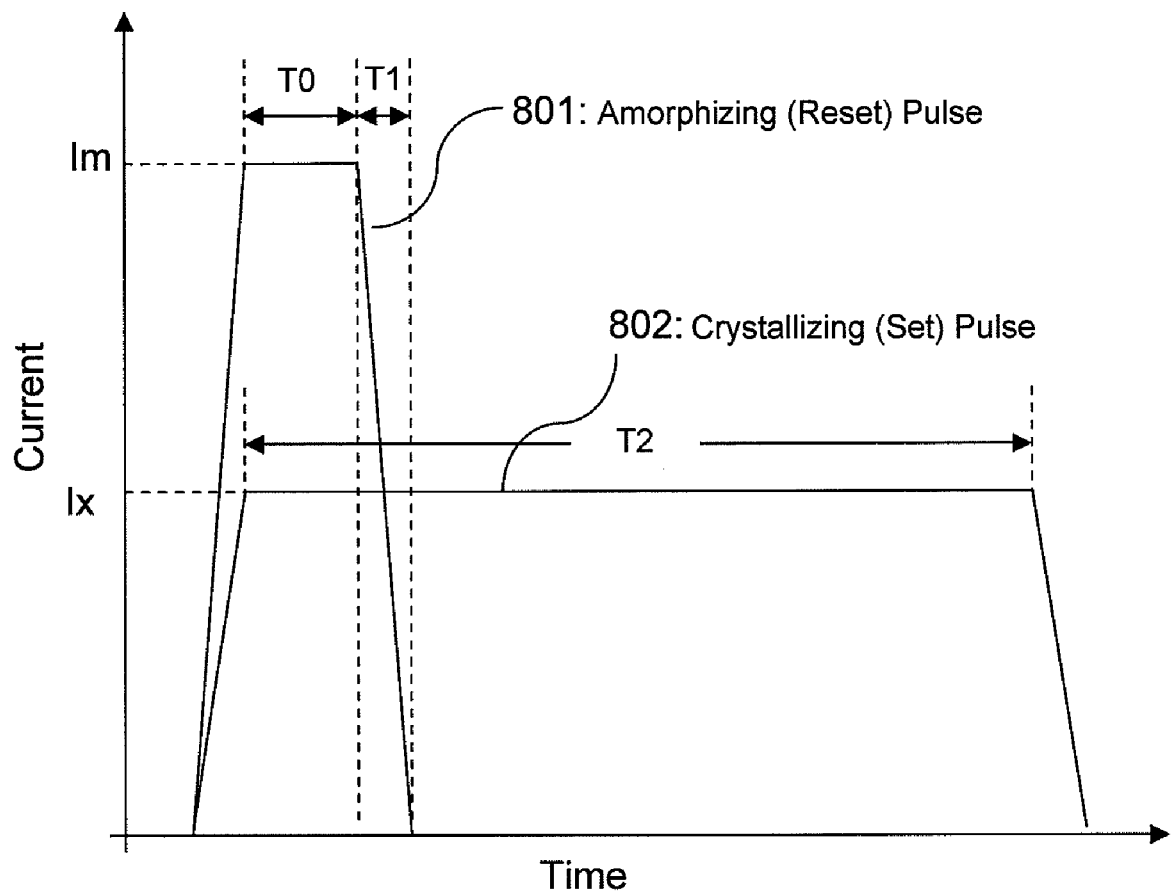
FIG. 34 is a waveform diagram showing a pulse waveform when writing data to a PRAM memory cell.

As shown in FIG. 34, to shift to an amorphous state (a state of high resistance and high threshold), a reset pulse 801 that is a short pulse of a large current is applied. The reset pulse 801 is set to have a current Im so as to apply sufficient power to melt a crystal. The current Im continues to be applied for a melt time T0 and, when the crystal is melted, is caused to fall within a short fall time T1. The melted phase change material is thus cooled rapidly and a uniform amorphous state is provided. On the other hand, to shift to a crystalline state (a state of low resistance and low threshold), a set pulse 802 that is a long pulse of a smaller current is applied. The set pulse 802 continues to apply a current Ix that is sufficient for crystallization but does not melt the material for a crystallization time T2 to crystallize the material. These processes can control the memory device to be in the amorphous state or in the crystalline state. Precise adjustment of the pulses enables more precise control of crystal property.

Figure 35:
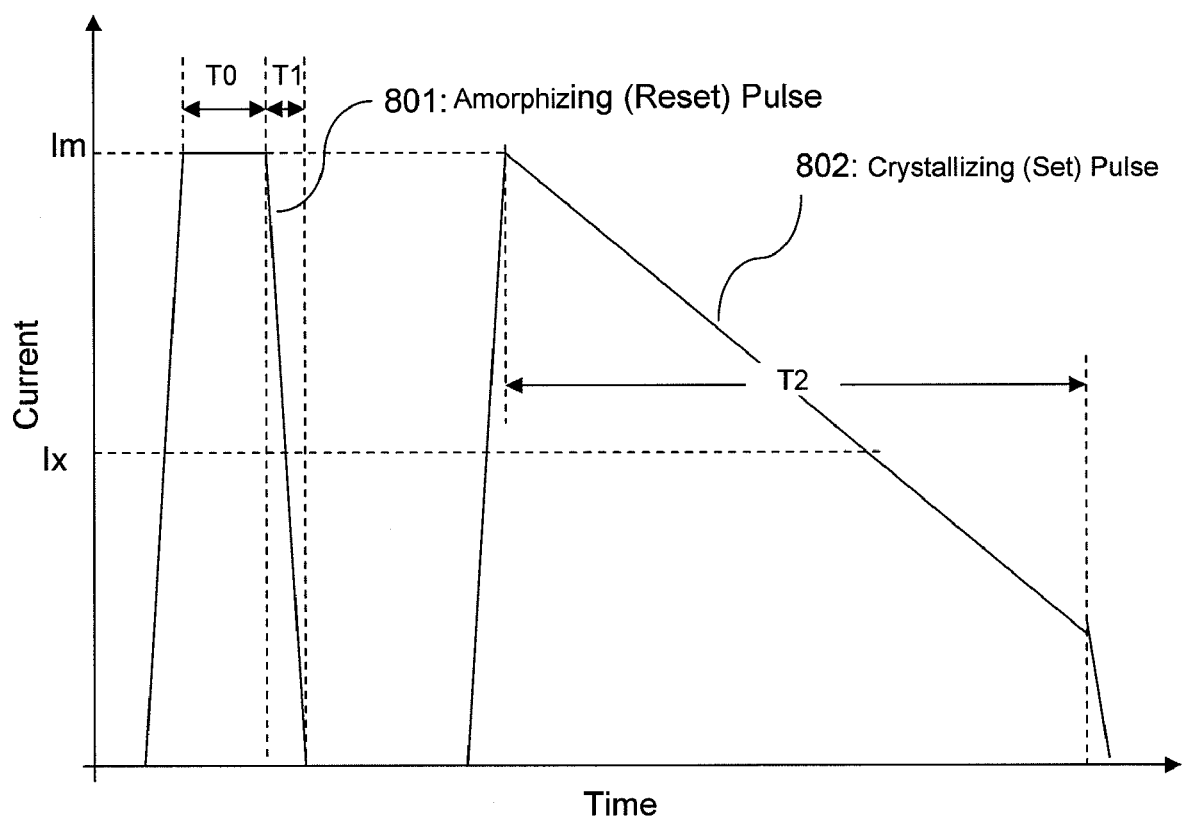
FIG. 35 is a waveform diagram showing one example of a pulse waveform when writing multi-bit data to a PRAM memory cell.

For example, as shown in FIG. 35, the device is once amorphized by the reset pulse 801 regardless of the logical level to be written. The set pulse 802 is then set to have a current value around the melting current Im and reduced gradually to a current value lower than the crystallizing current Ix. By controlling the time T2, the degree of crystallization can be adjusted.

Figure 36:
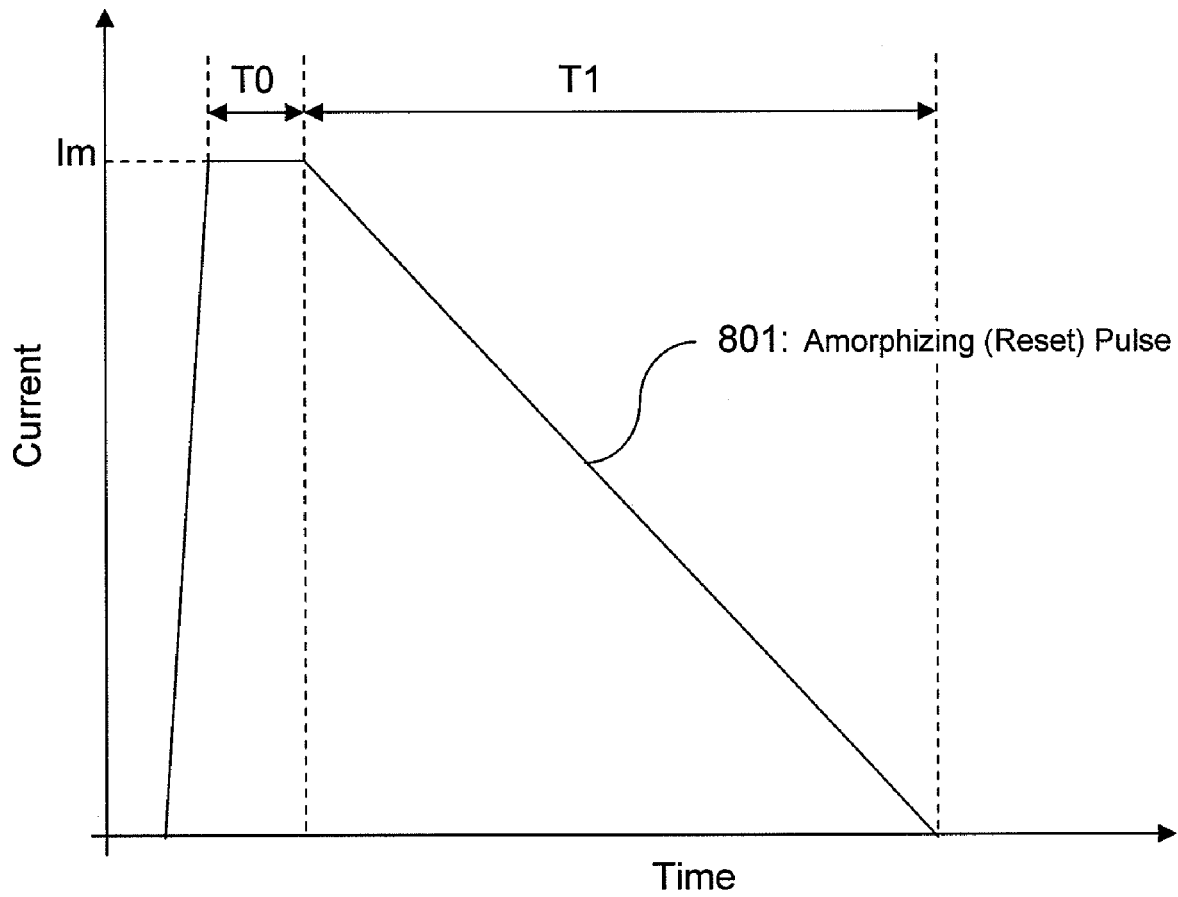
FIG. 36 is a waveform diagram showing another example of a pulse waveform when writing multi-bit data to a PRAM memory cell.

As shown in FIG. 36, only the reset pulse 801 is used and its fall time T1 is adjusted. As a result, the degree of crystallization is adjusted. In this case, as T1 is shortened, the amorphous state is provided. As T1 is extended, the degree of crystallization (the ratio of crystalline region to the entire amorphous region) is increased. A multi-bit device can be realized accordingly.

Figure 37:
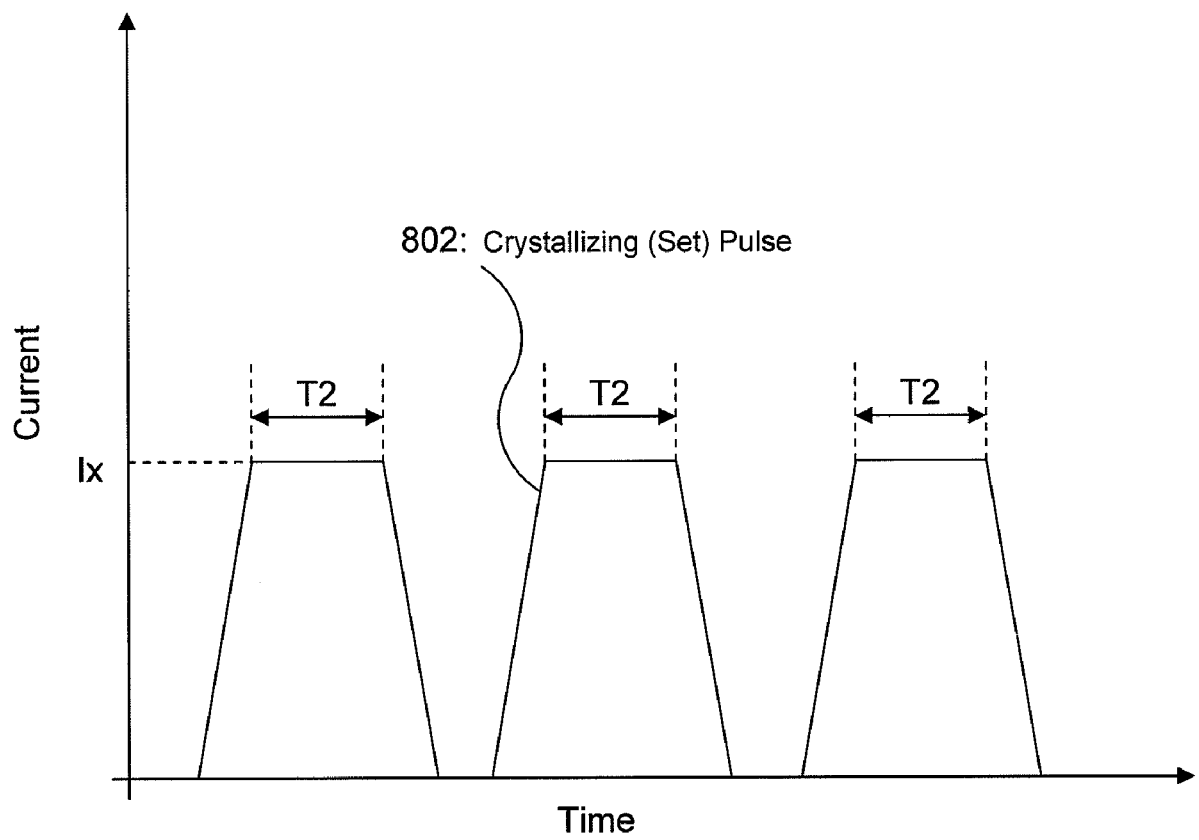
FIG. 37 is a waveform diagram showing still another example of a pulse waveform when writing multi-bit data to a PRAM memory cell.

As shown in FIG. 37, a pulse width T2 of the set pulse 802 is set to be shorter than a pulse width enabling perfect crystallization and a plurality of shortened ones are applied. As a result, the degree of crystallization can be adjusted and the multi-bit device can be realized. Although not shown, the device is desirably amorphized once by the reset pulse regardless of the logical level to be written.

Figure 38:
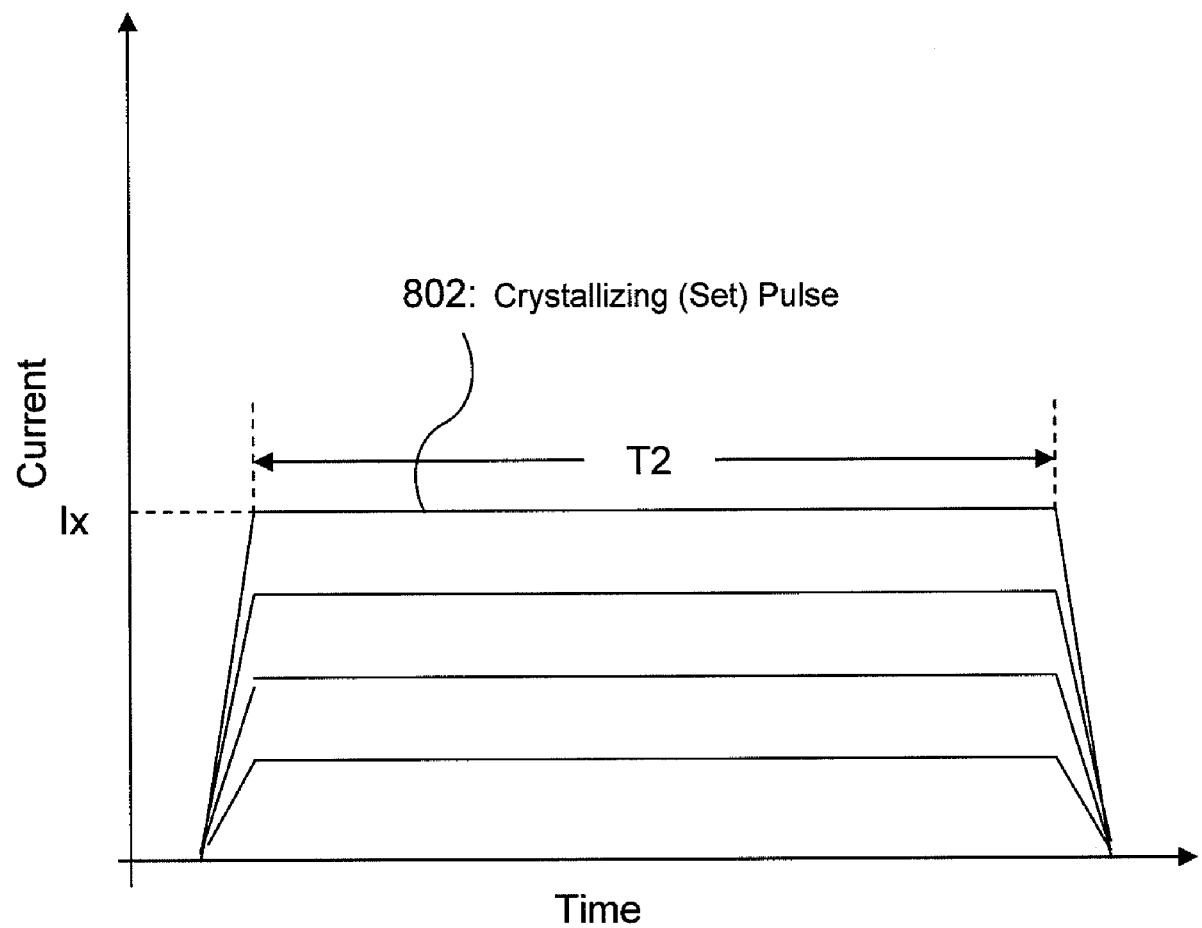
FIG. 38 is a waveform diagram showing still another example of a pulse waveform when writing multi-bit data to a PRAM memory cell.

As shown in FIG. 38, the degree of crystallization can be adjusted and the multi-bit device can be realized by controlling the current value of the set pulse 802. Although not shown, the device is desirably amorphized once by the reset pulse regardless of the logical level to be written.

Figure 39:
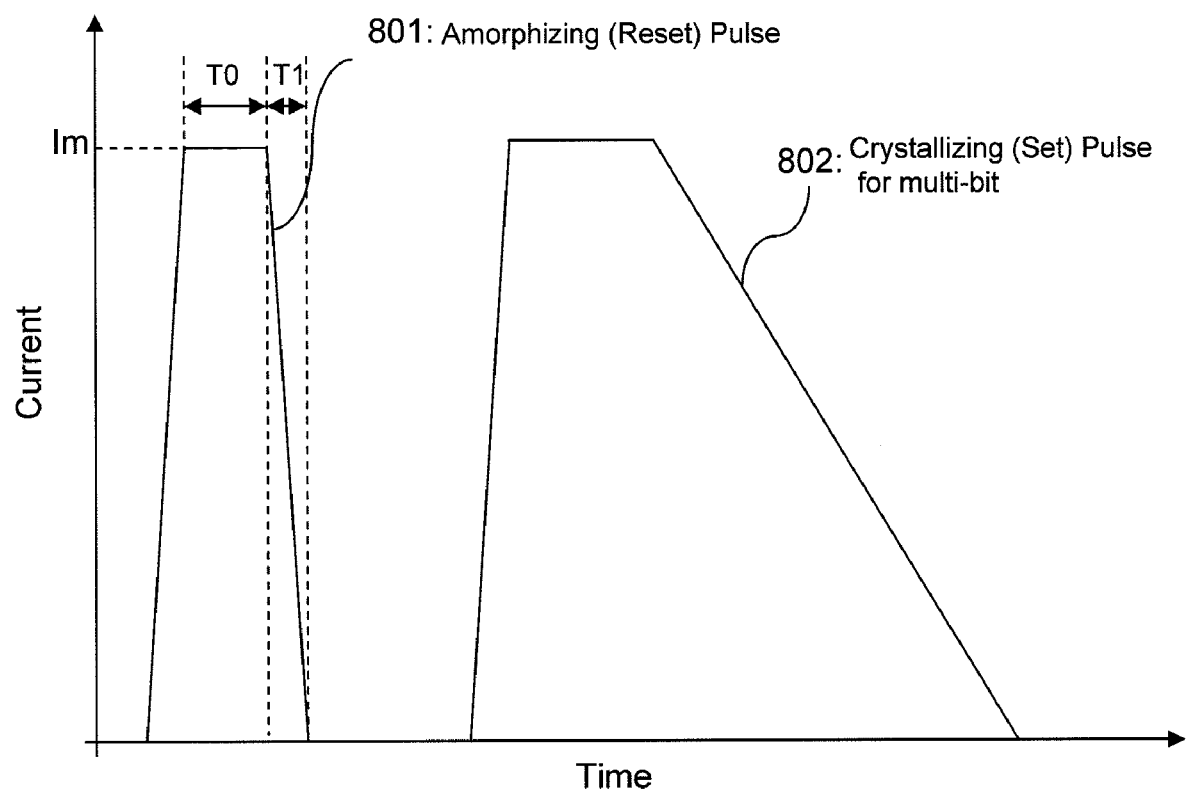
FIG. 39 is a waveform diagram showing still another example of a pulse waveform when writing multi-bit data to a PRAM memory cell.

As shown in FIG. 39, the device is amorphized by the reset pulse 801 regardless of the logical level to be written and multi-bit data is then set using the adjusted set pulse 802 for adjusting thresholds. The multi-bit data can be stored accurately regardless of the prior state.

Thus, when the eleventh embodiment is used to control the reset pulse 801 in the pre-write operation and the set pulse 802 in the subsequent write operation according to the methods shown in FIGS. 35 to 39, the multi-bit (including binary) PRAM can be probably configured without rate-controlling the cycle time. As the PRAM's write operation takes longer time than DRAMs, PRAMs are currently preferable "when tCK is large" or "when the cycle time of the array is larger than tCK because of a prefetch mechanism". When the write operation in a PRAM can be performed at the same speed as that of a DRAM, the PRAM can be processed by the same manner as DRAMs.

Figure 40:
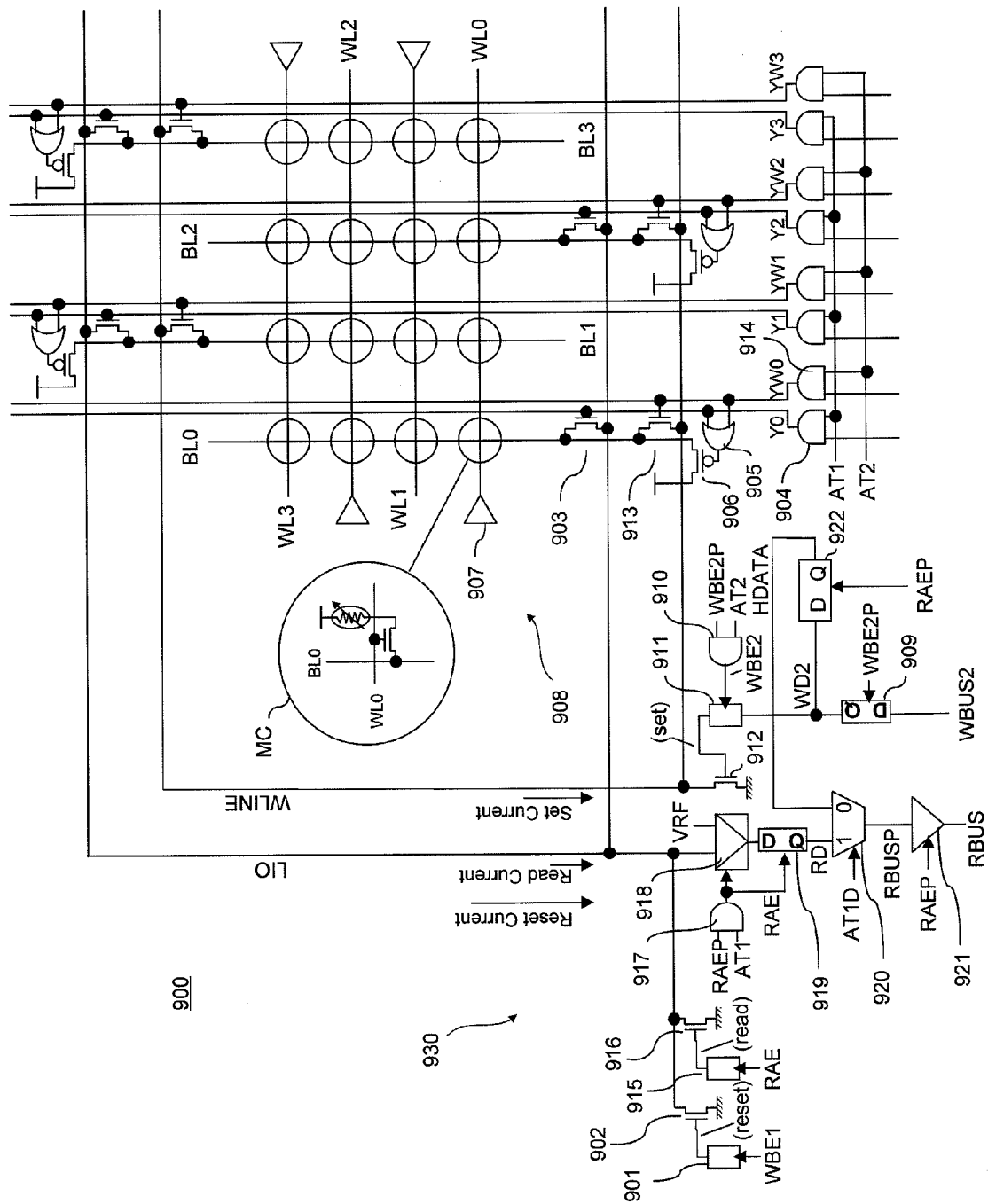
FIG. 40 is a circuit diagram showing a configuration of principal parts of a semiconductor memory device 900 according to the fourteenth embodiment.
Figure 41:
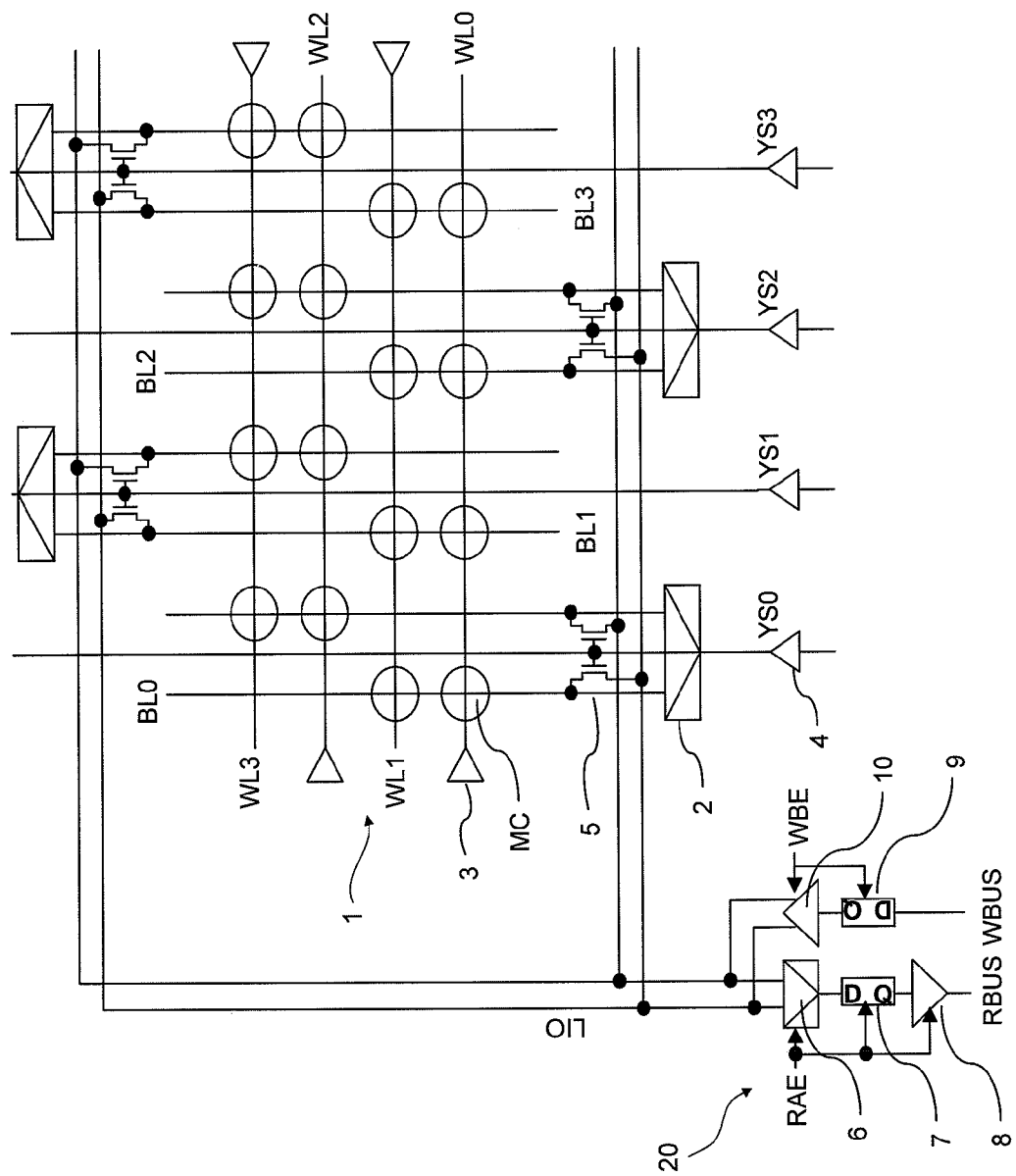
FIG. 41 is a circuit diagram showing a configuration of principal parts of a conventional DRAM.
Figure 42:
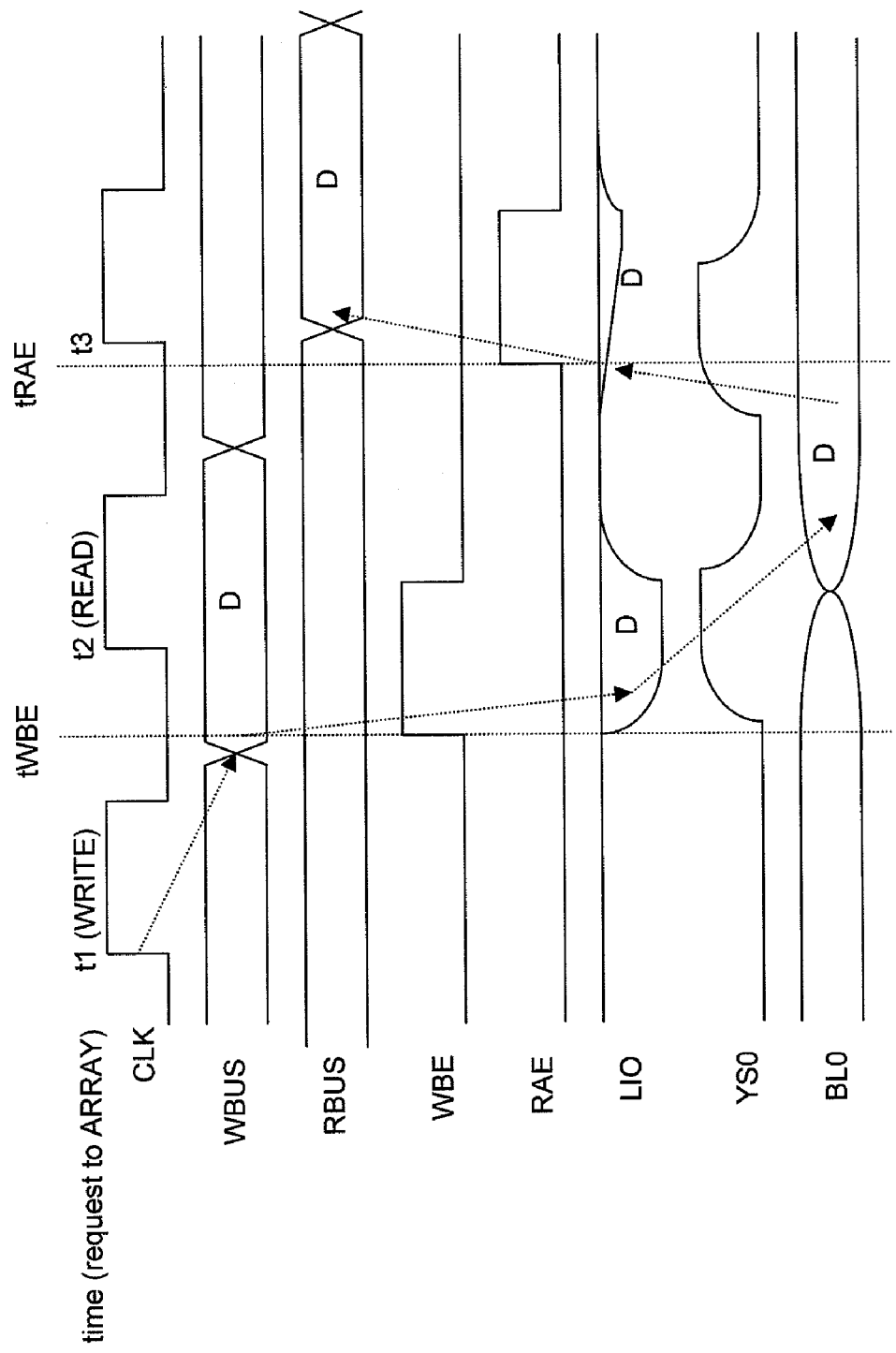
FIG. 42 is a timing diagram showing an operation timing when a write operation and a read operation are requested successively for the same address according to the conventional DRAM.
Figure 43:
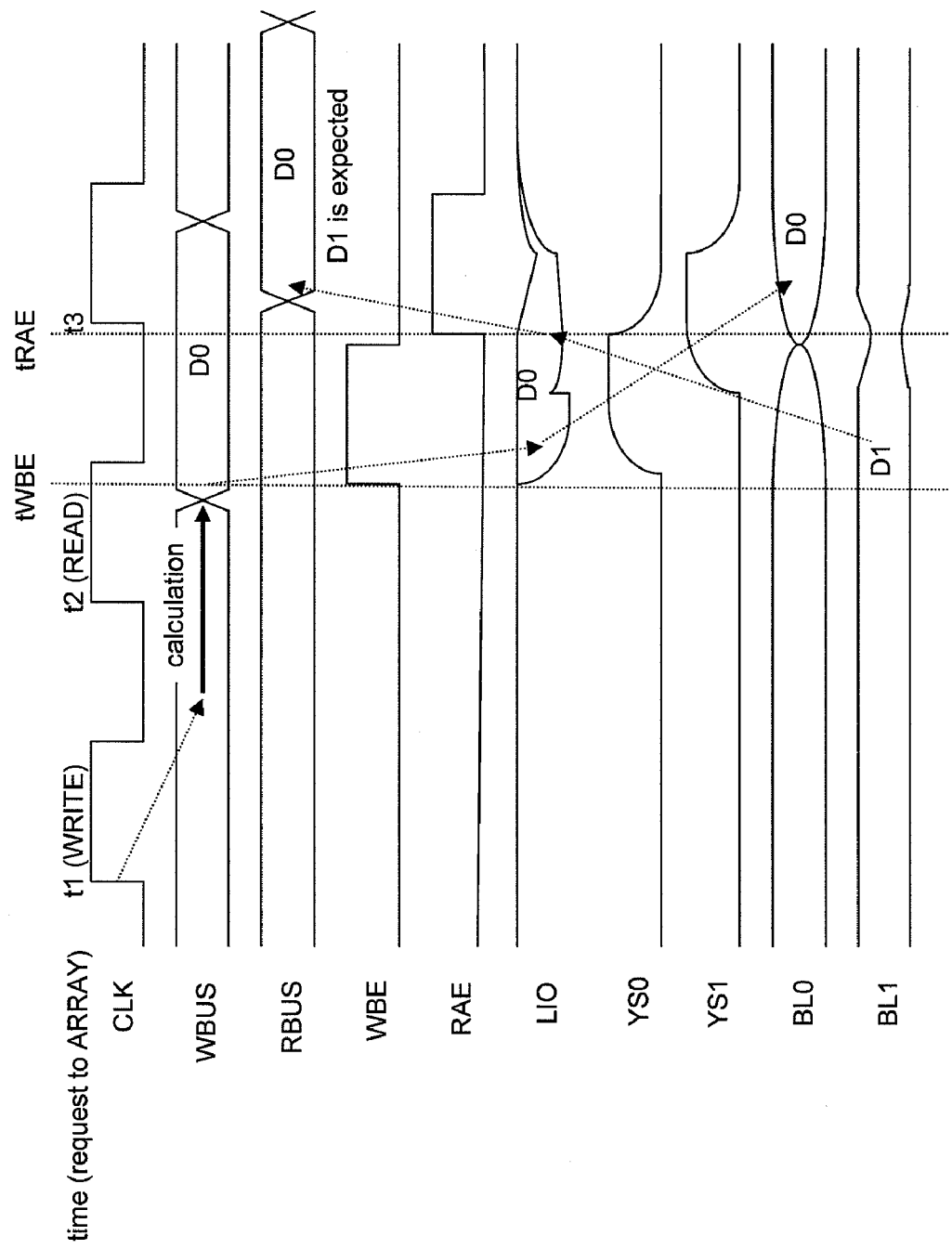
FIG. 43 is a timing diagram showing an operation timing when the write operation and the read operation are successively requested (write-to-read operation) for different addresses in a memory that cannot complete the write operation in a clock cycle.
Figure 44:
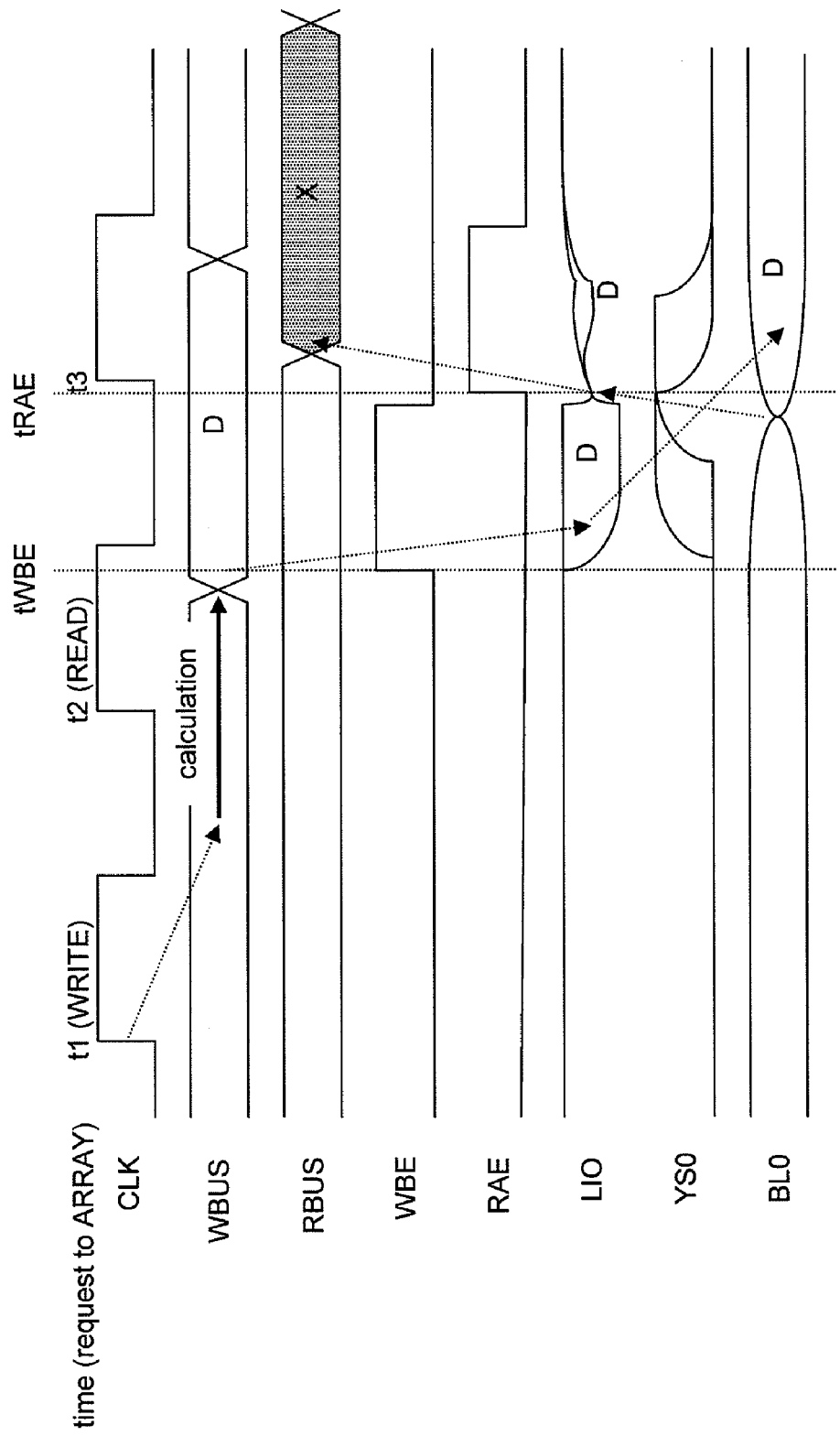
FIG. 44 shows an operation timing when the write operation and the read operation are successively requested (write-to-read operation) for the same address in the memory that cannot complete the write operation in a clock cycle.

FIG. 40 is a circuit diagram showing a configuration of principal parts of a semiconductor memory device 900 according to the fourteenth embodiment. The semiconductor memory device 900 according to the fourteenth embodiment is a PRAM.

As shown in FIG. 40, the semiconductor memory device 900 according to the fourteenth embodiment includes a memory cell array 908 that includes the word lines WL0, WL1, . . . , the bit lines BL0, BL1, . . . , and the memory cells MC arranged at intersections of the word lines with the bit lines. Each of the bit line BL0, BL1, . . . is connected via a corresponding column switch 903 to the I/O line LIO and via a corresponding column switch 913 to a data line WLINE for write. The column select signals Y0, Y1, . . . serving as outputs of column select drivers 904 are supplied to the respective column switches 903 and any one of the switches is turned on during the read operation or the write operation. Column select signals YW0, YW1, . . . for write serving as outputs of column select drivers 914 for write are supplied to the respective column switches 913 and any one of the switches is turned on during the write operation.

The I/O line LIO is a single wiring for flowing a read current or a reset current and connected to an input/output circuit 930. The data line WLINE for write is a single wiring for flowing a set current and connected to the input/output circuit 930.

The input/output circuit 930 further includes a set pulse generator 912 that flows a predetermined set current to the data line WLINE for write based on write data WD supplied through the write bus WBUS and a read amplifier 918 that generates the read data RD based on a read current flowing in the I/O line LIO. The input/output circuit 930 further includes a register 922 that temporarily holds the write data WD and a multiplexer 920 that selects either an output of the read amplifier 918 or an output of the register 922.

As shown in FIG. 40, the memory cell MC is a PRAM cell formed of a pass gate PG and a phase change device PC. One end of the phase change device PC is fixed at high potential and the other end is connected to the pass gate PG. The pass gate PG is controlled by the word line WL and connects the bit line BL to the phase change device PC.

A reset pulse generator 902 that generates reset pulses is formed of an NMOS and controlled by a pre-write control signal WBE1 through a pulse shaper 901. The set pulse generator 912 is also formed of an NMOS and controlled by a write control signal WBE2P through a pulse shaper 911. Circuit configurations of the set pulse generator 912 and the pulse shaper 911 need to be changed depending on multi-bit recording methods. For example, a plurality of the set pulse generators 912 can be prepared and be selected by the pulse shaper 911. By controlling the pulse shaper 911, a gate level of the set pulse generator 912 can be controlled.

A read current generator 916 generates a read current through a pulse shaper 915 not so as exceed a threshold of the phase change device PC. A potential of the I/O line LIO that varies depending on the read current is amplified by the read amplifier 918 that sets a potential VRF as the reference potential and latched into a hold circuit 919. A plurality of the read amplifiers 918 are provided for one I/O line LIO and thus multi-bit data is read. Note that the reference potentials VRF are different from each other.

A pre-charge circuit 906 is connected to the bit line BL. The pre-charge circuit 906 fixes the bit line BL at high potential so that the current does not flow in the phase change device PC when the word line WL is selected and the column select signal is not activated. Its control is performed by an OR gate 905. Because other configurations of the fourteenth embodiment are substantially identical to those of the eleventh embodiment, duplicate descriptions thereof will be omitted.

As described above, the fourteenth embodiment can provide a multi-bit PRAM without any data collision because the reset pulse 801 can be controlled in the pre-write operation and the set pulse 802 can be controlled in the subsequent write operation. Also in the twelfth and thirteenth embodiments, the reset pulse 801 can be controlled in the pre-write operation and the set pulse 802 can be controlled in the subsequent write operation.

It is apparent that the present invention is not limited to the above embodiments, but may be modified and changed without departing from the scope and spirit of the invention.

Figure 45:
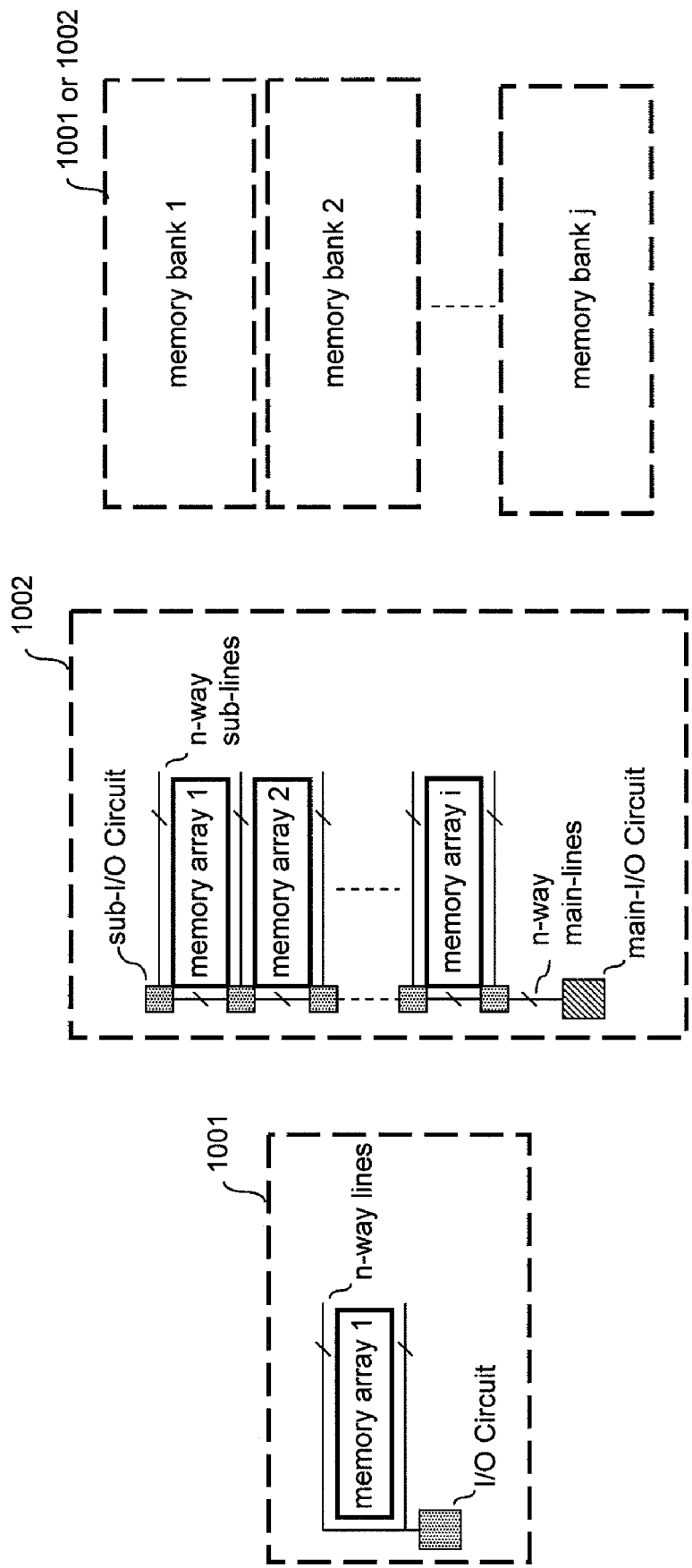
FIG. 45A shows one mat array configuration.
FIG. 45B shows plural mat arrays configuration having a hierarchical data line configuration.
FIG. 45C shows a configuration divided into plural banks.

For example, data lines that connect the input/output circuit to the memory array in the above embodiments can be ones with a hierarchical configuration. Any number of hierarchies can be used in the configuration. The present invention can be applied to a one mat array configuration 1001 shown in FIG. 45A as described above. Even in a case of a multiple mat array configuration 1002 with a hierarchical data line configuration used for arrays of normal memory devices as shown in FIG. 45B, a sub input/output circuit is connected via a sub data line to a memory array and a main input/output circuit is connected via a main data line, the sub input/output circuit, and the sub data line to the memory array. Accordingly, the present invention can be applied in both cases of the sub input/output circuit and the main input/output circuit. Needless to mention, as shown in FIG. 45C, banks that can be operated independently can be provided.

What is claimed is:
1. A semiconductor memory device comprising:
    a memory cell array that includes a plurality of word lines, a plurality of bit lines, and a plurality of memory cells arranged at intersections of the word lines with the bit lines;
    an input/output circuit that includes a write path to which a write data to be written in the memory cell array is supplied and a read path to which a read data read from the memory cell array is supplied; and
    a first data line and a second data line that connect the input/output circuit to the memory cell array,
    wherein the input/output circuit further includes:
    a write buffer that supplies the write data on the write path to the first data line;
    a read amplifier that supplies the read data on the second data line to the read path;
    a detection circuit that detects matching between a write address that the write data is to be written to and a read address that the read data is to be read from; and
    a bypass circuit that supplies the write data on the write path to the read path in response to matching detected by the detection circuit.
2. The semiconductor memory device as claimed in claim 1, wherein the input/output circuit further includes a first inhibition circuit that inhibits activation of the read amplifier in response to matching detected by the detection circuit.
3. The semiconductor memory device as claimed in claim 2, wherein the memory cell array further includes:
    a plurality of sense amplifiers respectively connected to corresponding at least one of the bit lines;
    a plurality of first column switches that respectively connect the bit lines to the first data line;
    a plurality of second column switches that respectively connect the bit lines to the second data line;
    a first column select driver that activates any one of the first column switches based on the write address;
    a second column select driver that activates any one of the second column switches based on the read address; and
    a second inhibition circuit that inhibits activation of the second column switch in response to matching detected by the detection circuit.
4. The semiconductor memory device as claimed in claim 1, wherein
    a write operation using the first data line is performed in response to a first access request, and
    a read operation using the second data line is performed in response to a second access request subsequent to the first access request.
5. The semiconductor memory device as claimed in claim 1, wherein each of the first and second data lines includes a hierarchical configuration.
6. A semiconductor memory device comprising:
    a memory cell array that includes a plurality of word lines, a plurality of bit lines, and a plurality of memory cells arranged at intersections of the word lines with the bit lines;
    an input/output circuit that includes a first write path to which a first write data to be written in the memory cell array is supplied and a second write path to which a second write data to be written in the memory cell array is supplied; and
    a first data line and a second data line that connect the input/output circuit to the memory cell array,
    wherein the input/output circuit further includes:
    a first write buffer that supplies the first write data on the first write path to the first data line;

a second write buffer that supplies the second write data on the second write path to the second data line;

a detection circuit that detects matching between a first write address that the first write data is to be written through the first data line and a second write address that the second write data is to be written through the second data line; and an inhibition circuit that inhibits activation of either the first write buffer or the second write buffer in response to matching detected by the detection circuit.

7. The semiconductor memory device as claimed in claim 6, wherein the input/output circuit further includes:

a read path to which a read data read from the memory cell array is supplied;

a read amplifier that supplies the read data on the first or second data line to the read path; and a bypass circuit that supplies the first or second write data on the first or second write path to the read path.

8. The semiconductor memory device as claimed in claim 6, wherein each of the first and second data lines includes a hierarchical configuration.

* * * * *